US012646551B2

(12) United States Patent
Hsieh et al.

(10) Patent No.:  US 12,646,551 B2
(45) Date of Patent:        Jun. 2, 2026

(54) GAIN CELL MEMORY DEVICE USING ENHANCED SENSING SCHEME AND METHODS FOR OPERATING THE SAME

(71) Applicant: Taiwan Semiconductor Manufacturing Company Limited, Hsinchu (TW)

(72) Inventors: Wei Ting Hsieh, Hsinchu (TW); Kuen-Yi Chen, Hsinchu City (TW); Yu-Wei Ting, Taipei City (TW); Yi Ching Ong, Hsinchu (TW); Kuo-Ching Huang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 82 days.

(21) Appl. No.: 18/633,847

(22) Filed: Apr. 12, 2024

(65) Prior Publication Data

US 2025/0322865 A1        Oct. 16, 2025

Related U.S. Application Data

(60) Provisional application No. 63/598,257, filed on Nov. 13, 2023.

(51) Int. Cl.
*G11C 11/405*        (2006.01)
*G11C 11/4091*        (2006.01)
(Continued)

(52) U.S. Cl.
CPC ........ *G11C 11/405* (2013.01); *G11C 11/4091* (2013.01); *G11C 11/4096* (2013.01); *H10B 12/00* (2023.02)

(58) Field of Classification Search
CPC .............. G11C 11/405; G11C 11/4091; G11C 11/4096; H10B 12/00
See application file for complete search history.

(56) References Cited

U.S. PATENT DOCUMENTS 6,982,897 B2    1/2006  Luk et al.
7,145,829 B1 *  12/2006  Kim ........................ G11C 7/12
                                                    365/233.17
(Continued)

FOREIGN PATENT DOCUMENTS

TW            I611417 B        1/2018

OTHER PUBLICATIONS

Jianq Chyun Intellectual Property Office; TW Application No. 113121470; Office Action mailed Apr. 11, 2025; 14 pages.

*Primary Examiner* — Mushfique Siddique
(74) *Attorney, Agent, or Firm* — The Marbury Law Group, PLLC

(57)        ABSTRACT

A gain cell memory includes a write transistor located on a substrate; a read transistor located on the substrate; a capacitor having a first electrode, a node dielectric, and a second electrode, wherein the first electrode is electrically connected to a first source/drain region of the write transistor and to a gate electrode of the read transistor; and a peripheral circuit configured to electrically bias a source region of the read transistor at a normal source bias voltage while the gain cell memory device is not under a read operation, and at a current-boost source bias voltage that increases an on-current of the read transistor while the gain cell memory device is under the read operation.

20 Claims, 46 Drawing Sheets

(51) Int. Cl.
  *G11C 11/4096*        (2006.01)
  *H10B 12/00*          (2023.01)

(56)                      References Cited

U.S. PATENT DOCUMENTS

| | | | |
|---|---|---|---|
| 11,062,762 B2 | 7/2021 | Ishizu et al. | |
| 11,211,108 B2 | 12/2021 | Van Houdt | |
| 2006/0227648 A1* | 10/2006 | Kameshiro | ............ H10D 89/10 |
| | | | 365/230.05 |
| 2018/0114578 A1* | 4/2018 | Ishizu | ...................... G11C 7/10 |
| 2020/0194433 A1* | 6/2020 | Bennett | ................ G11C 11/565 |
| 2020/0265887 A1* | 8/2020 | Atsumi | .............. G11C 11/4094 |
| 2020/0279850 A1* | 9/2020 | Sharma | ................ H10D 86/441 |
| 2022/0392925 A1* | 12/2022 | Ishizu | ................... H10D 86/01 |

* cited by examiner

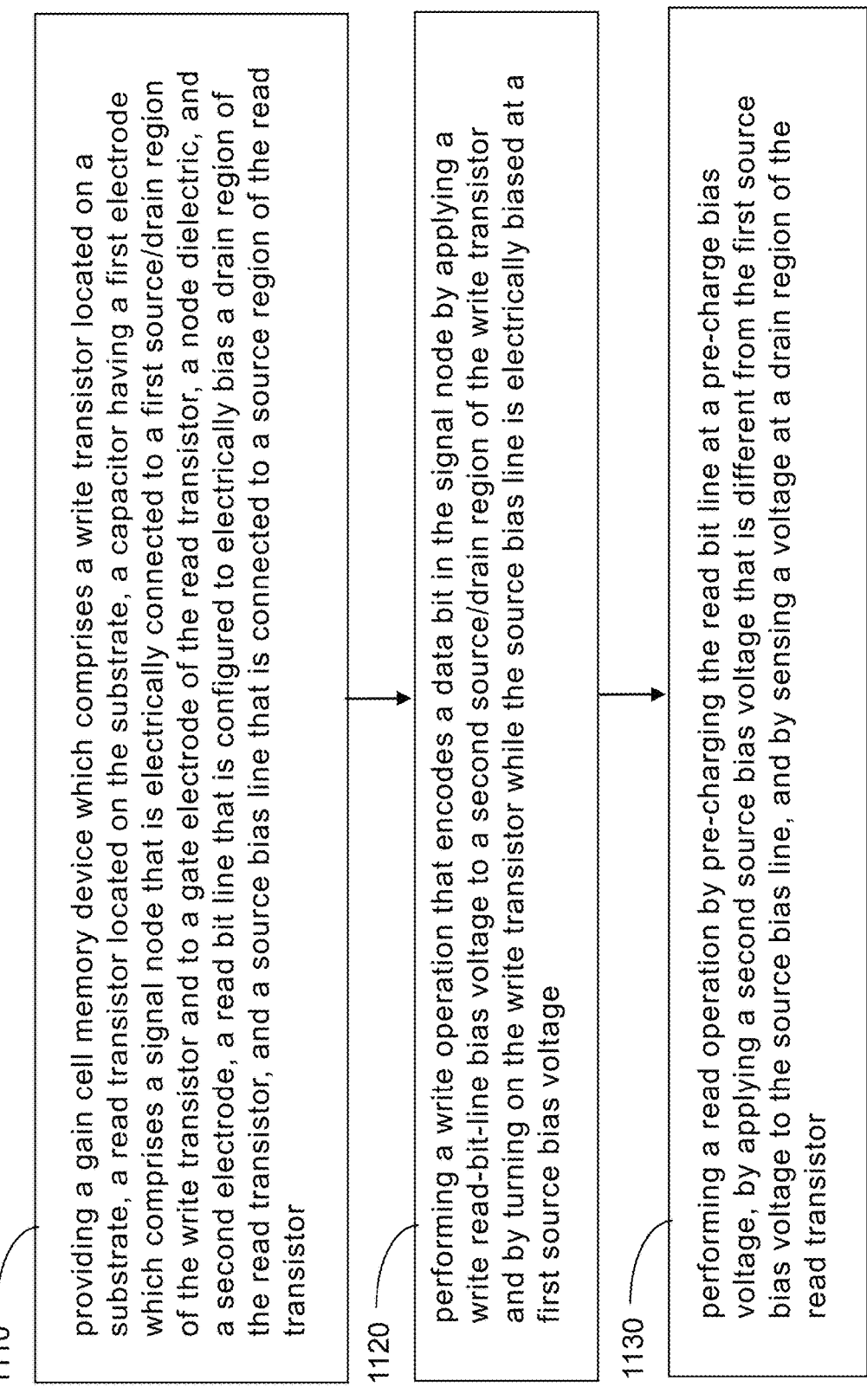

1110 providing a gain cell memory device which comprises a write transistor located on a substrate, a read transistor located on the substrate, a capacitor having a first electrode which comprises a signal node that is electrically connected to a first source/drain region of the write transistor and to a gate electrode of the read transistor, a node dielectric, and a second electrode, a read bit line that is configured to electrically bias a drain region of the read transistor, and a source bias line that is connected to a source region of the read transistor 1120 performing a write operation that encodes a data bit in the signal node by applying a write read-bit-line bias voltage to a second source/drain region of the write transistor and by turning on the write transistor while the source bias line is electrically biased at a first source bias voltage 1130 performing a read operation by pre-charging the read bit line at a pre-charge bias voltage, by applying a second source bias voltage that is different from the first source bias voltage to the source bias line, and by sensing a voltage at a drain region of the read transistor

FIG. 11

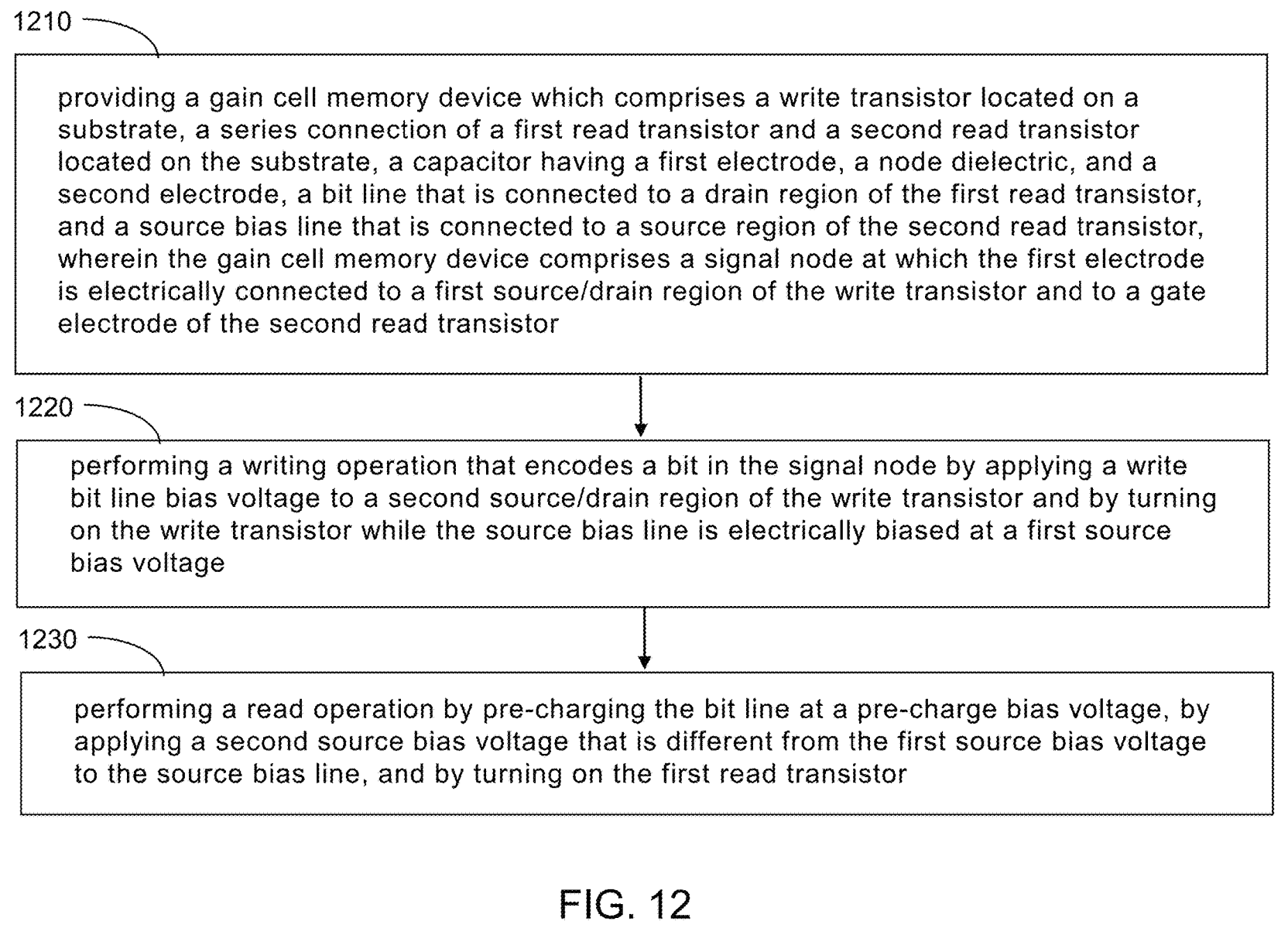

1210 — providing a gain cell memory device which comprises a write transistor located on a substrate, a series connection of a first read transistor and a second read transistor located on the substrate, a capacitor having a first electrode, a node dielectric, and a second electrode, a bit line that is connected to a drain region of the first read transistor, and a source bias line that is connected to a source region of the second read transistor, wherein the gain cell memory device comprises a signal node at which the first electrode is electrically connected to a first source/drain region of the write transistor and to a gate electrode of the second read transistor 1220 — performing a writing operation that encodes a bit in the signal node by applying a write bit line bias voltage to a second source/drain region of the write transistor and by turning on the write transistor while the source bias line is electrically biased at a first source bias voltage 1230 — performing a read operation by pre-charging the bit line at a pre-charge bias voltage, by applying a second source bias voltage that is different from the first source bias voltage to the source bias line, and by turning on the first read transistor

FIG. 12

GAIN CELL MEMORY DEVICE USING ENHANCED SENSING SCHEME AND METHODS FOR OPERATING THE SAME

RELATED APPLICATIONS

This application claims the benefit of priority from U.S. Provisional Application No. 63/598,257 entitled "Method For Reading From A Memory Cell" and filed on Nov. 13, 2023, the entire contents of which are hereby incorporated by reference for all purposes.

BACKGROUND

A gain cell memory device is a memory device in which presence or absence of electrical charges in a signal node may be sensed using a signal amplification that uses at least one sensing transistor, i.e., at least one read transistor. Specifically, the signal node is electrically connected to a gate electrode of a read transistor. For example, a three-transistor one-capacitor (3T1C) gain cell memory device uses a write transistor, a pair of read transistors, and a capacitor. A key performance parameter for a gain cell memory device is the effective retention time, i.e., the maximum time duration that allows reliable decoding of stored electrical charges at the signal node. The longer the effective retention time, the less frequent a refresh operation may be performed for a gain cell memory device.

BRIEF SUMMARY OF THE INVENTION

The present disclosure is directed to gain cell memory devices that extend effective charge retention time and enhance read margin by dynamically biasing the source region of a read transistor during read operations. In related gain cells, charge leakage at the signal node limits retention time, requiring frequent refresh and increasing power consumption. The gain cell memory devices according to various embodiments disclosed herein overcome this challenge by applying a normal source bias voltage during non-read operations and a current-boost source bias pulse during read operations to increase the read transistor's on-current only when needed. Thus, the read bit line voltage is adjusted to differentiate marginal charge states more effectively, providing a wider sensing window without enlarging the cell or increasing standby power. The capacitor is embedded in overlying dielectric layers, with metal interconnects linking the signal node to the write transistor and read transistor gate, forming compact 2T1C or 3T1C cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

It is noted that elements may be arbitrarily placed within, or out of, the vertical plane of the view in any pseudo vertical cross-sectional view, and there may not be a particular physical vertical plane that may display all elements illustrated in a pseudo vertical cross-sectional view.

FIG. 11 is a first flowchart that illustrates a sequence of processing steps for operating the gain cell memory device of the present disclosure.

FIG. 12 is a second flowchart that illustrates a sequence of processing steps for operating the gain cell memory device of the present disclosure.

DETAILED DESCRIPTION

Figure 1A:
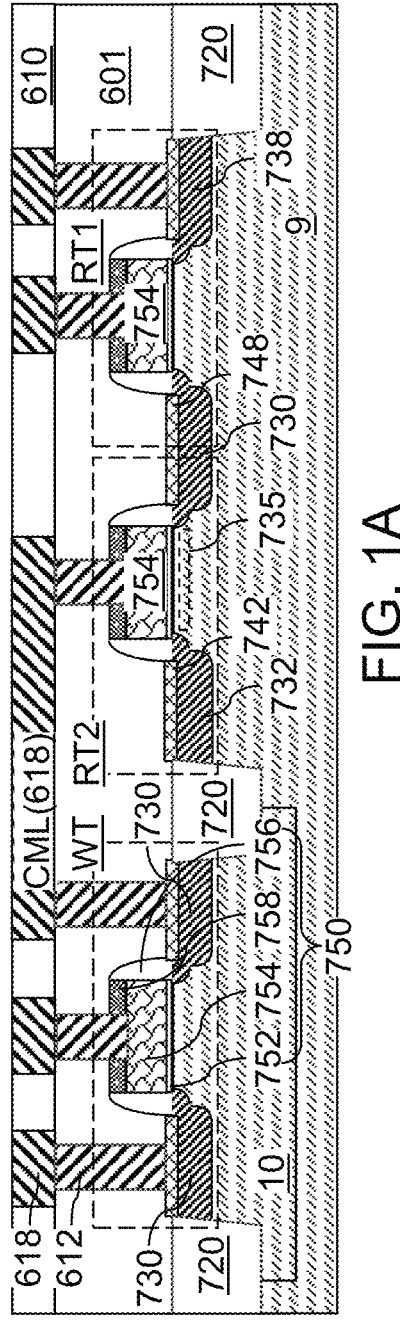
FIG. 1A is a pseudo vertical cross-sectional view of an exemplary structure for forming a three-transistor one-capacitor (3T1C) gain cell memory device after formation of field effect transistors, a contact-level dielectric material layer, device contact via structures, a first metal-line-level dielectric material layer, and first metal line structures according to an embodiment of the present disclosure.

The following disclosure provides many different embodiments, or examples, for implementing different features of the provided subject matter. Specific examples of components and arrangements are described below to simplify the present disclosure. These are merely examples, and are limiting. Drawings are not drawn to scale. Elements with the same reference numerals refer to the same element, and are presumed to have the same material composition and the same thickness range unless expressly indicated otherwise. Embodiments are expressly contemplated in which multiple instances of any described element are repeated unless expressly stated otherwise. Embodiments are expressly contemplated in which non-essential elements are omitted even if such embodiments are not expressly disclosed but are known in the art.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a gain cell memory device providing enhanced read margin and extending the effective charge retention time. Specifically, a sensing operation may be performed using an enhanced conducting state of a read transistor, in which a source region of the read transistor may be electrically biased at a voltage that increases the magnitude of the drain current. The resistive load on a read bit line may be reduced such that the output voltage at the read bit line is tuned to differentiate marginal charge states of the signal node at the end of an effective charge retention time. Thus, the sensitivity of the read transistor may be enhanced only during read operations to provide low power operation and highly effective sensing operation. Various embodiment gain cell memory devices of the present disclosure may extend the effective charge retention time without increasing the size of the gain cell memory device and without a large increase in power consumption. Various embodiment gain cell memory devices of the present disclosure may reduce the data refresh rate, and may reduce the power consumption. The various aspects of the present disclosure are now described with reference to accompanying drawings.

Figure 1B:
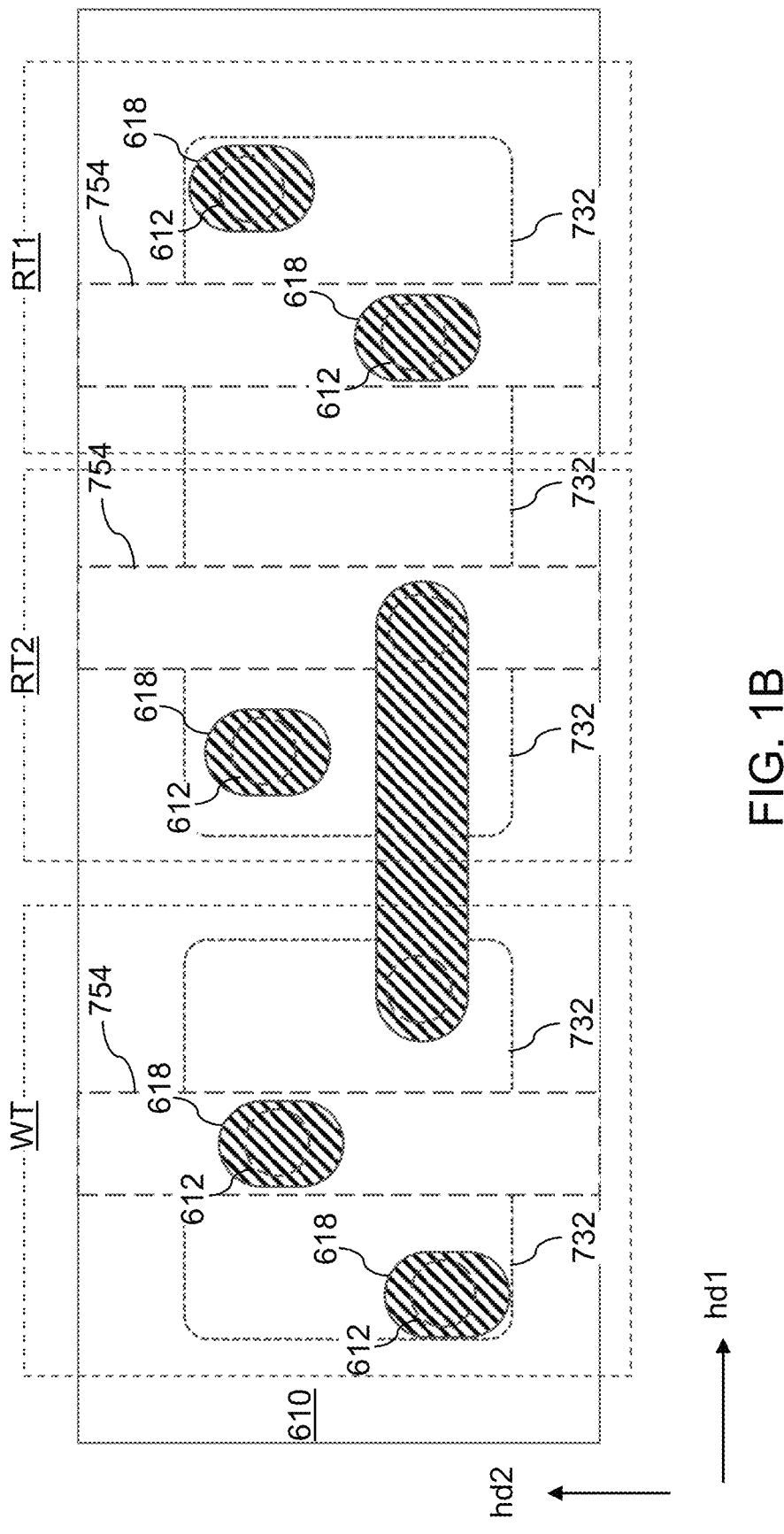
FIG. 1B is a top-down view of the exemplary structure of FIG. 1A.

Referring to FIGS. 1A and 1B, an exemplary structure for forming a three-transistor one-capacitor (3T1C) gain cell memory device is illustrated after formation of field effect transistors (write-transistor (WT), first read transistor (RT1), second read transistor (RT2)), a contact-level dielectric material layer 601, device contact via structures 612, a first metal-line-level dielectric material layer 610, and first metal line structures 618. FIG. 1B is a top-down view representing an exemplary arrangement of elements. FIG. 1A is a pseudo vertical cross-sectional view in which elements are re-arranged arbitrarily into the view plane or out of the view plane. Thus, while each pair of elements in direct contact with each other may be located within a respective local vertical plane that is parallel to a first horizontal direction hd1, not all elements within FIG. 1A may be within a same vertical plane, and thus, the view in FIG. 1A may be a composite view of multiple vertical cross-sectional views taken at multiple vertical planes that are parallel to the first horizontal direction hd1 and laterally offset from one another along a second horizontal direction hd2 that is perpendicular to the first horizontal direction hd1. As such, FIG. 1A is a pseudo vertical cross sectional view.

The exemplary structure includes a substrate 9, which may be a semiconductor substrate such as a commercially available silicon wafer. Shallow trench isolation structures 720 including a dielectric material such as silicon oxide may be formed in an upper portion of the substrate 9. Suitable doped semiconductor wells, such as p-type wells and n-type wells, may be formed within each area that may be laterally enclosed by a portion of the shallow trench isolation structures 720. For example, the substrate 9 may have a doping of a first conductivity type, and a doped well 10 having a doping of a second conductivity type may be formed by doping an upper portion of the substrate 9 with dopants of the second conductivity type. If the first conductivity type is p-type, the second conductivity type is n-type, and vice versa.

Field effect transistors may be formed over the top surface of the substrate 9. For example, each field effect transistor may include a source region 732 and a drain region 738, or a pair of source/drain regions 730. A "source/drain region" refers to a region that may function as a source region or as a drain region depending on the electrical bias. A semiconductor channel 735 that includes a surface portion of the substrate 9 extending between each pair of a source region 732 and a drain region 738, or between a pair of source/drain regions 730.

Each field effect transistor comprises a respective gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738. A metal-semiconductor alloy region formed on a source/drain region 730 is herein referred to as a source/drain metal semiconductor alloy region. The field effect transistors may be formed in any configuration known in the art. For example, the field effect transistors may comprise planar field effect transistors, fin field effect transistors, gate-all-around (GAA) field effect transistors, and/or any other type of field effect transistors.

The contact-level dielectric material layer 601 may be formed over the field effect transistors (WT, RT1, RT2). The device contact via structures 612 may be formed through the contact-level dielectric material layer 601, and to contact, or to provide electrical connection to, a respective component of the semiconductor devices on the substrate 9, such as the gate electrode 754, the source regions 732, the drain regions 738, and the source/drain regions 730 of the various field effect transistors (WT, RT1, RT2). The first metal-line-level dielectric material layer 610 may be formed over the contact-level dielectric material layer 601. The first metal line structures 618 may be formed in the first metal-line-level dielectric material layer 610. Each of the contact-level dielectric material layer 601 and the first metal-line-level dielectric material layer 610 may comprise an interlayer dielectric (ILD) material such as undoped silicate glass, a doped silicate glass, and/or porous or non-porous organo-silicate glass. Each of the device contact via structures 612 and the first metal line structures 618 may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials are within the contemplated scope of disclosure.

Each of the source/drain regions 730 of the write transistor WT, the source region 732 of the second read transistor RT2, the drain region 738 of the first read transistor RT1, a common source/drain region 730 of the first read transistor RT1 and the second read transistor RT2 (comprising a single heavily doped semiconductor region), and the gate electrodes 754 of each of the write transistor WT, the first read transistor RT1, and the second read transistor RT2 may be electrically connected to, and/or may be contacted by, a respective device contact via structure 612. It is noted that the device contact via structure 612 that is electrically connected to the source region 732 of the second read transistor RT2 is not illustrated in FIG. 1A.

According to an aspect of the present disclosure, a subset of the device contact via structures 612 and the first metal line structures 618 within a region of a gain cell memory device electrically connects a first source/drain region 730 of a write transistor WT and a gate electrode 754 of a second read transistor RT2. In one embodiment, the first metal line structures 618 may comprise a connection metal line CML that laterally extends between the write transistor WT and the second read transistor RT2 and contacting a top surface of a first device contact via structure 612 electrically connected to, and overlying, a first source/drain region 730 of the write transistor WT, and contacting a top surface of a second device contact via structure 612 electrically connected to, and overlying, a gate electrode 754 of the second read transistor RT2.

The illustrated region of the exemplary structure corresponds to a region of a gain cell memory device. It is understood that the illustrated structure may be repeated as a two-dimensional array to provide a two-dimensional array of gain cell memory devices. Further, additional transistors for providing a peripheral circuit for the two-dimensional array of gain cell memory devices may be formed on the substrate. Such additional transistors may be configured to provide various control voltages and bias voltages, such as write word line bias voltages for electrically biasing the gate electrodes 754 of a respective row of write transistors WT, write bit line bias voltages for electrically biasing the second source/drain regions 730 of a respective column of write transistors WT, read word line bias voltages for electrically biasing the gate electrodes 754 of a respective row of first read transistors RT1, read bit line bias voltages for electrically biasing the drain regions 738 of a respective column of first read transistors RT1, and source bias voltages for electrically biasing the source regions 732 of a respective column of second read transistors RT2.

Figure 1C:
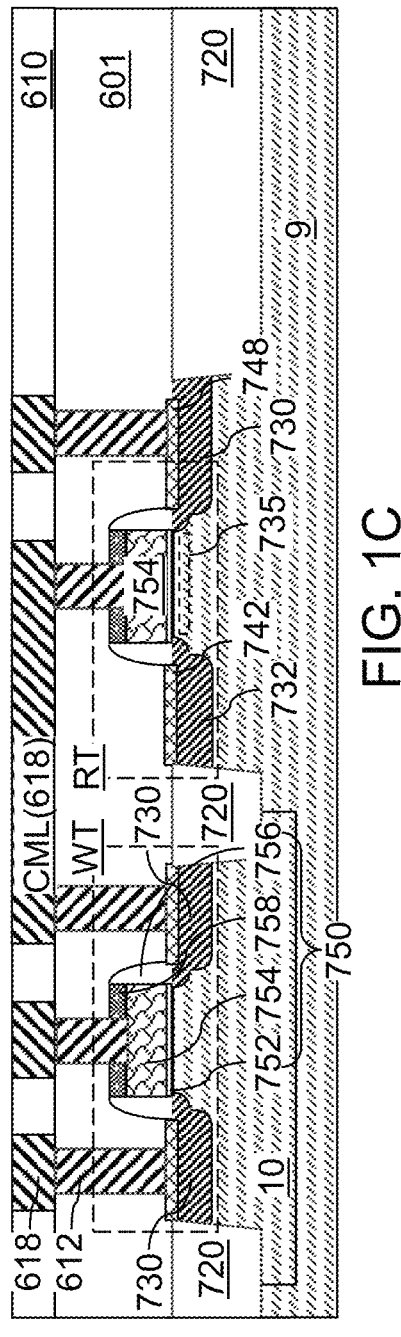
FIG. 1C is a pseudo vertical cross-sectional view of an exemplary structure for forming a two-transistor one-capacitor (2T1C) gain cell memory device after formation of field effect transistors, a contact-level dielectric material layer, device contact via structures, a first metal-line-level dielectric material layer, and first metal line structures according to an embodiment of the present disclosure.
Figure 1D:
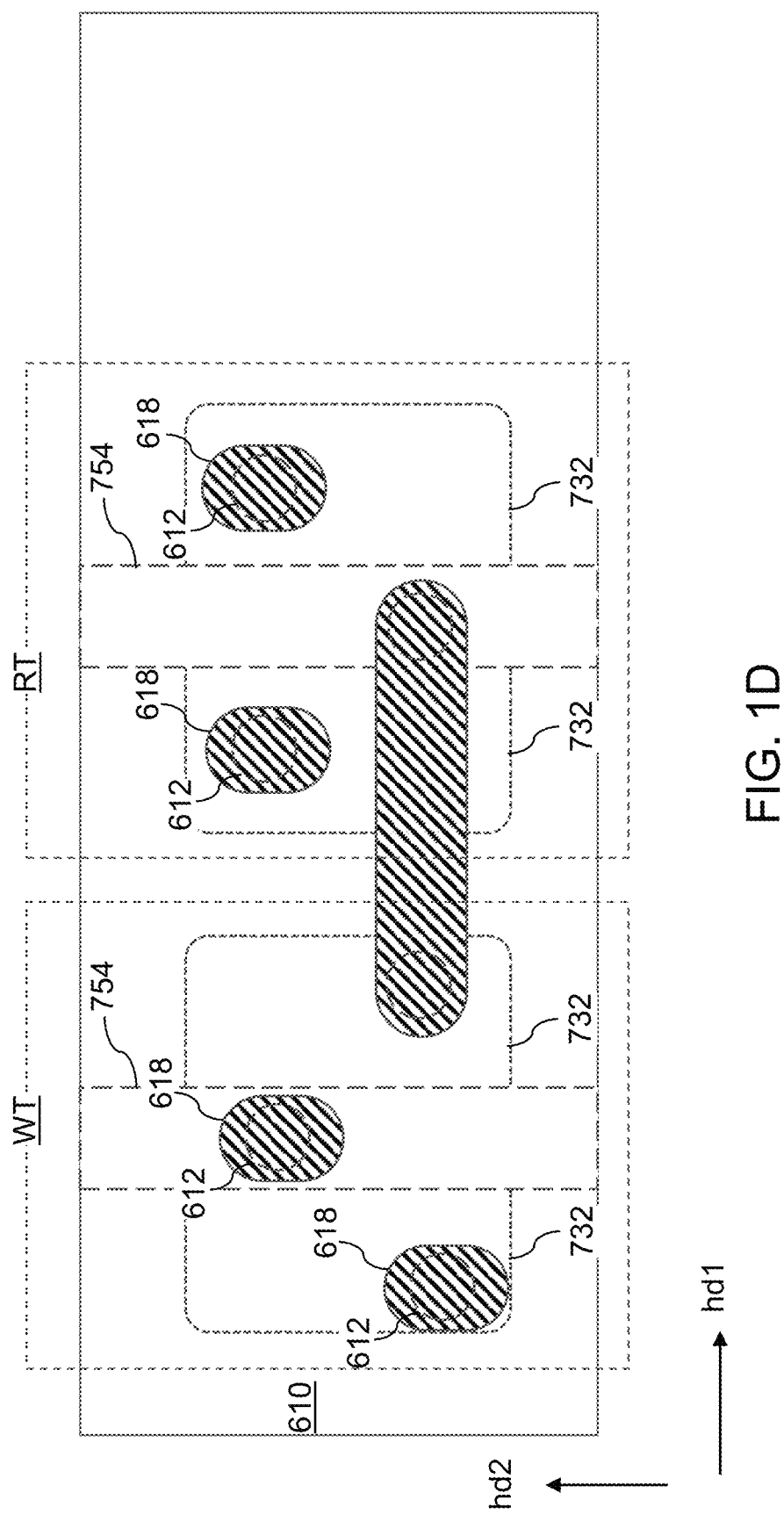
FIG. 1D is a top-down view of the exemplary structure of FIG. 1C.

Referring to FIGS. 1C and 1D, an exemplary structure for forming a two-transistor one-capacitor (2T1C) gain cell memory device is illustrated after the processing steps described with reference to FIGS. 1A and 1B. The exemplary structure illustrated in FIGS. 1C and 1D may be derived from the exemplary structure for forming a three-transistor one-capacitor (3T1C) gain cell memory device as illustrated in FIGS. 1A and 1B by forming only a single read transistor RT in lieu of a combination of a first read transistor RT1 and a second read transistor RT2. For example, the first read transistor RT1 in FIGS. 1A and 1B may be omitted, and the second read transistor RT2 in FIGS. 1A and 1B may be re-labeled as the read transistor RT to provide the exemplary structure illustrated in FIGS. 1C and 1D.

Figure 2A:
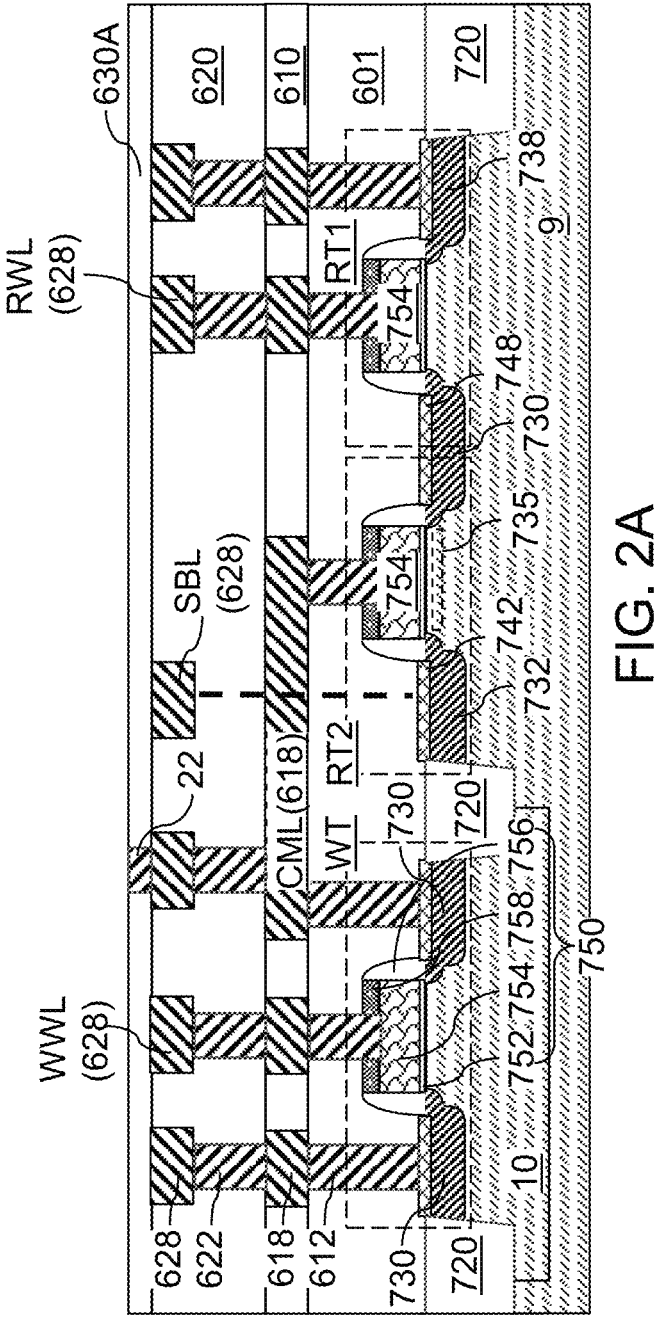
FIG. 2A is a pseudo vertical cross-sectional view of the exemplary structure for forming a three-transistor one-capacitor (3T1C) gain cell memory device after formation of second line-and-via level structures, a via-level dielectric layer, and a bottom connection via structure according to an embodiment of the present disclosure.
Figure 2B:
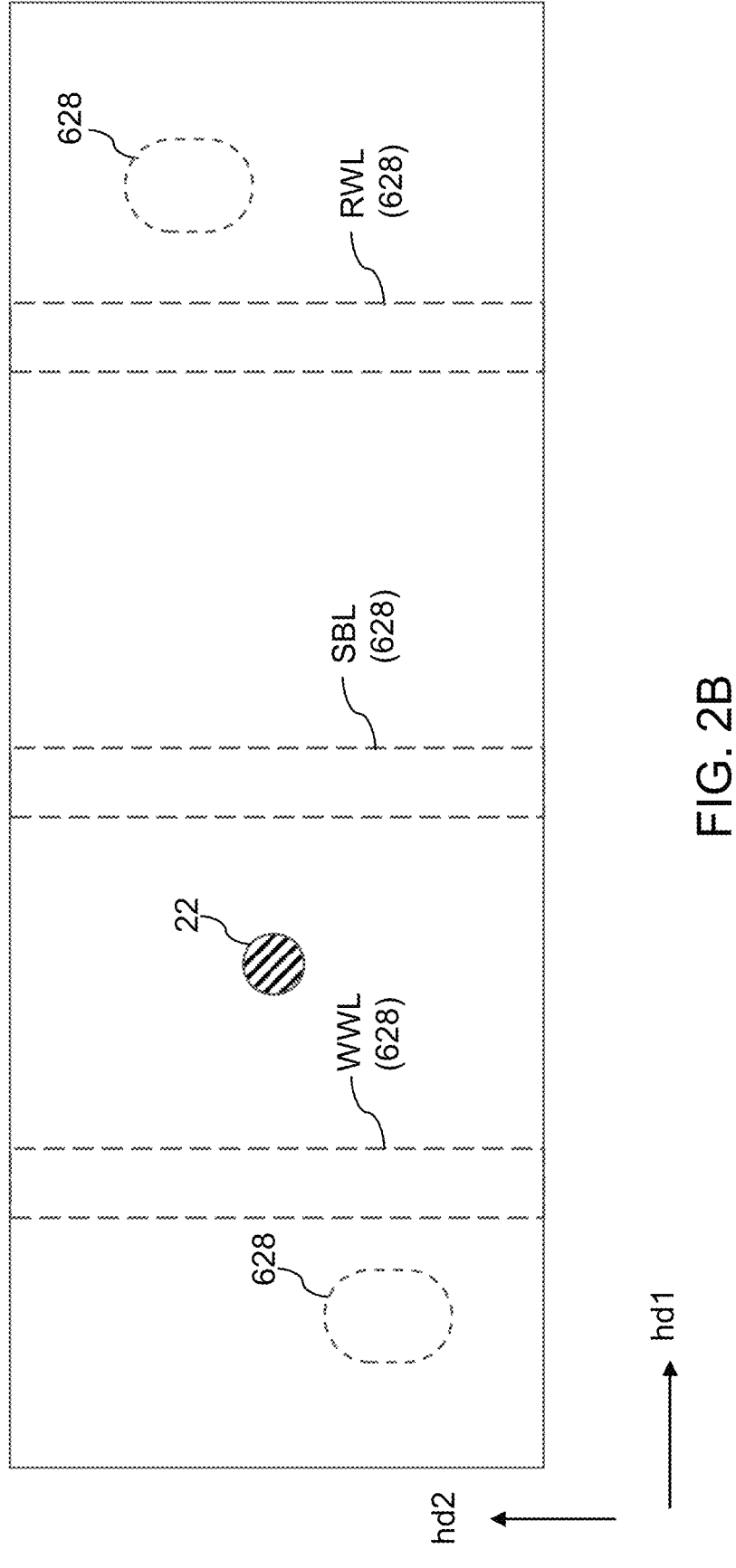
FIG. 2B is a top-down view of the exemplary structure of FIG. 2A.

Referring to FIGS. 2A and 2B, the exemplary structure for forming a three-transistor one-capacitor (3T1C) gain cell memory device is illustrated after formation of a second line-and-via-level dielectric material layer 620, first metal via structures 622, second metal line structures 628, a via-level dielectric layer 630A, and bottom electrode contact via structures 22. FIG. 2B is a top-down view representing an exemplary arrangement of elements. Not all elements within FIG. 2A may be within a same vertical plane, and thus, the view in FIG. 2A may be a composite view of multiple vertical cross-sectional views taken at multiple vertical planes that are parallel to the first horizontal direction hd1 and laterally offset from one another along the second horizontal direction hd2. As such, FIG. 2A is a pseudo vertical cross sectional view.

The first metal via structures 622 may be formed in a lower portion of the second line-and-via-level dielectric material layer 620. The second metal line structures 628 may be formed in an upper portion of the second line-and-via-level dielectric material layer 620. The bottom electrode contact via structures 22 may be formed through the via-level dielectric layer 630A. Each of the second line-and-via-level dielectric material layer 620 and the via-level dielectric layer 630A may comprise an interlayer dielectric (ILD) material such as undoped silicate glass, a doped silicate glass, and/or porous or non-porous organosilicate glass. Each of the first metal via structures 622, the second metal line structures 628, the bottom electrode contact via structures 22 may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials are within the contemplated scope of disclosure.

The set of all metal interconnect structures located below the horizontal plane including the top surface of the via-level dielectric layer 630A is herein referred to as first metal interconnect structures (612, 618, 622, 628, 22). In one embodiment, the first metal interconnect structures (612, 618, 622, 628, 22) may comprise write word lines WWL, which are metal lines used as the word lines of the write transistors WT. In one embodiment, the write word lines WWL may comprise a subset of the second metal line structures 628. In one embodiment, the first metal interconnect structures (612, 618, 622, 628, 22) may comprise read word lines RWL, which are metal lines used as the word lines of the first read transistors RT1. In one embodiment, the read word lines RWL may comprise a subset of the second metal line structures 628. Each read word line RWL may be electrically connected to gate electrodes 754 within a respective row of first read transistors RT1.

In one embodiment, a subset of the first metal interconnect structures (612, 618, 622, 628, 22) may comprise source bias lines SBL. In one embodiment, the source bias lines SBL may comprise a subset of the second metal line structures 628. Each source bias line SBL may be electrically connected to the source regions 732 of a respective column of second read transistors RT2, or a respective row of second read transistors RT1, by electrically conductive paths (represented as a dotted line in FIG. 2B) embodied as a respective subset of the first metal interconnect structures (612, 618, 622, 628, 22) (such as a respective subset of the device contact via structures 612, the first metal line structures 618, and the first metal via structures 622).

While the present disclosure is described using an embodiment in which the write word lines WWL, read word lines RWL, and the source bias lines SBL are embodied as a respective subset of the first metal interconnect structures (612, 618, 622, 628, 22), each of the write word lines WWL, read word lines RWL, and the source bias lines SBL may be formed above capacitors to be subsequently formed, and thus, may be formed above the capacitors. Such variations are expressly contemplated herein.

The bottom electrode contact via structures 22 are subsequently used to provide electrical contact to a first electrode, i.e., a bottom electrode, of a respective capacitor. As such, each bottom electrode contact via structure 22 may be formed in an area in which a capacitor is to be subsequently formed.

Figure 2C:
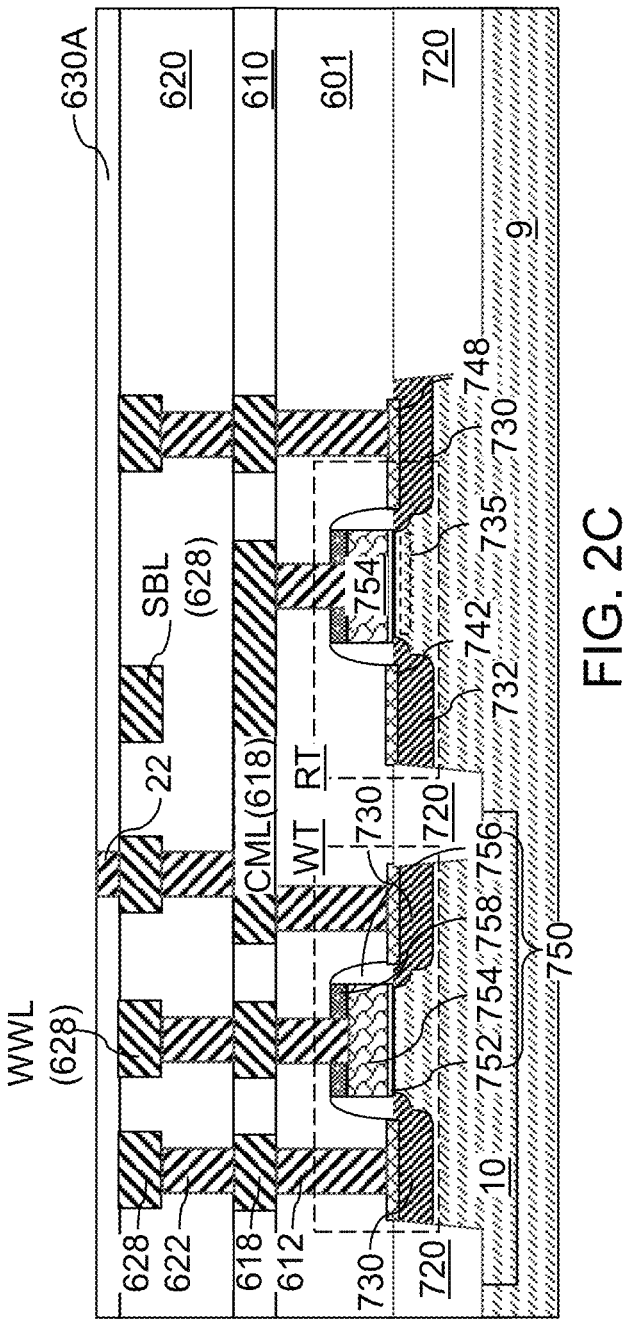
FIG. 2C is a pseudo vertical cross-sectional view of the exemplary structure for forming a two-transistor one-capacitor (2T1C) gain cell memory device after formation of second line-and-via level structures, a via-level dielectric layer, and a bottom connection via structure according to an embodiment of the present disclosure.
Figure 2D:
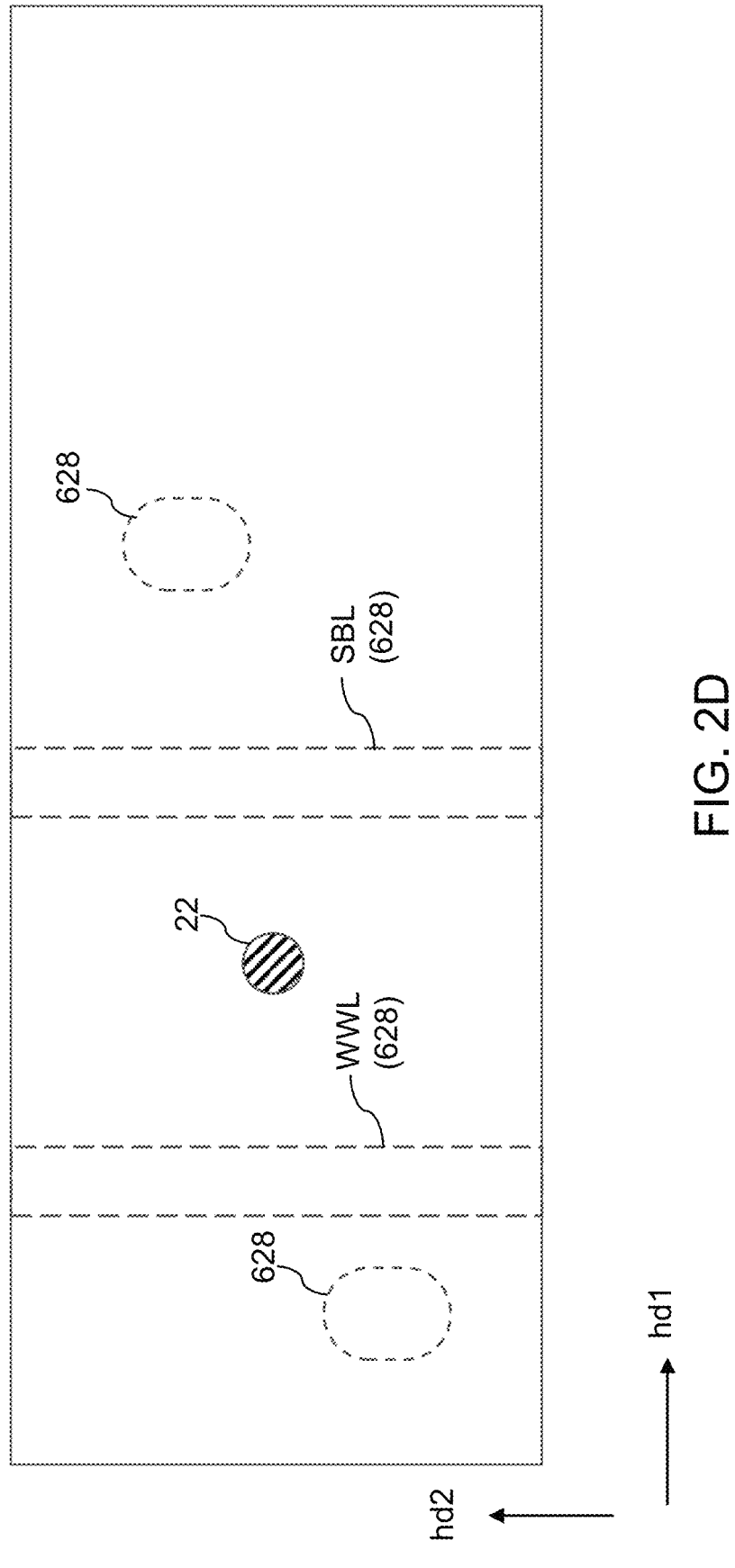
FIG. 2D is a top-down view of the exemplary structure of FIG. 2C.

Referring to FIGS. 2C and 2D, an exemplary structure for forming a two-transistor one-capacitor (2T1C) gain cell memory device is illustrated after the processing steps described with reference to FIGS. 2A and 2B. The exemplary structure illustrated in FIGS. 2C and 2D may be derived from the exemplary structure for forming a three-transistor one-capacitor (3T1C) gain cell memory device as illustrated in FIGS. 2A and 2B by forming only a single read transistor RT in lieu of a combination of a first read transistor RT1 and a second read transistor RT2. For example, the first read transistor RT1 in FIGS. 2A and 2B may be omitted, and the second read transistor RT2 in FIGS. 2A and 2B may be re-labeled as the read transistor RT to provide the exemplary structure illustrated in FIGS. 2C and 2D.

Figure 3A:
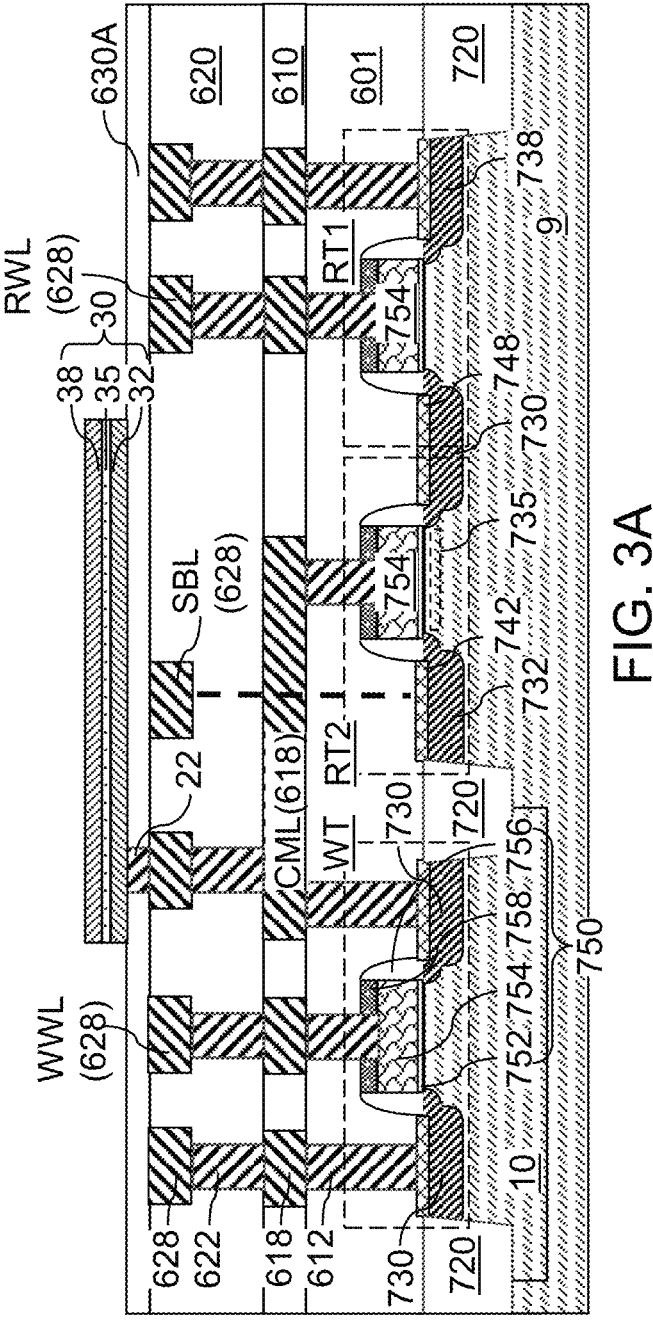
FIG. 3A is a pseudo vertical cross-sectional view of the exemplary structure for forming a three-transistor one-capacitor (3T1C) gain cell memory device after formation of a capacitor according to an embodiment of the present disclosure.
Figure 3B:
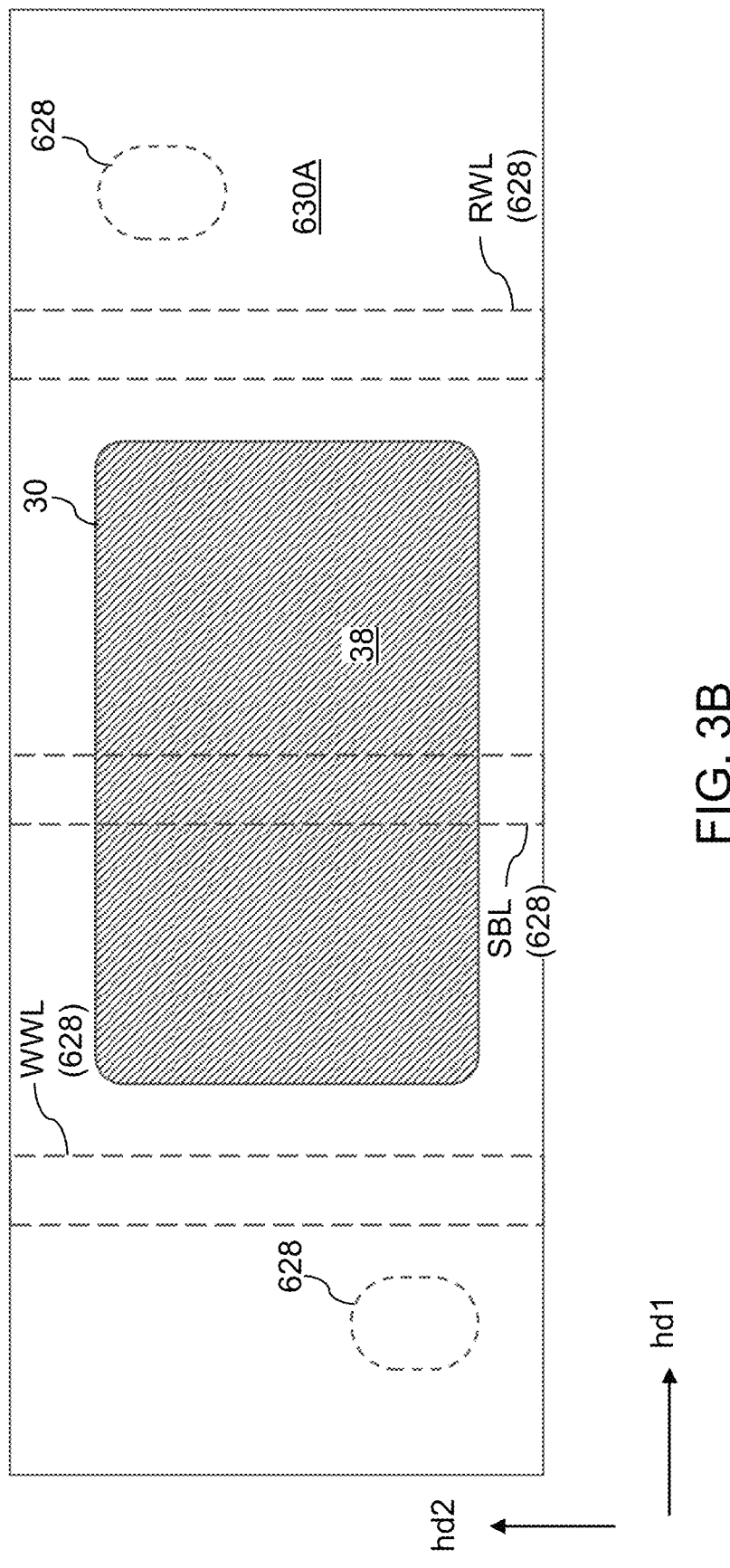
FIG. 3B is a top-down view of the exemplary structure of FIG. 3A.

Referring to FIGS. 3A and 3B, the exemplary structure for forming a three-transistor one-capacitor (3T1C) gain cell memory device is illustrated after formation of an array of capacitors 30. As such, a capacitor 30 is formed within each region of a gain cell memory device. FIG. 3B is a top-down view representing an exemplary arrangement of elements. Not all elements within FIG. 3A may be within a same vertical plane, and thus, the view in FIG. 3A may be a composite view of multiple vertical cross-sectional views taken at multiple vertical planes that are parallel to the first horizontal direction hd1 and laterally offset from one another along the second horizontal direction hd2. As such, FIG. 3A is a pseudo vertical cross sectional view.

A set of material layers may be deposited over the top surface of the via-level dielectric layer 630A. The set of material layers may comprise, from bottom to top, a bottom electrode material layer, a node dielectric material layer, and a top electrode material layer. Each of the bottom electrode material layer and the top electrode material layer may comprise, and/or may consist essentially of, a metal, a conductive metallic compound, and/or a conductive metal oxide.

Exemplary metals that may be used for the bottom electrode material layer and/or the top electrode material layer include refractory metals (such as tungsten, molybdenum, tantalum, tantalum, and rhenium), and metals having an electronegativity that is greater than the electronegativity of molybdenum (such as gold (Au) with the electronegativity of 2.54, tungsten (W) with the electronegativity of 2.36, platinum (Pt) with the electronegativity of 2.28, iridium (Ir) with the electronegativity of 2.20, and osmium (Os) with the electronegativity of 2.20). Exemplary conductive metallic compounds that may be used for the bottom electrode material layer and/or the top electrode material layer include tungsten nitride, titanium nitride, tantalum nitride, and molybdenum nitride. Exemplary conductive metal oxides that may be used for the bottom electrode material layer and/or the top electrode material layer include, for example, indium tin oxide, fluorine-doped tin oxide, zinc oxide, tungsten oxide ($WO_3$), etc.

Each of the bottom electrode material layer and the top electrode material layer may be deposited by physical vapor deposition, chemical vapor deposition, or atomic layer deposition. The thickness of each of the bottom electrode material layer and the top electrode material layer may be in a range from 5 nm to 40 nm, such as from 10 nm to 25 nm, although lesser and greater thicknesses may also be used.

The node dielectric material layer may comprise any node dielectric material known in the art. Exemplary dielectric materials that may be used for the node dielectric material layer include silicon nitride, aluminum oxide, and transition metal oxide having a dielectric constant greater than 10, and/or greater than 20, and/or greater than 30. In one embodiment, the node dielectric material layer may comprise, and/or may consist essentially of, a dielectric material that may provide a dielectric constant greater than 30. Such dielectric materials include perovskite oxides materials, hafnium based oxides, zirconium-based oxides, and titanium based oxides. Perovskite oxide material include barium titanate ($BaTiO_3$), strontium titanate ($SrTiO_3$), lead zirconate titanate (PZT), barium strontium titanate (BST), lead titanate ($PbTiO_3$), etc. Perovskite oxide materials may have a dielectric constant in a range from 30 to 1,000 in a crystalline phase. Hafnium-based oxides include hafnium dioxide ($HfO_2$), hafnium oxynitride, and hafnium silicate ($HfSiO_4$), and may have a dielectric constant in a range from 30 to 40 in a crystalline state. Zirconium-based oxides include zirconium dioxide ($ZrO_2$), zirconium oxynitride, and zirconium silicate ($ZrSiO_4$), and may have a dielectric constant in a range from 30 to 35 in a crystalline state. Titanium-based oxides include titanium dioxide ($TiO_2$) or titanium oxynitride, and may have a dielectric constant in a range from 80 to 150.

The node dielectric material layer may be deposited by atomic layer deposition, physical vapor deposition, or chemical vapor deposition. The node dielectric material layer may have a thickness in a range from 2 nm to 10 nm, such as from 3 nm to 8 nm, although lesser and greater thicknesses may also be used.

A photoresist layer (not shown) may be applied over the stack of the bottom electrode material layer, the node dielectric material layer, and the top electrode material layer, and may be lithographically patterned into a two-dimensional array of photoresist material portions covering a respective area that overlies a respective bottom electrode contact via structure 22. Generally, the area of each photoresist material portion within the two-dimensional array of photoresist material portions may be in a range from 40% to 90% of the area of each gain cell memory device in a plan view. The layer stack including the bottom electrode material layer, the node dielectric material layer, and the top electrode material layer may be patterned into a two-dimensional array of capacitors 30, for example, by performing an anisotropic etch process that etches the layer stack using the photoresist material portions as an etch mask.

Each capacitor 30 comprises a first electrode 32 which is also referred to as a bottom electrode, a node dielectric 35 which is a patterned portion of node dielectric material layer, and a second electrode 38 which is also referred to as a top electrode. The first electrode 32 comprises a patterned portion of the bottom electrode material layer. The node dielectric 35 comprises a patterned portion of the node dielectric material layer. The second electrode 38 comprises a patterned portion of the top electrode material layer.

Figure 3C:
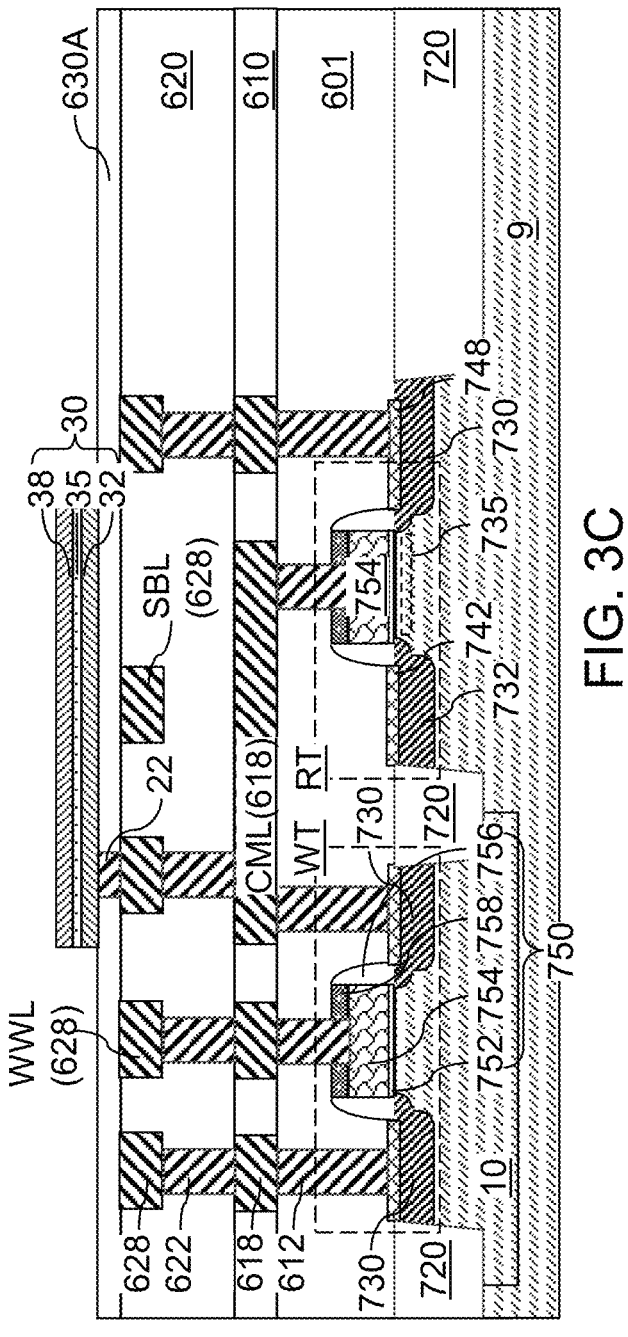
FIG. 3C is a pseudo vertical cross-sectional view of the exemplary structure for forming a two-transistor one-capacitor (2T1C) gain cell memory device after formation of a capacitor according to an embodiment of the present disclosure.
Figure 3D:
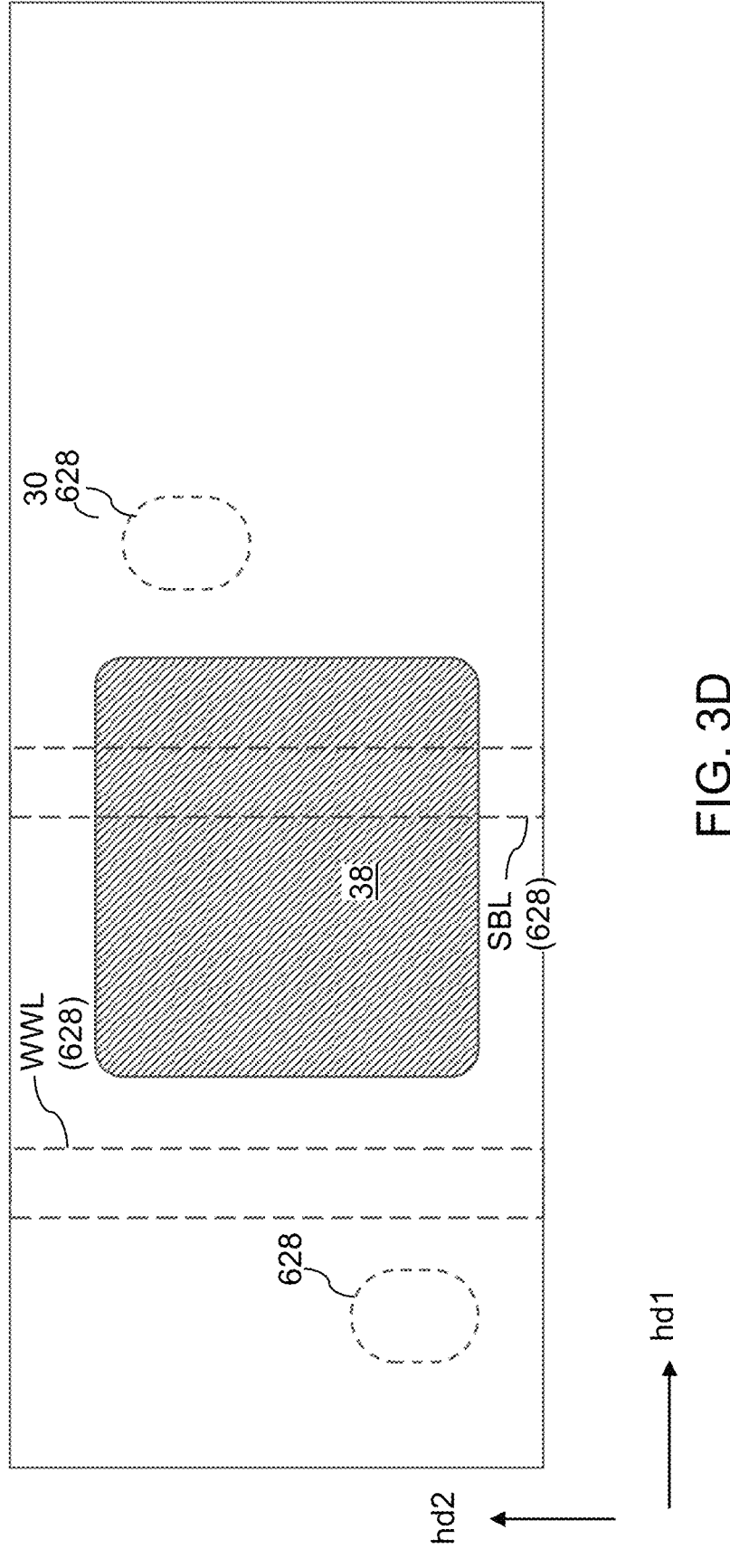
FIG. 3D is a top-down view of the exemplary structure of FIG. 3C.

Referring to FIGS. 3C and 3D, an exemplary structure for forming a two-transistor one-capacitor (2T1C) gain cell memory device is illustrated after the processing steps described with reference to FIGS. 3A and 3B. The exemplary structure illustrated in FIGS. 3C and 3D may be derived from the exemplary structure for forming a three-transistor one-capacitor (3T1C) gain cell memory device as illustrated in FIGS. 3A and 3B by forming only a single read transistor RT in lieu of a combination of a first read transistor RT1 and a second read transistor RT2. For example, the first read transistor RT1 in FIGS. 3A and 3B may be omitted, and the second read transistor RT2 in FIGS. 3A and 3B may be re-labeled as the read transistor RT to provide the exemplary structure illustrated in FIGS. 3C and 3D.

Figure 4A:
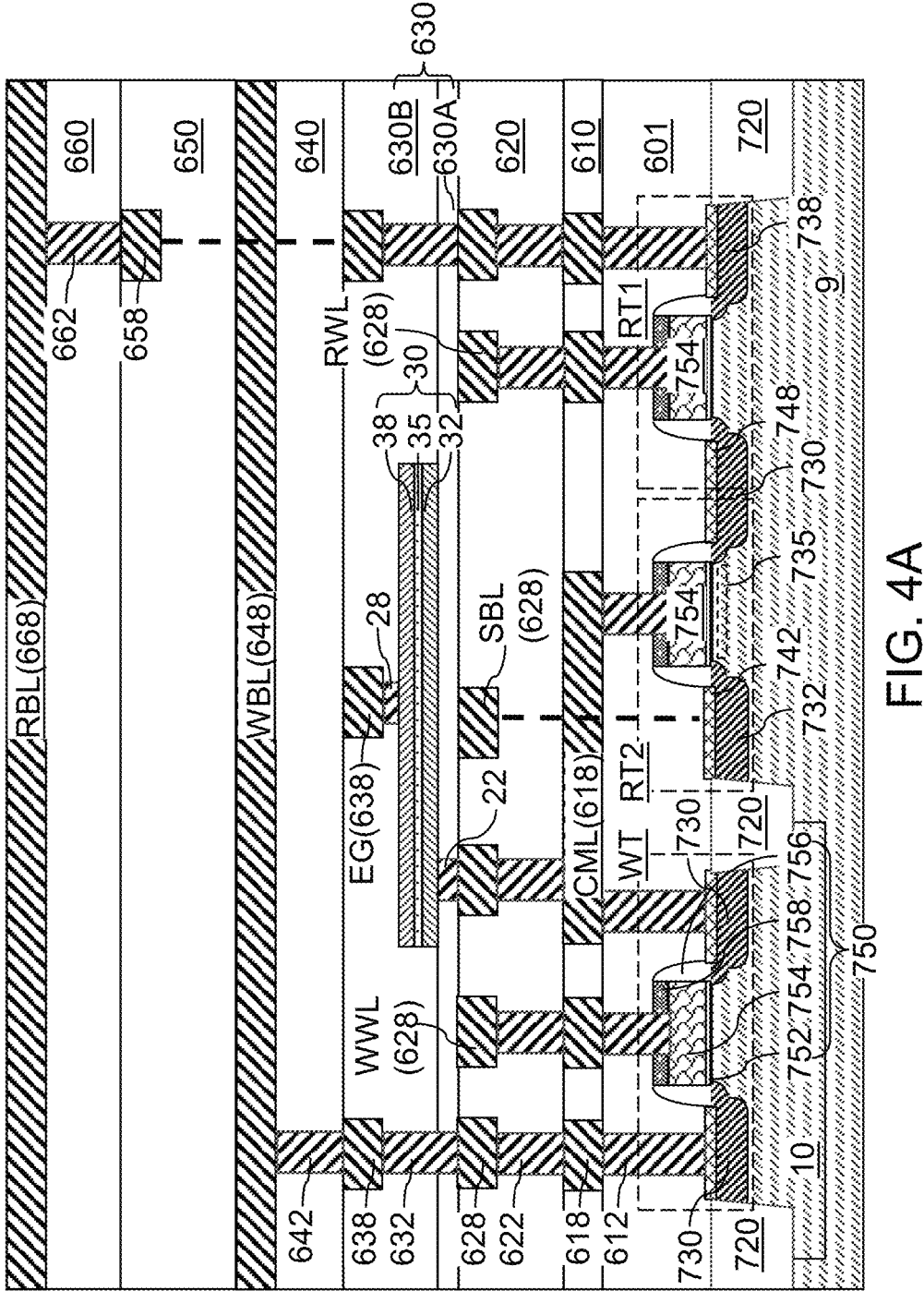
FIG. 4A is a pseudo vertical cross-sectional view of the exemplary structure for forming a three-transistor one-capacitor (3T1C) gain cell memory device after formation of upper-level dielectric material layers and upper-level metal interconnect structures according to an embodiment of the present disclosure.
Figure 4B:
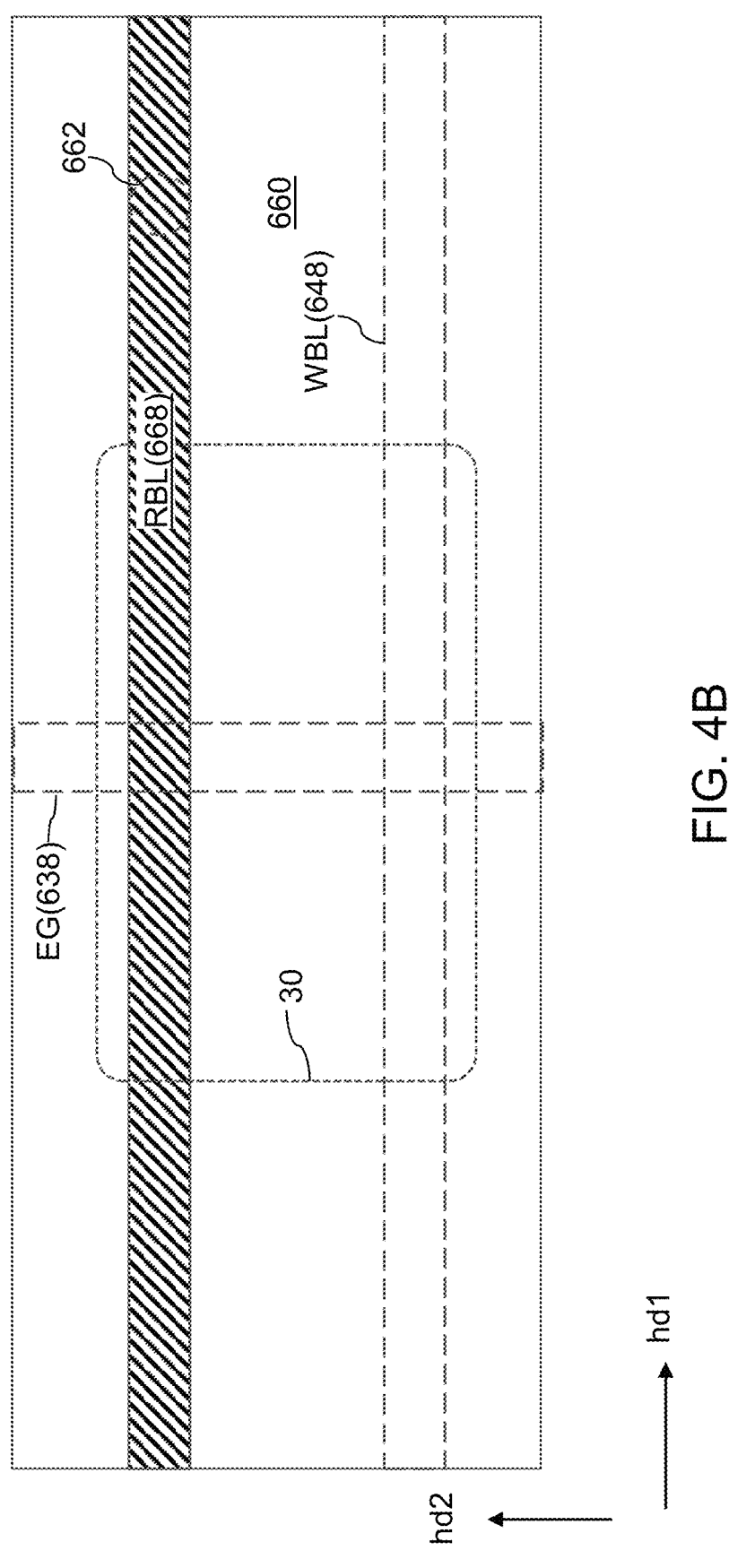
FIG. 4B is a top-down view of the exemplary structure of FIG. 4A.

Referring to FIGS. 4A and 4B, the exemplary structure for forming a three-transistor one-capacitor (3T1C) gain cell memory device is illustrated after formation of additional dielectric material layers and additional metal interconnect structure. FIG. 4B is a top-down view representing an exemplary arrangement of elements. Not all elements within FIG. 4A may be within a same vertical plane, and thus, the view in FIG. 4A may be a composite view of multiple vertical cross-sectional views taken at multiple vertical planes that are parallel to the first horizontal direction hd1 and laterally offset from one another along the second horizontal direction hd2. As such, FIG. 4A is a pseudo vertical cross sectional view.

The additional dielectric material layers may comprise a capacitor-level dielectric layer 630B, a fourth line-and-via-level dielectric material layer 640, a fifth line-and-via-level dielectric material layer 650, a sixth line-and-via-level dielectric material layer 660, and additional dielectric material layers (not shown). The set of dielectric material layers that are formed above the via-level dielectric layer 630A is herein referred to as second dielectric material layers (630B, 640, 650, 660). The set of all dielectric material layers between the second line-and-via-level dielectric material layer 620 and the fourth line-and-via-level dielectric material layer 640 (excluding the node dielectrics 35) constitutes a third line-and-via-level dielectric material layer 630. Thus, the third line-and-via-level dielectric material layer 630 may comprise the via-level dielectric layer 630A and the capacitor-level dielectric layer 630B.

The additional metal interconnect structures are herein referred to as second metal interconnect structures (28, 632, 638, 642, 648, 658, 662, 668). The second metal interconnect structures (28, 632, 638, 642, 648, 658, 662, 668) may be formed in the second dielectric material layers (630B, 640, 650, 660). The second metal interconnect structures (28, 632, 638, 642, 648, 658, 662, 668) may comprise top electrode contact via structures 28 contacting a top surface of a respective top electrode 38 and formed through the capacitor-level dielectric layer 630B, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, fourth metal line structures 648 formed in an upper portion of the fourth line-and-via-level dielectric material layer 640, fourth metal via structures (not illustrated) formed in a lower portion of the fifth line-and-via-level dielectric material layer 650, fifth metal line structures 658 formed in an upper portion of the fifth line-and-via-level dielectric material layer 650, fifth metal via structures 662 formed in a lower portion of the sixth line-and-via-level dielectric material layer 660, sixth metal line structures 668 formed in an upper portion of the sixth line-and-via-level dielectric material layer 660, etc.

The second metal interconnect structures (28, 632, 638, 642, 648, 658, 662, 668) may comprise write bit lines WBL and read bit lines RBL. Each write bit line WBL may be electrically connected to second source/drain regions 730 of a column of write transistors WT through a respective subset of the second metal interconnect structures (28, 632, 638, 642, 648, 658, 662, 668) and a respective subset of the first metal interconnect structures (612, 618, 622, 628, 22). Each read bit line RBL may be electrically connected to drain regions 738 of a column of first read transistors RT1 through a respective subset of the second metal interconnect structures (28, 632, 638, 642, 648, 658, 662, 668) and a respective subset of the first metal interconnect structures (612, 618, 622, 628, 22). A set of second metal interconnect structures (28, 632, 638, 642, 648, 658, 662, 668) that is used as components of an electrically conductive path between a read bit line RBL and a drain region 738 of a first read transistor RT1 and located between a third metal line structure 638 and a fifth metal line structure 658 is schematically represented as a dotted line.

In one embodiment, each top electrode 38 may be electrically connected to electrical ground through a respective subset of the second metal interconnect structures (28, 632, 638, 642, 648, 658, 662, 668) that includes a respective top electrode contact via structure 28. The subset of the second metal interconnect structures (28, 632, 638, 642, 648, 658, 662, 668) comprises electrically grounded interconnect structures EG.

Figure 4C:
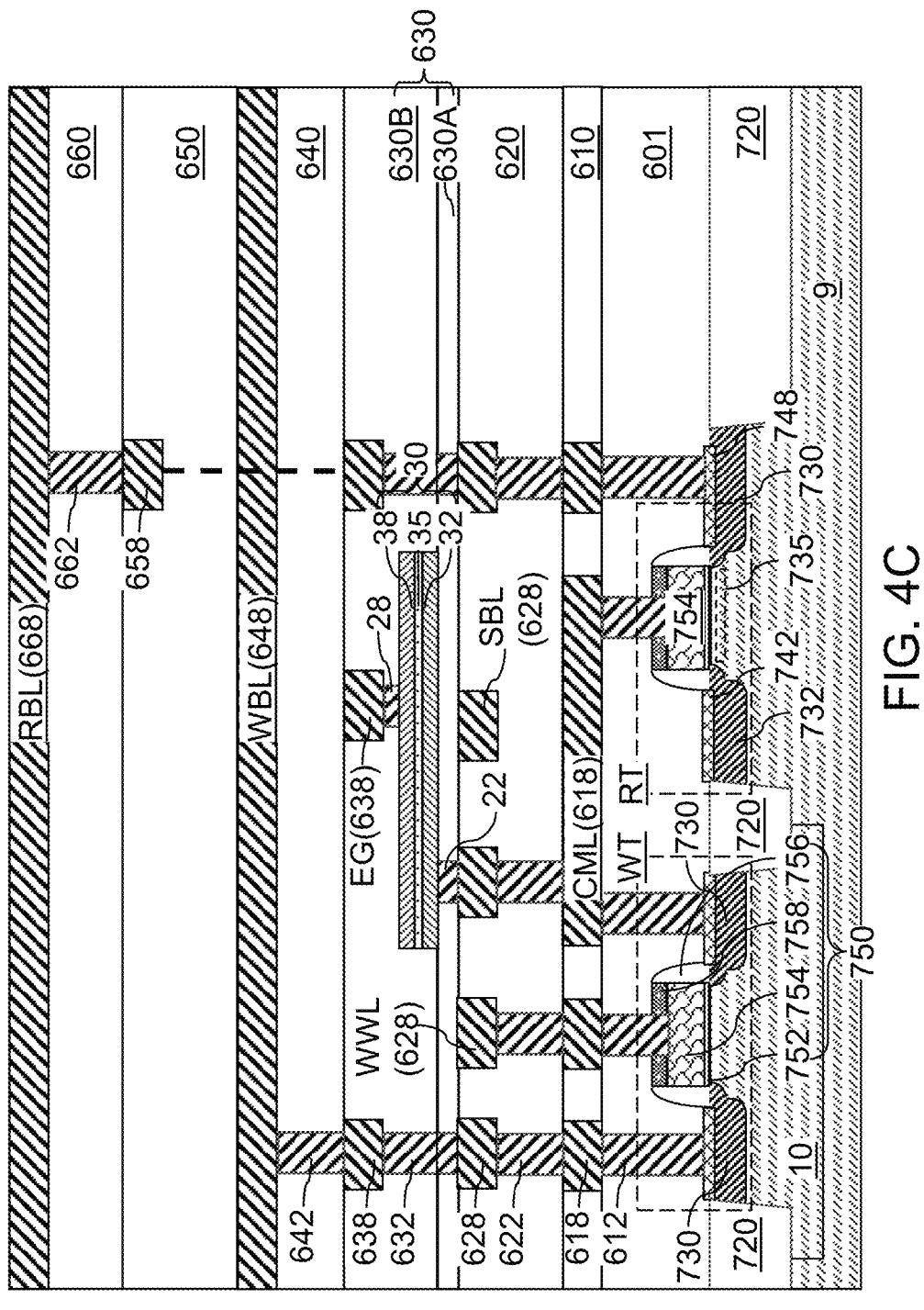
FIG. 4C is a pseudo vertical cross-sectional view of the exemplary structure for forming a two-transistor one-capacitor (2T1C) gain cell memory device after formation of upper-level dielectric material layers and upper-level metal interconnect structures according to an embodiment of the present disclosure.
Figure 4D:
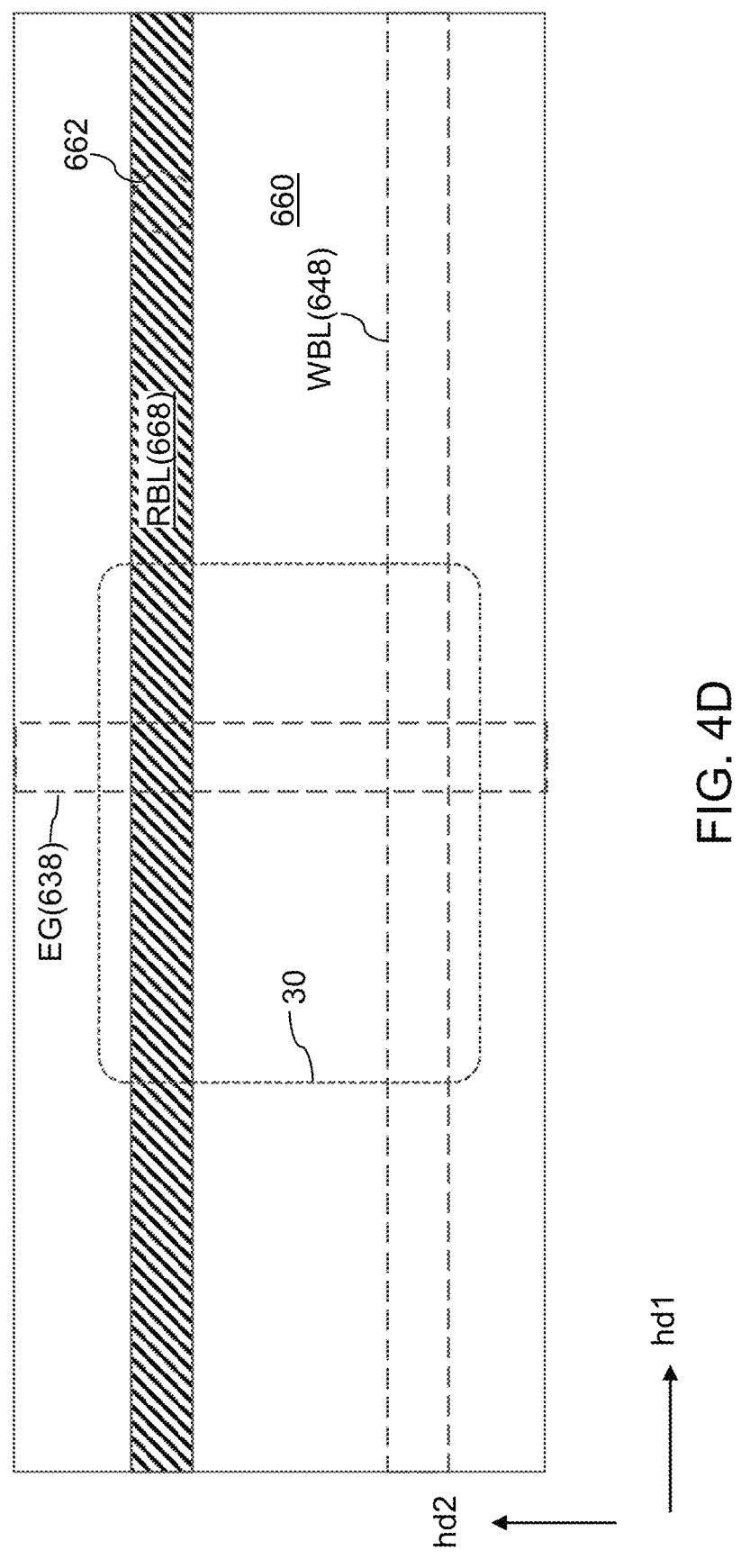
FIG. 4D is a top-down view of the exemplary structure of FIG. 4C.

Referring to FIGS. 4C and 4D, an exemplary structure for forming a two-transistor one-capacitor (2T1C) gain cell memory device is illustrated after the processing steps described with reference to FIGS. 4A and 4B. The exemplary structure illustrated in FIGS. 4C and 4D may be derived from the exemplary structure for forming a three-transistor one-capacitor (3T1C) gain cell memory device as illustrated in FIGS. 4A and 4B by forming only a single read transistor RT in lieu of a combination of a first read transistor RT1 and a second read transistor RT2. For example, the first read transistor RT1 in FIGS. 4A and 4B may be omitted, and the second read transistor RT2 in FIGS. 4A and 4B may be re-labeled as the read transistor RT to provide the exemplary structure illustrated in FIGS. 4C and 4D.

FIGS. 5A-5H are circuit schematics of various configurations of a three-transistor one-capacitor (3T1C) gain cell memory device MD according to various embodiments of the present disclosure. Generally, each of the write transistor WT, the first read transistor RT1, and the second read transistor RT2 in a gain cell memory device MD may comprise a p-type field effect transistor (PFET) or a an n-type field effect transistor (NFET). The various configurations illustrated in FIGS. 5A-5H correspond to eight combinations in which each of the write transistor WT, the first read transistor RT1, and the second read transistor RT2 in a gain cell memory device MD may comprise a PFET or a NFET. Table 1 below provides the combinations of various types of field effect transistors for the eight configurations corresponding to the eight combinations.

TABLE 1

Types of field effect transistors in various configurations
of the 3T1C gain cell memory device of various embodiments.

Figure 5A:
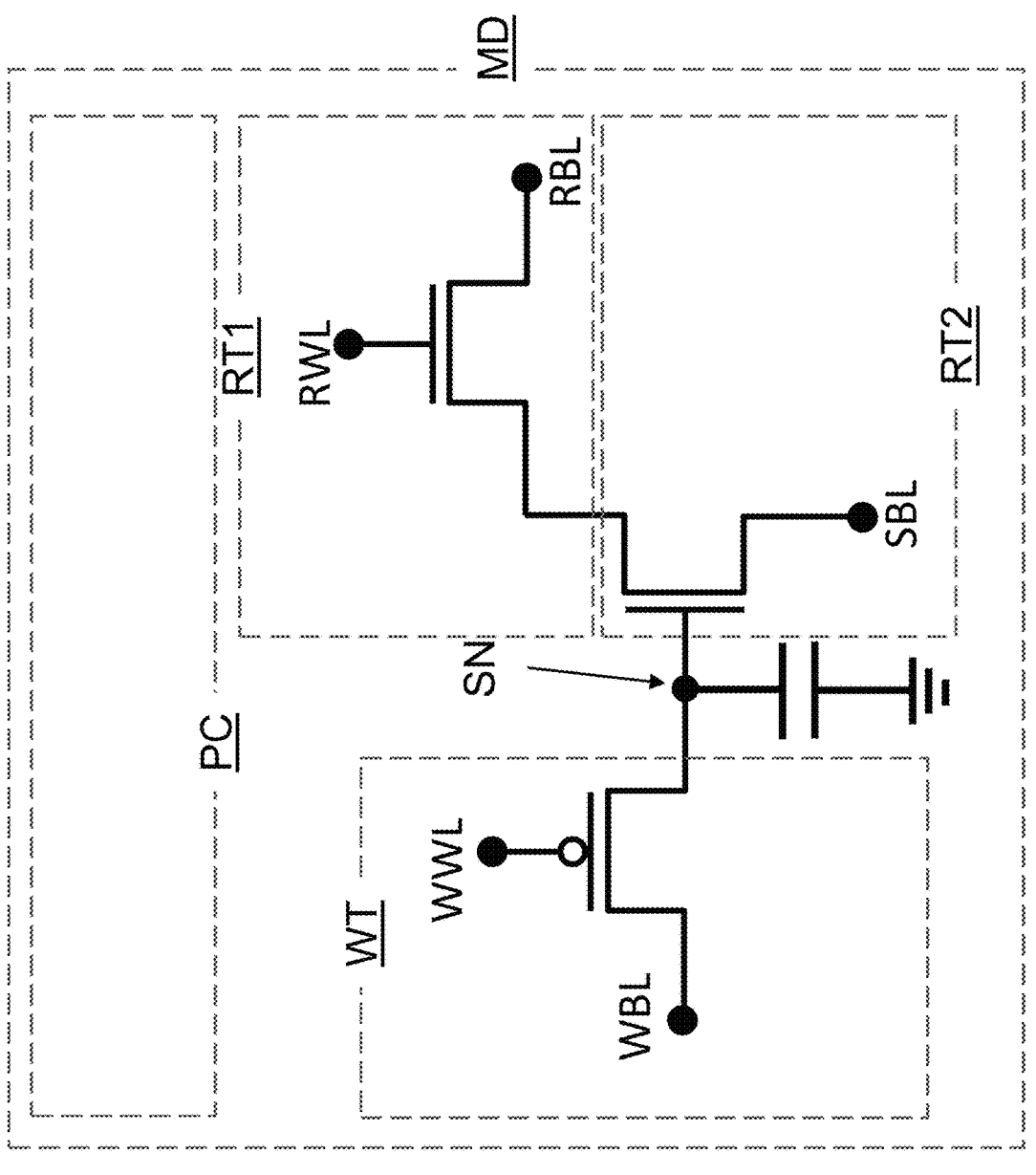
FIGS. 5A-5H are circuit schematics of various configurations of a three-transistor one-capacitor (3T1C) gain cell memory device according to various embodiments of the present disclosure.
Figure 5B:
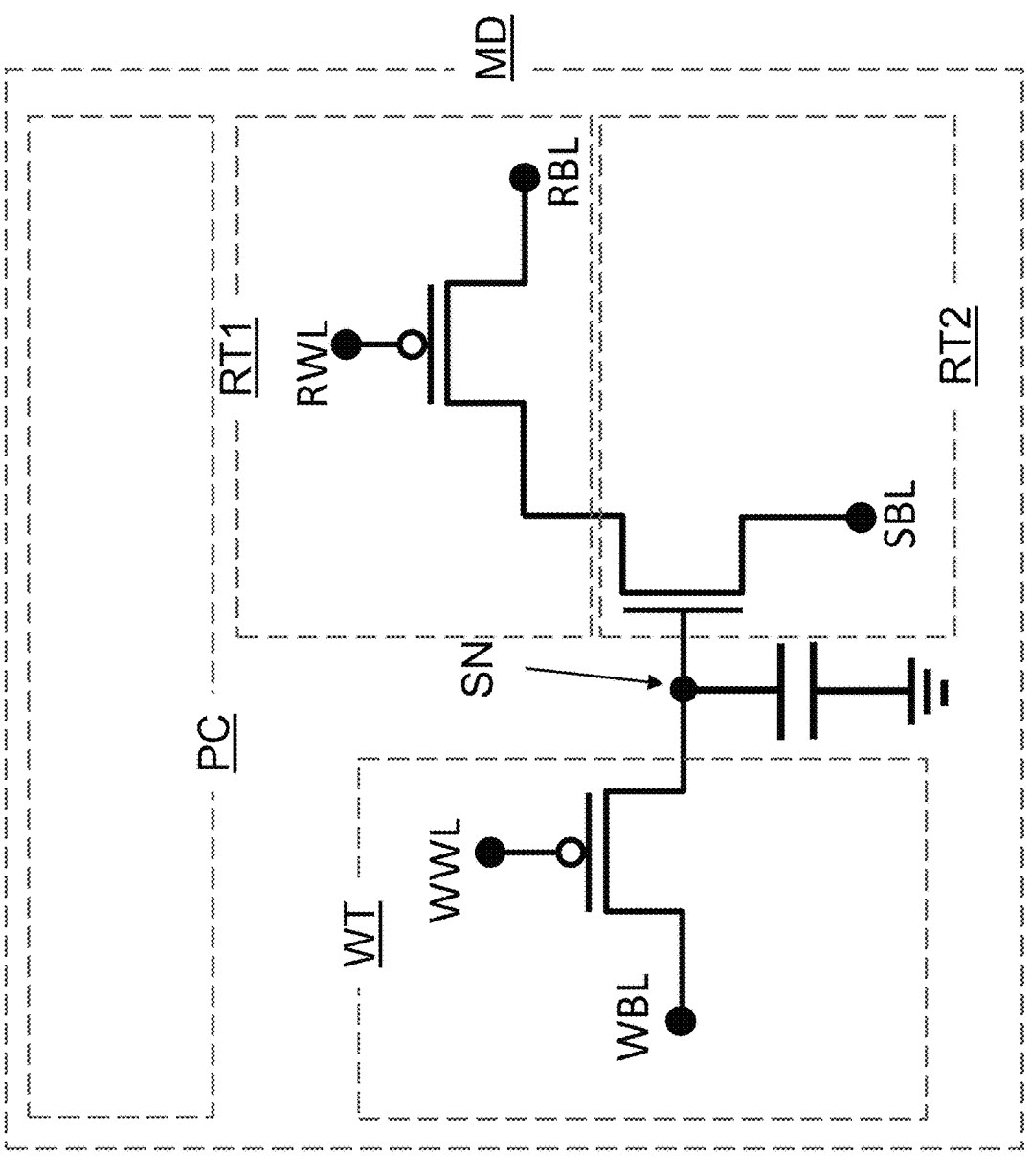
Figure 5C:
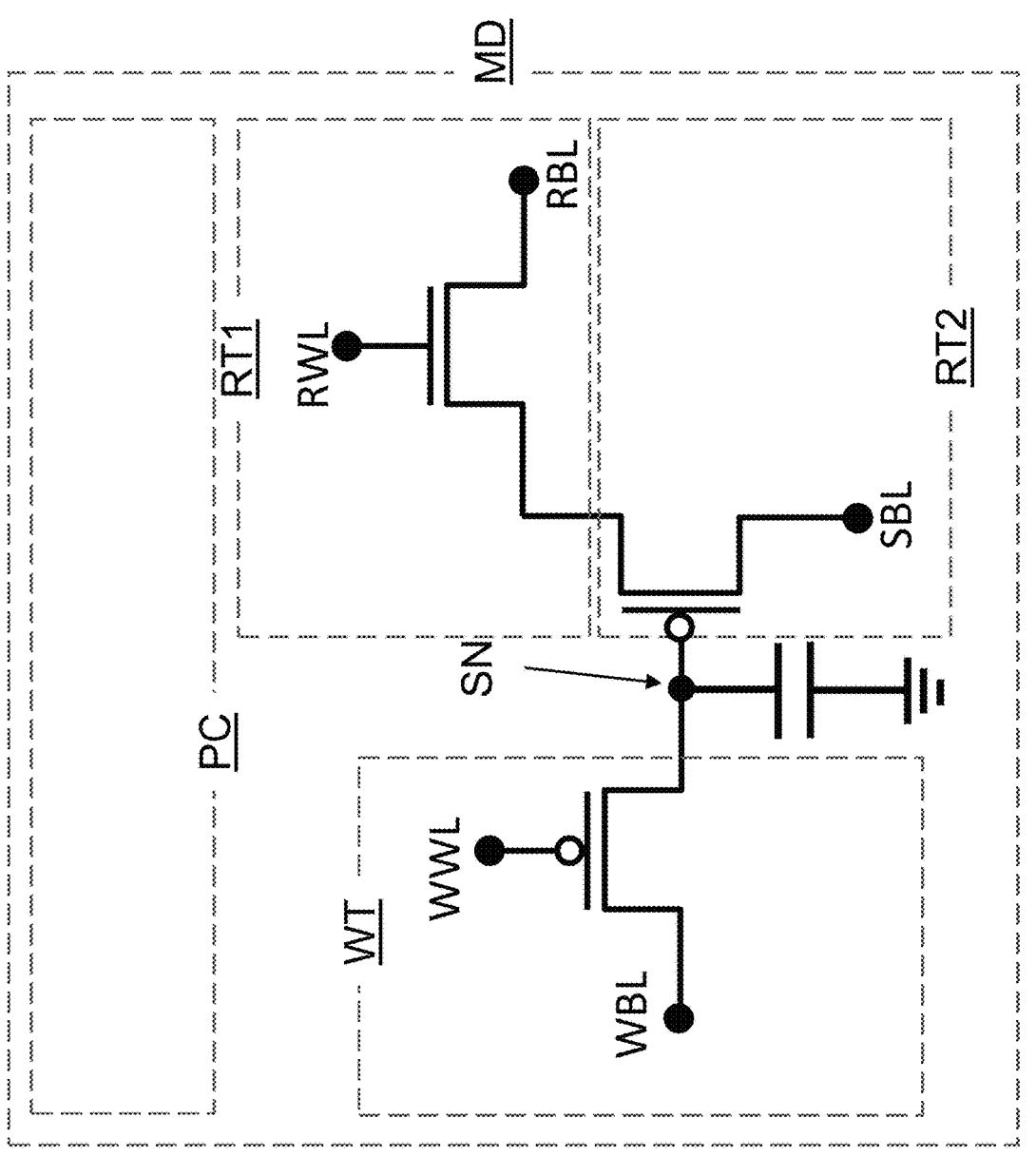
Figure 5D:
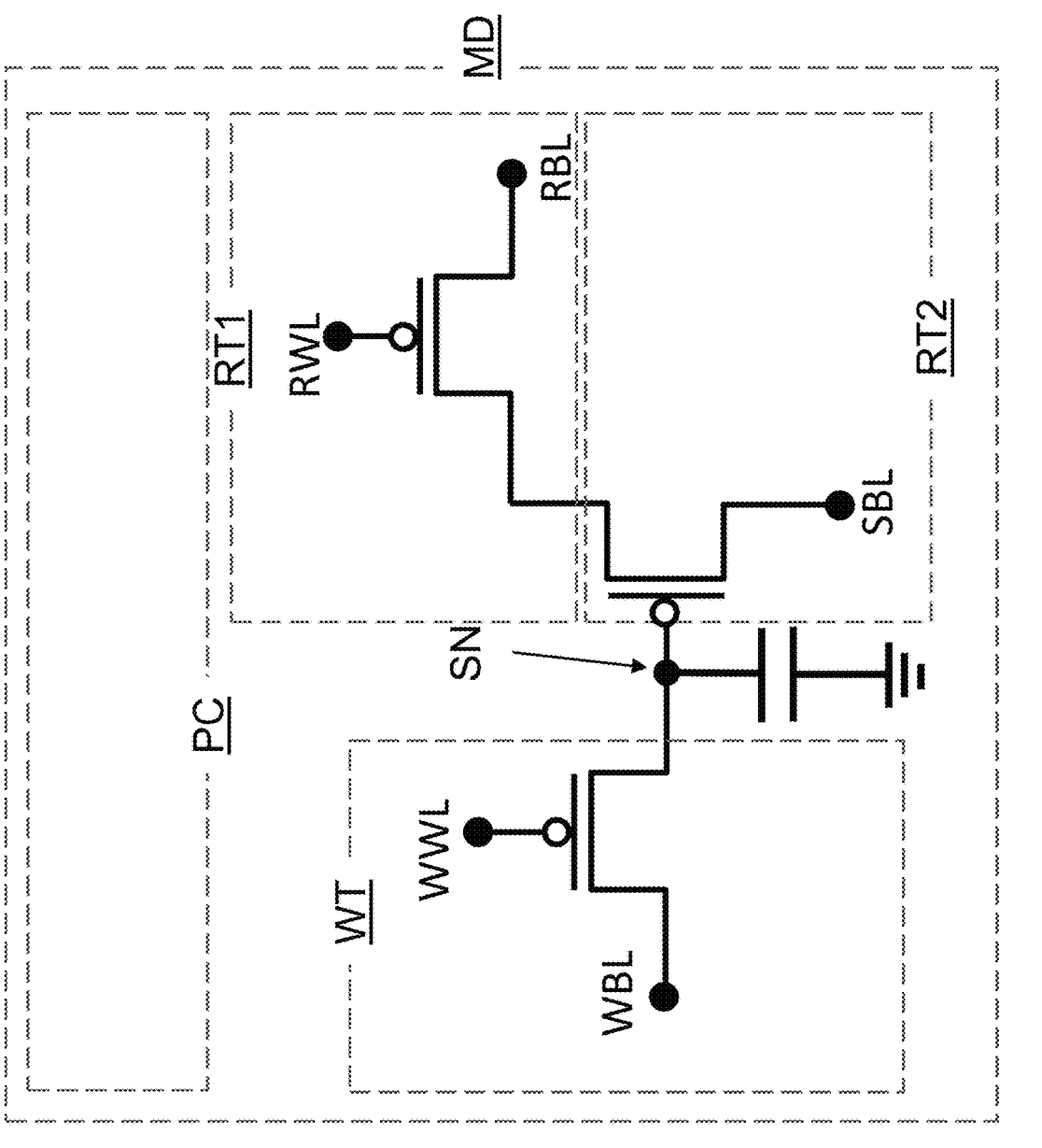
Figure 5E:
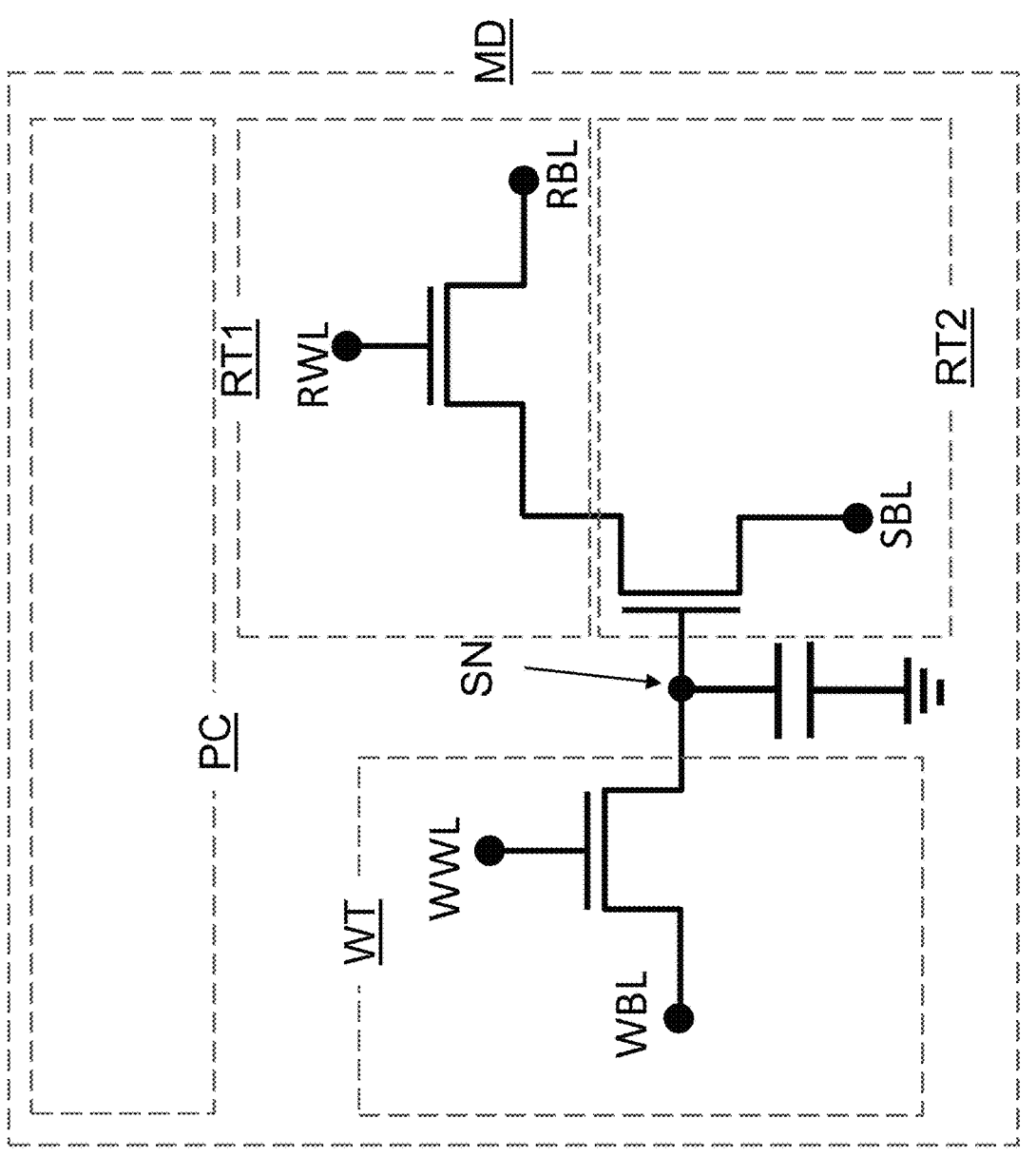
Figure 5F:
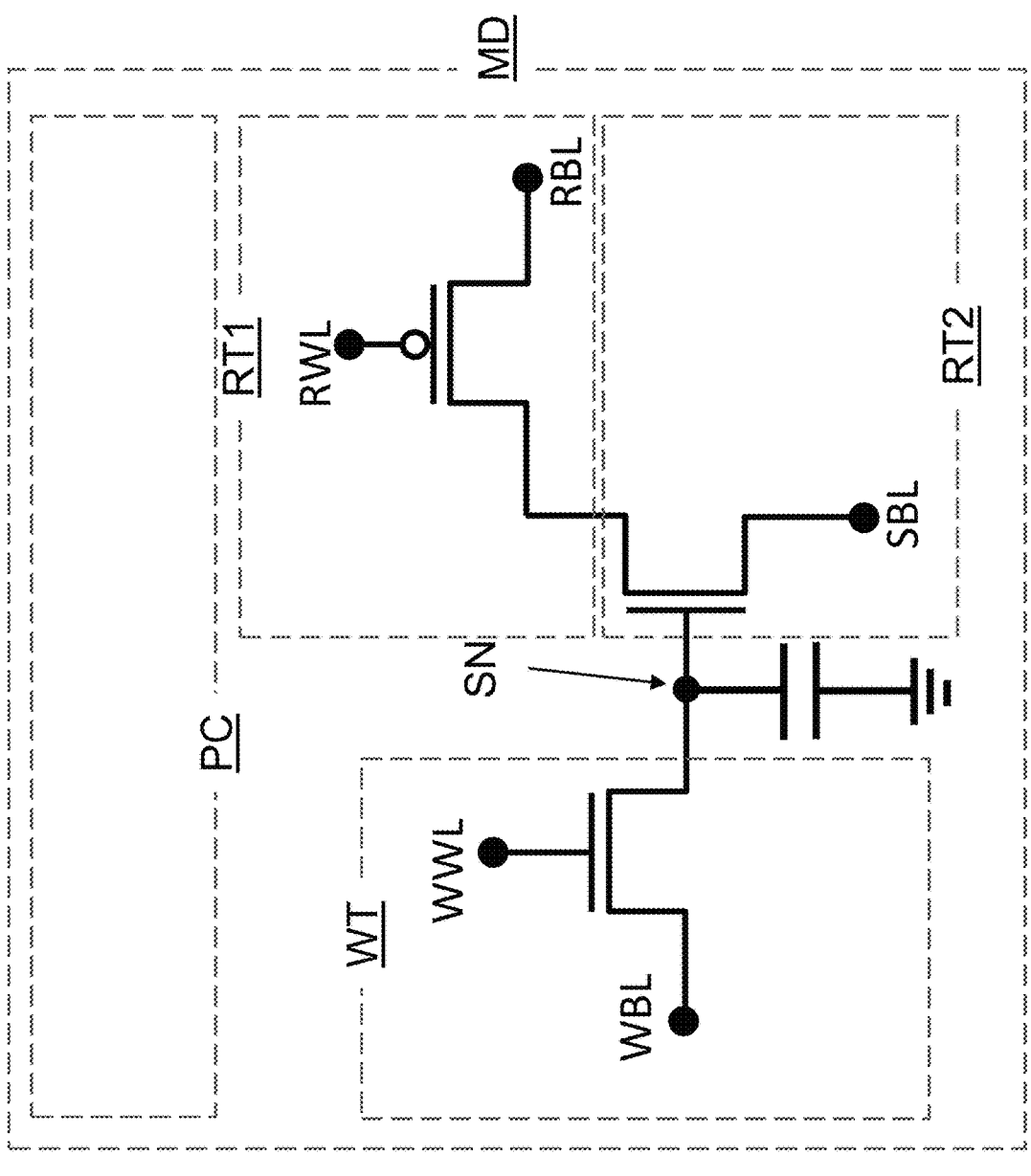
Figure 5G:
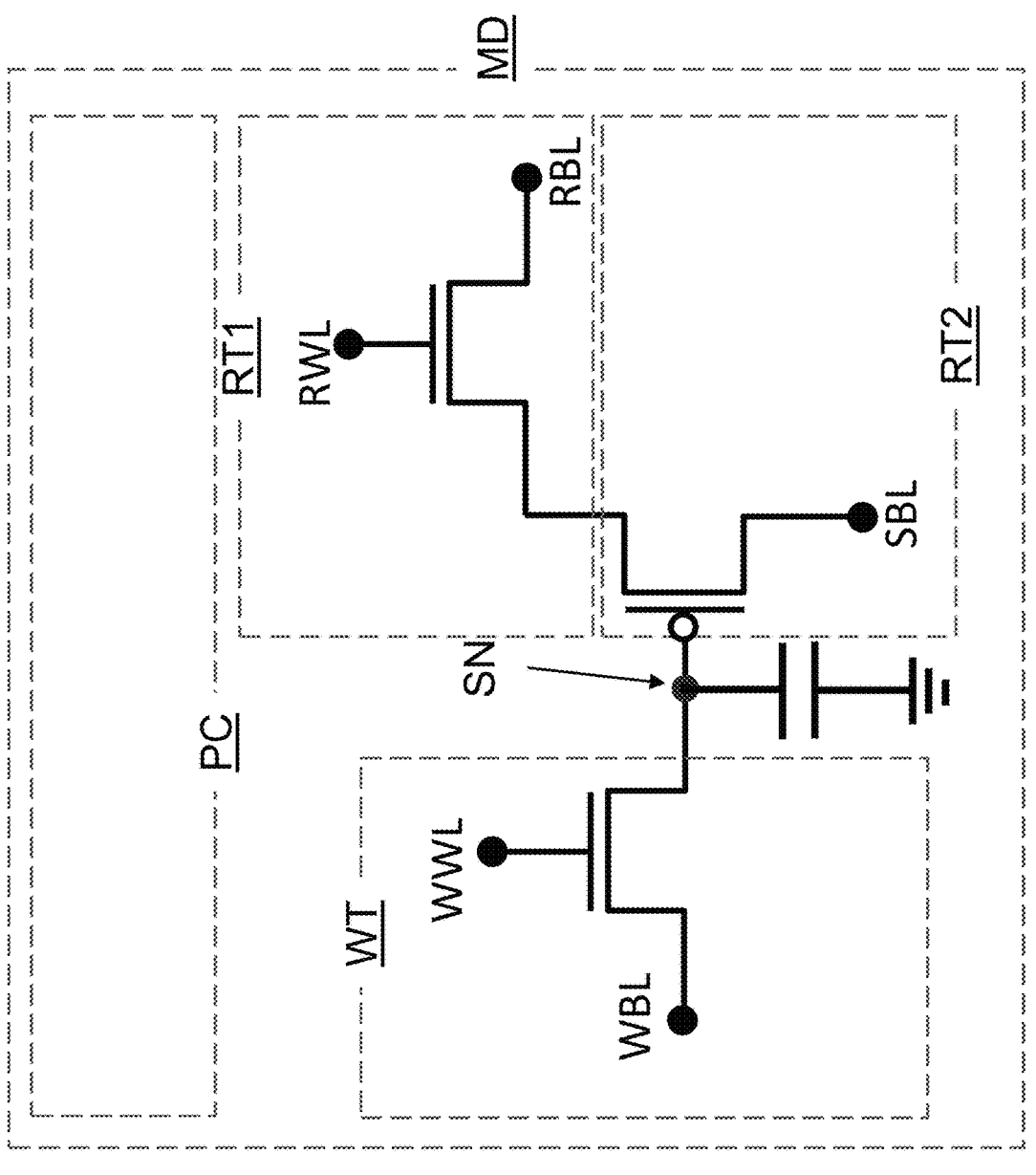
Figure 5H:
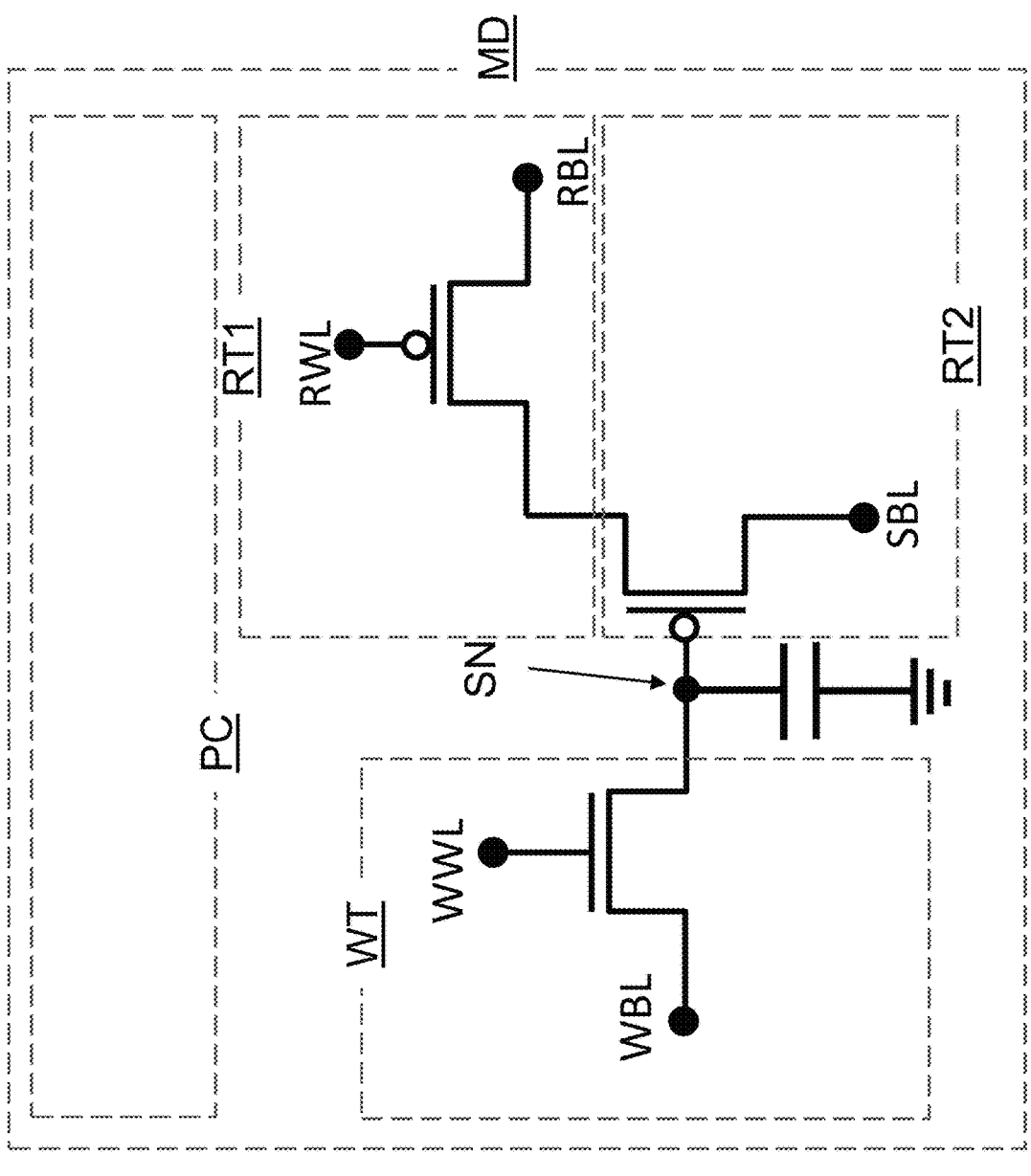

| Configuration Type | Corresponding circuit diagram | Type of the write transistor WT | Type of the first read transistor RT1 | Type of the second read transistor RT2 |
|---|---|---|---|---|
| Type 1 | FIG. 5A | PFET | NFET | NFET |
| Type 2 | FIG. 5B | PFET | PFET | NFET |
| Type 3 | FIG. 5C | PFET | NFET | PFET |
| Type 4 | FIG. 5D | PFET | PFET | PFET |
| Type 5 | FIG. 5E | NFET | NFET | NFET |
| Type 6 | FIG. 5F | NFET | PFET | NFET |
| Type 7 | FIG. 5G | NFET | NFET | PFET |
| Type 8 | FIG. 5H | NFET | PFET | PFET |

Generally, an embodiment gain cell memory device of the present disclosure may comprise a write transistor WT, a series connection of a first read transistor RT1 and a second read transistor RT2 in which a common source/drain region is shared between the first read transistor RT1 and the second read transistor RT2. A signal node SN is formed by electrically connecting a first source/drain region of the write transistor WT to the gate electrode of the second read transistor RT2 and to a first electrode (such as a bottom electrode 32) of a capacitor. A second electrode of the capacitor may be electrically grounded. A second source/drain region of the write transistor WT may be electrically connected to a write bit line WBL. The gate electrode of the write transistor WT may be electrically connected to a write word line WWL. The drain region of the first read transistor RT1 may be electrically connected to a read bit line RBL. The gate electrode of the first read transistor RT1 may be electrically connected to a read word line. The source region of the second read transistor RT2 may be electrically connected to a source bias line SBL. The gain cell memory device MD may comprise a peripheral circuit PC configured to electrically bias each of the write word line WWL, the write bit line WBL, the read bit line RBL, the read word line RWL, and the source bias line SBL.

FIGS. 5I-5L are circuit schematics of various configurations of a two-transistor one-capacitor (2T1C) gain cell memory device MD according to various embodiments of the present disclosure. The various types of two-transistor one-capacitor (2T1C) gain cell memory device MD may be derived from the various types of three-transistor one-capacitor (3T1C) gain cell memory device MD described with reference to FIGS. 5A-5H by removing the first read transistor RT1, by removing the write bit line WBL, and by directly connecting the read bit line RBL to the drain region of a read transistor RT (which corresponds to the second read transistor RT2 of the three-transistor one-capacitor (3T1C) gain cell memory device).

The operation of the two-transistor one-capacitor (2T1C) gain cell memory device MD may be the same as the operation of the three-transistor one-capacitor (3T1C) gain cell memory device MD except that the drain voltage of the read transistor RT, i.e., the voltage at the drain region of the read transistor RT, is directly controlled by the read bit line RBL, which is electrically shorted to the drain region of the read transistor RT. In other words, the voltage at the drain region of the second read transistor RT2 in the three-transistor one-capacitor (3T1C) gain cell memory device MD described above is replicated during operation of the two-transistor one-capacitor (2T1C) gain cell memory device MD illustrated in FIGS. 5I-5L.

In some embodiments, the source bias line (SBL) voltage range is optimized for enhanced memory operation flexibility. Specifically, for configurations utilizing an n-type field effect transistor (NFET) for the second read transistor RT2, the SBL voltage can be adjusted to $0V \pm \Delta V$. Conversely, for configurations utilizing a p-type field effect transistor (PFET) for RT2, the SBL voltage can be set to $Vdd \pm \Delta V$. This adjustment allows for maximizing the voltage difference ($\Delta V$) between the read bit line (RBL) states of "0" and "1" during a given read access time, enhancing the discernibility between stored data states.

The various configurations illustrated in FIGS. 5I-5L correspond to four combinations in which each of the write transistor WT and the read transistor RT in a gain cell memory device MD may comprise a PFET or a NFET. Table 2 below provides the combinations of various types of field effect transistors for the four configurations corresponding to the four combinations.

TABLE 2

Types of field effect transistors in various configurations
of the 2T1C gain cell memory device of various embodiments.

Figure 5I:
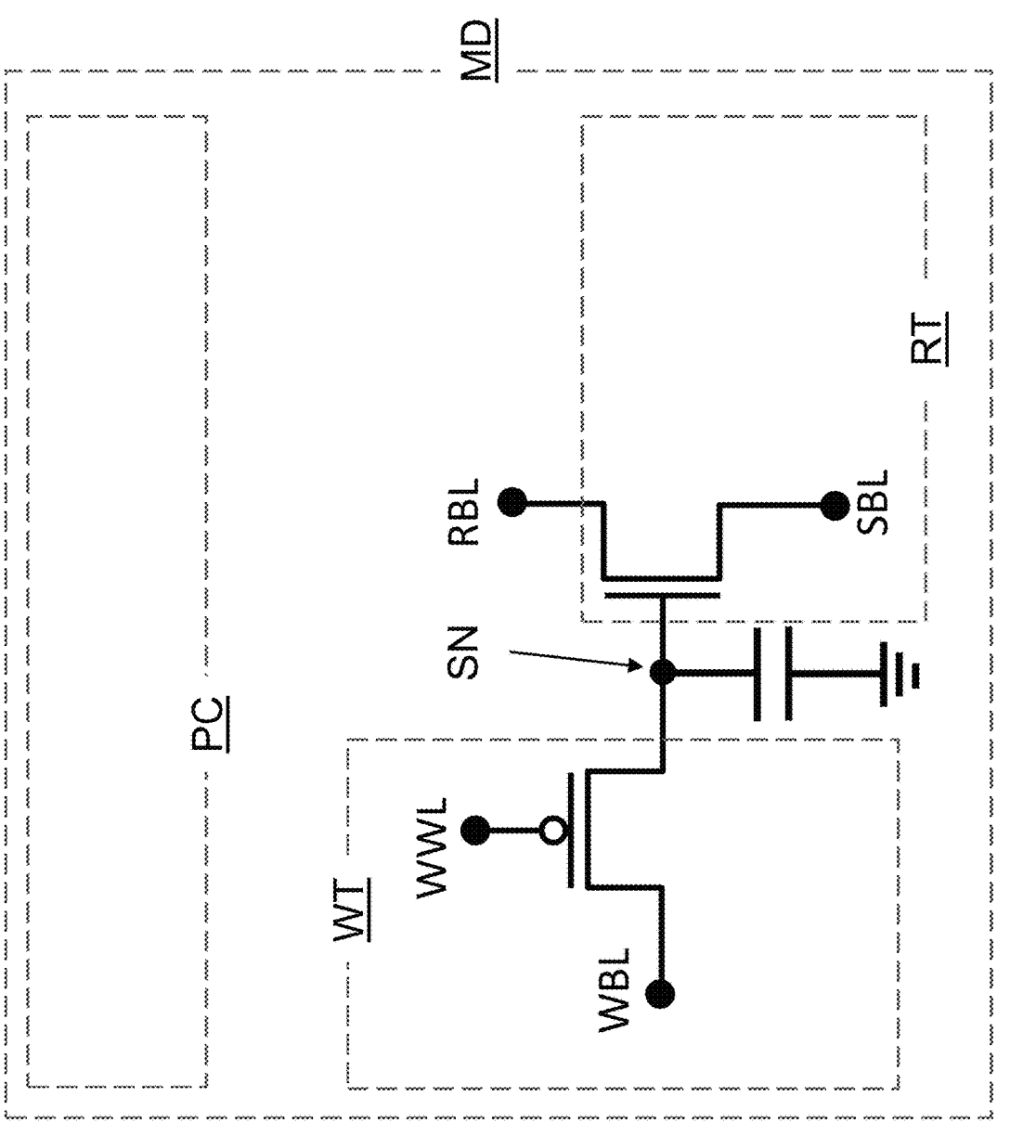
FIGS. 5I-5L are circuit schematics of various configurations of a two-transistor one-capacitor (2T1C) gain cell memory devices according to various embodiments of the present disclosure.
Figure 5J:
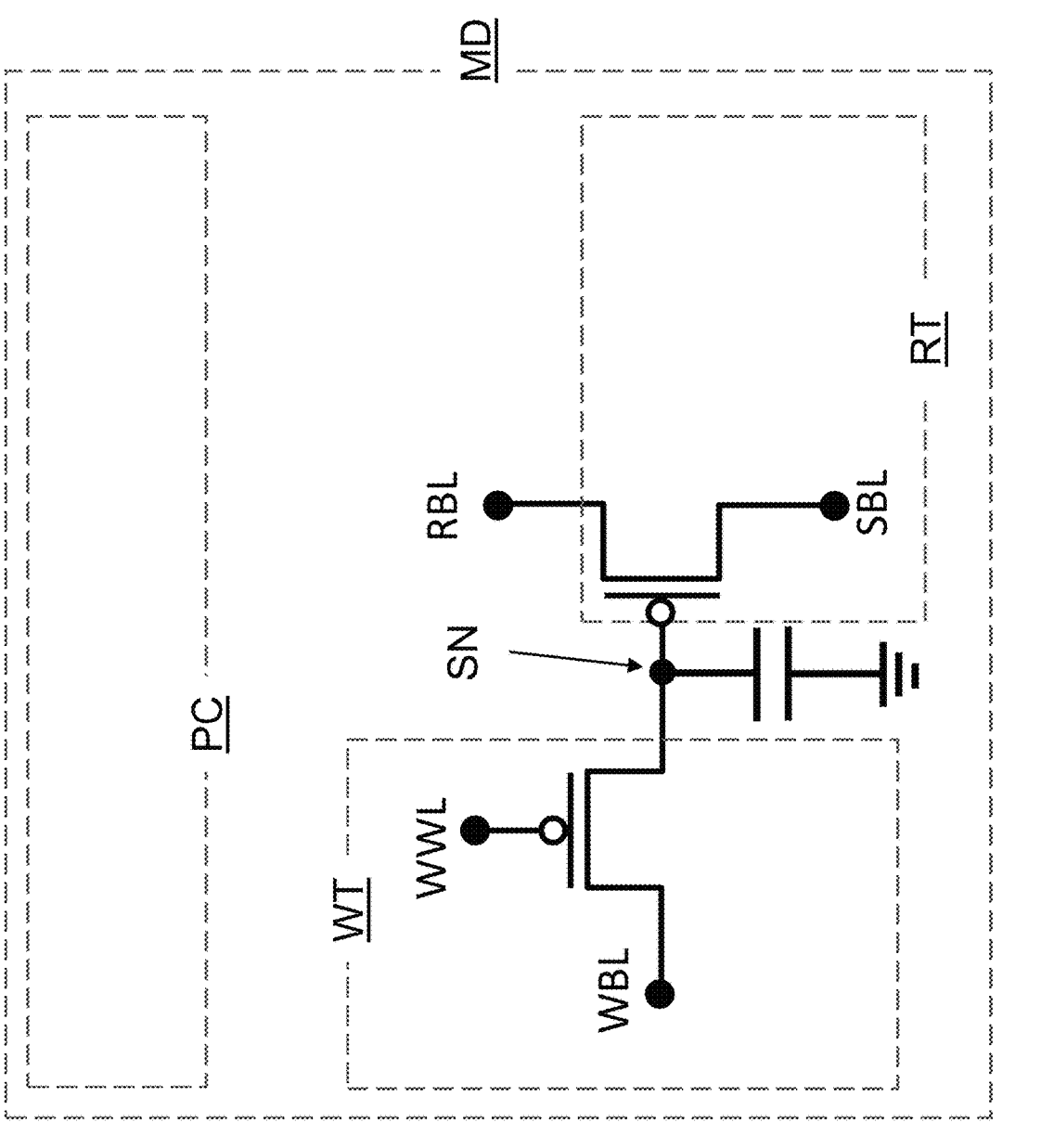
Figure 5K:
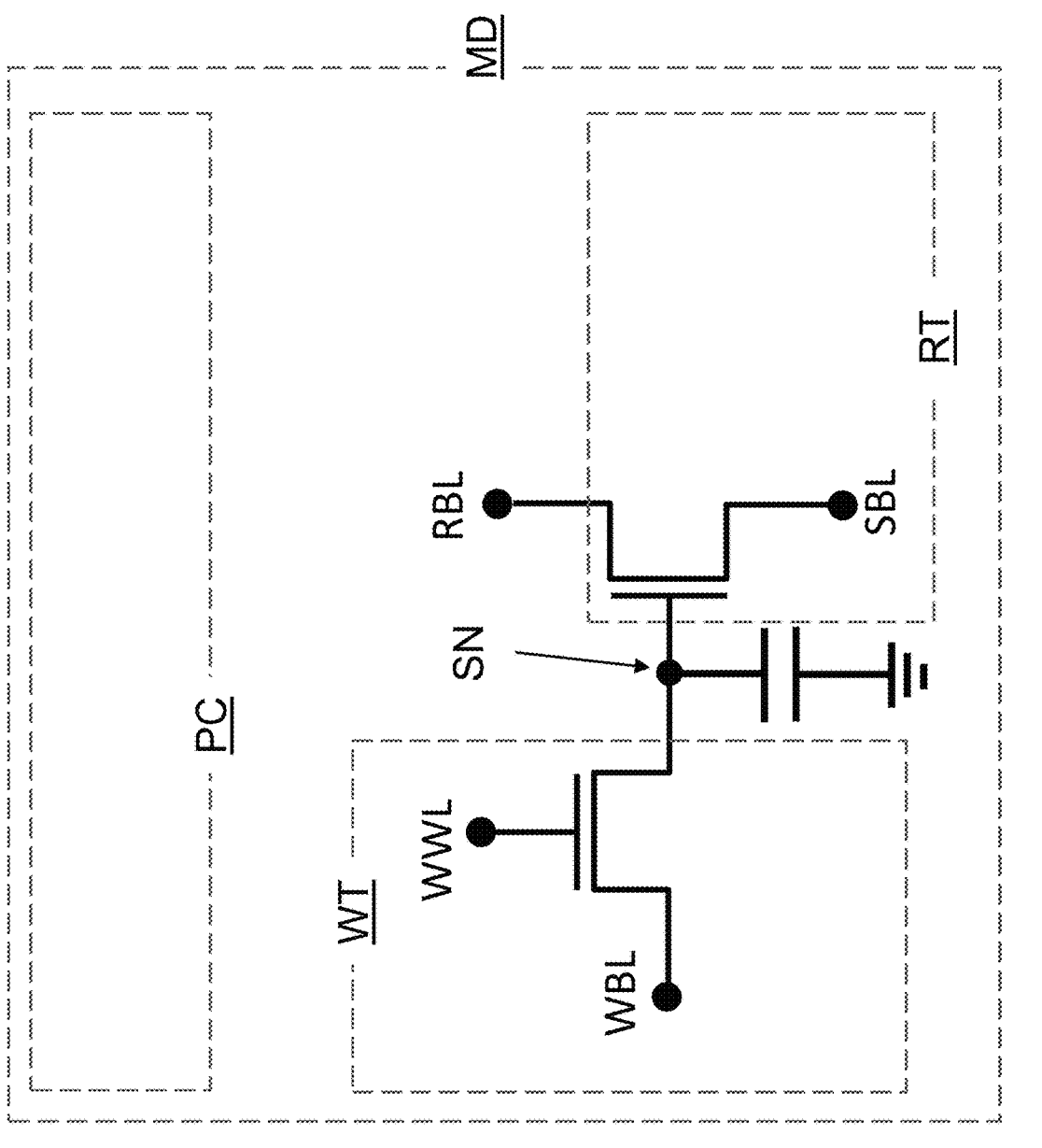
Figure 5L:
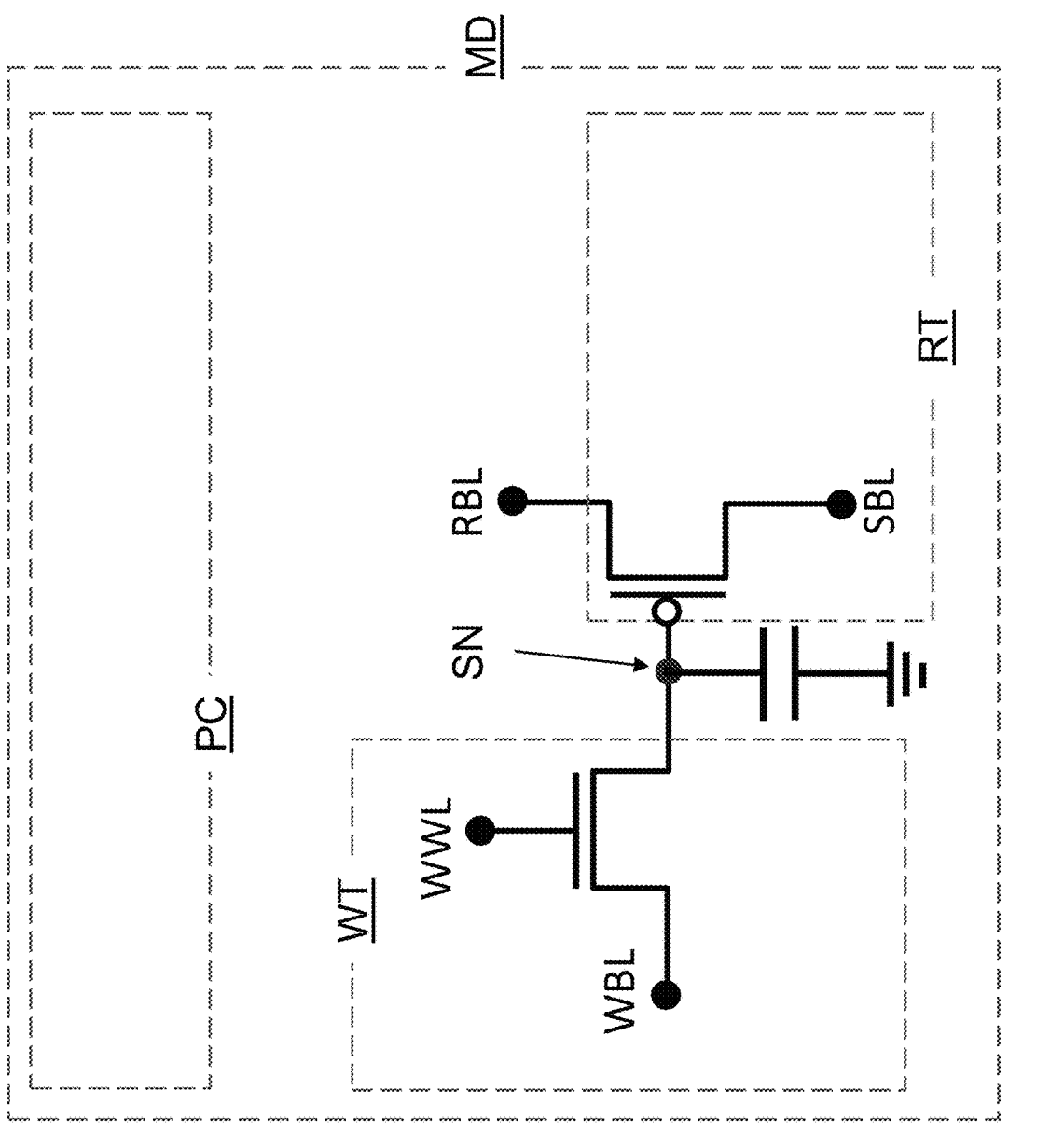

| Configuration Type | Corresponding circuit diagram | Type of the write transistor WT | Type of the read transistor RT |
|---|---|---|---|
| Type 1 | FIG. 5I | PFET | NFET |
| Type 2 | FIG. 5J | PFET | PFET |
| Type 3 | FIG. 5K | NFET | NFET |
| Type 4 | FIG. 5L | NFET | PFET |

FIGS. 6A-6H are waveform diagrams for operation of the various configurations of the three-transistor one-capacitor (3T1C) gain cell memory device MD according to various embodiments of the present disclosure.

In the operational dynamics of the gain cell memory device, the read bit line (RBL) exhibits critical behavior that distinguishes the data states being read. Specifically, during a read operation, in instances in which the read word line (RWL) is activated, the RBL is designed to discharge from the supply voltage Vdd to 0V for a read "1" state, signifying the presence of a high data state. Conversely, for a read "0" state, the RBL remains at the supply voltage Vdd, indicating the absence of discharge and thus the low data state. This distinction in the RBL's voltage level during the read operations forms the basis for accurately sensing and differentiating the stored "1" and "0" data bits within the memory device.

For each gain cell memory device MD including a write transistor WT and a series connection of a first read transistor RT1 and a second read transistor RT2, a read bit line RBL may be connected to a drain region 738 of the first read transistor RT1, and a source bias line SBL may be connected to a source region 732 of the second read transistor RT2. Each gain cell memory device MD comprises a signal node SN at which the first electrode 32 of a capacitor 30 may be electrically connected to a first source/drain region 730 of the write transistor WT and to a gate electrode 754 of the second read transistor RT2.

A write operation may be performed to encode a data bit in the signal node SN by applying a write read-bit-line bias voltage to a second source/drain region 730 of the write transistor WT and by turning on the write transistor WT while the source bias line SBL may be electrically biased at a first source bias voltage, which is herein referred to as a normal source bias voltage.

Table 3 below provides the relationship among the various embodiment configurations illustrated in FIGS. 5A-5H, the various embodiment configurations illustrated in FIGS. 6A-6H, and the various operational voltages for the write word line WWL and the write bit line WBL during a write operation. Write bit line "1" voltage refers to a bias voltage at the write bit line WBL for writing "1" at the signal node, and write bit line "0" voltage refers to a bias voltage at the write bit line WBL for writing "0" at the signal node.

TABLE 3 operational voltages for the write word line WWL and the write bit line WBL for
various configurations of the gain cell memory device of various embodiments.

Figure 6A:
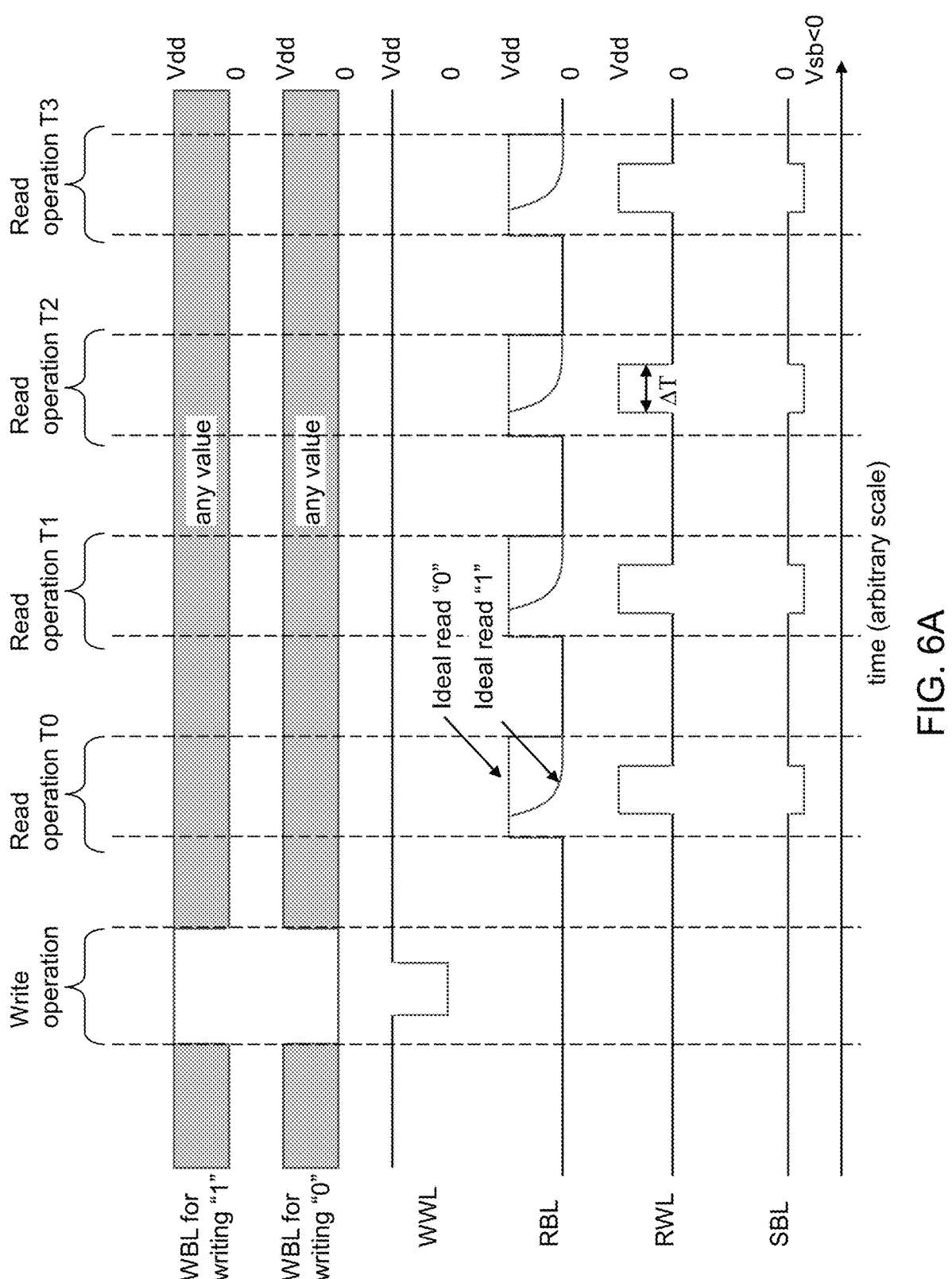
FIGS. 6A-6H are waveform diagrams for operation of the various configurations of the three-transistor one-capacitor (3T1C) gain cell memory device according to various embodiments of the present disclosure.
Figure 6B:
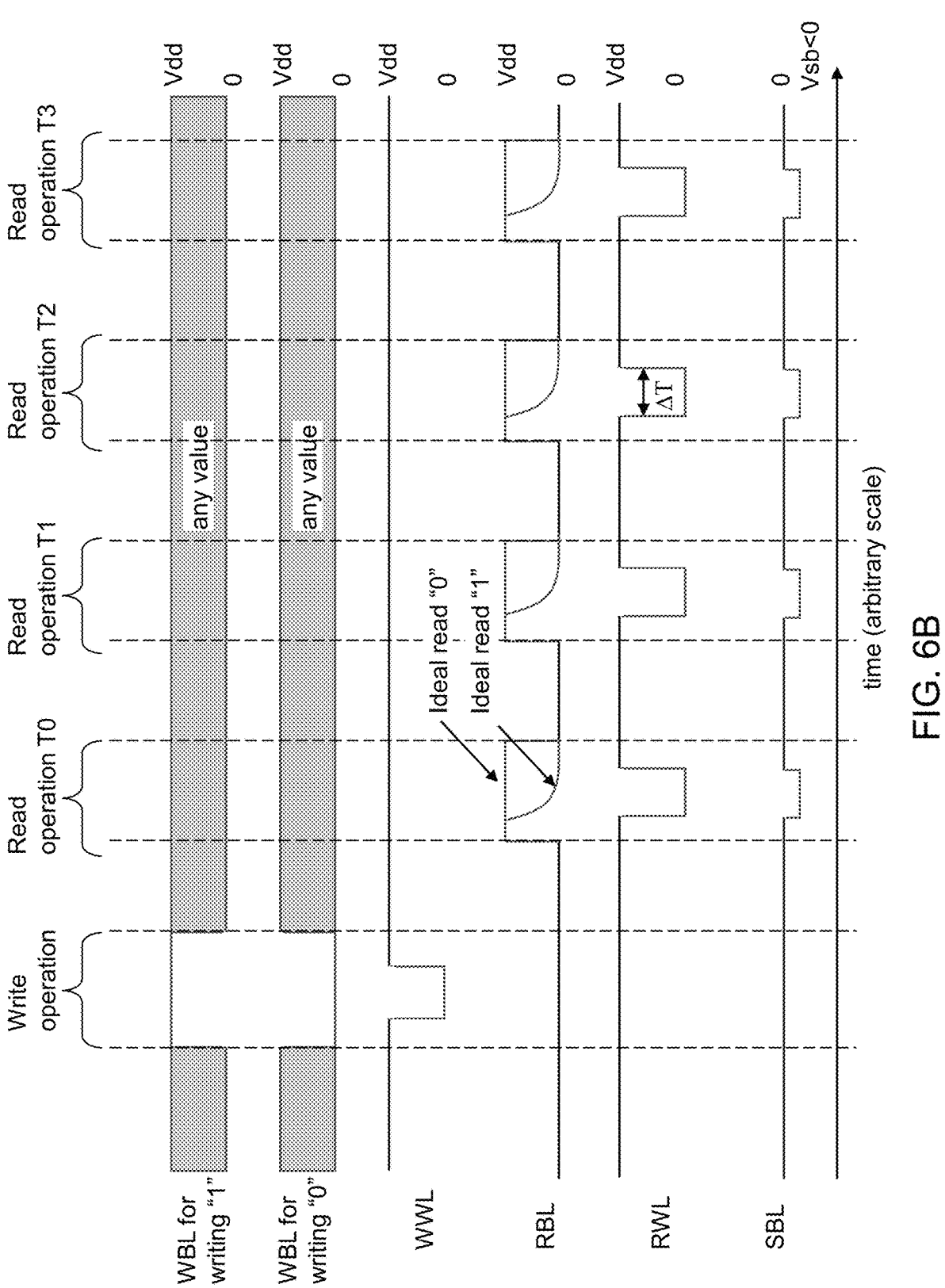
Figure 6C:
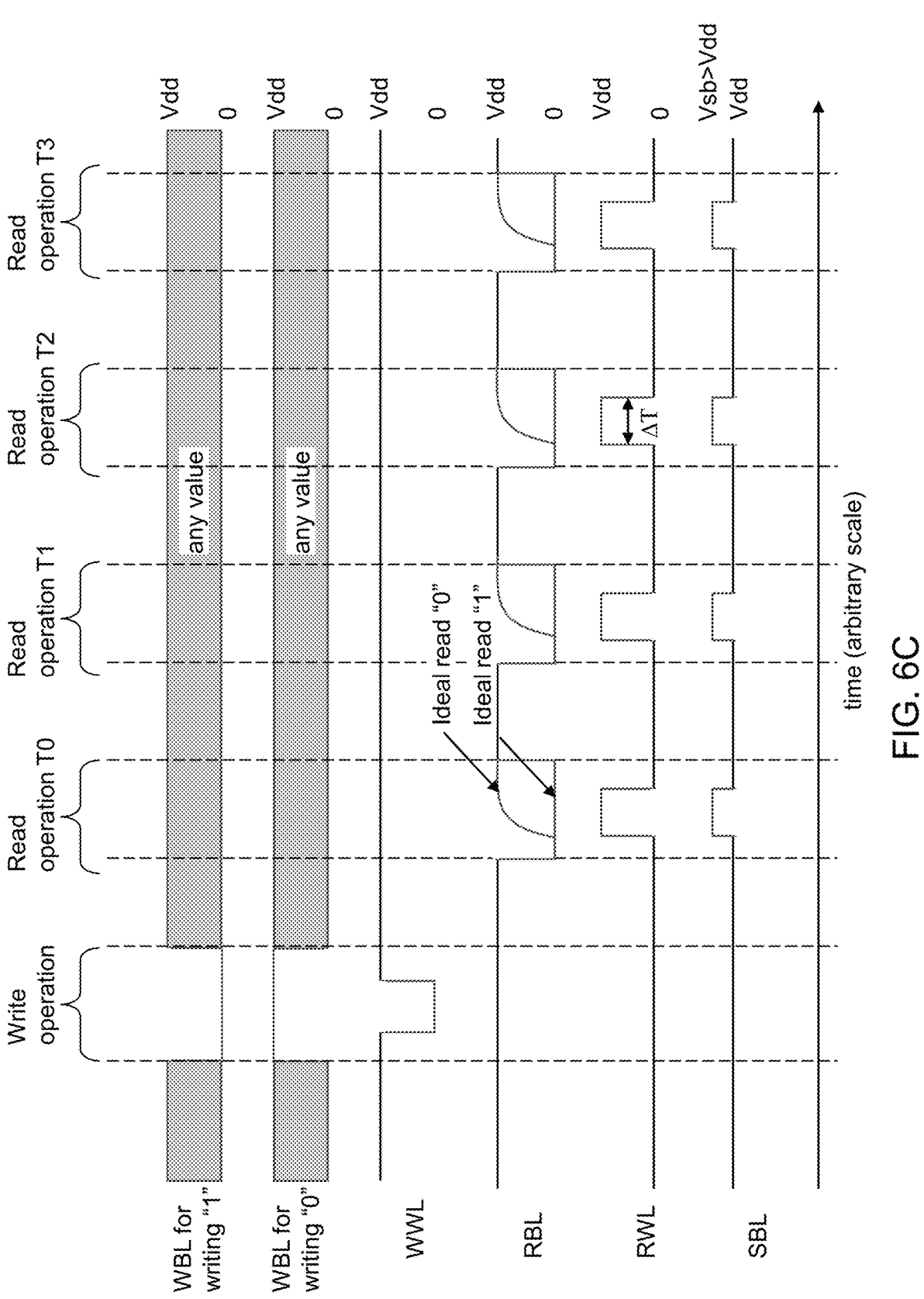
Figure 6D:
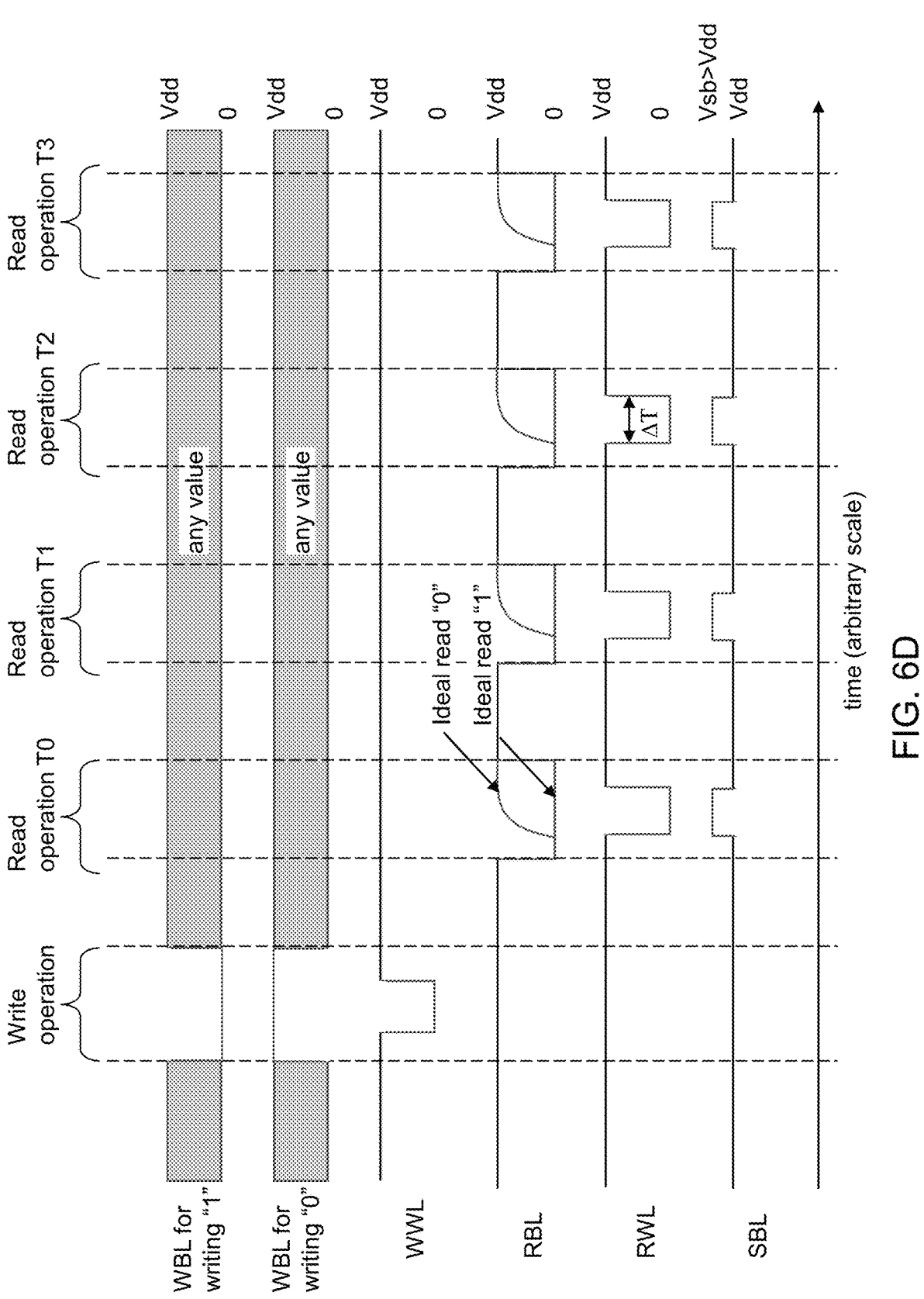
Figure 6E:
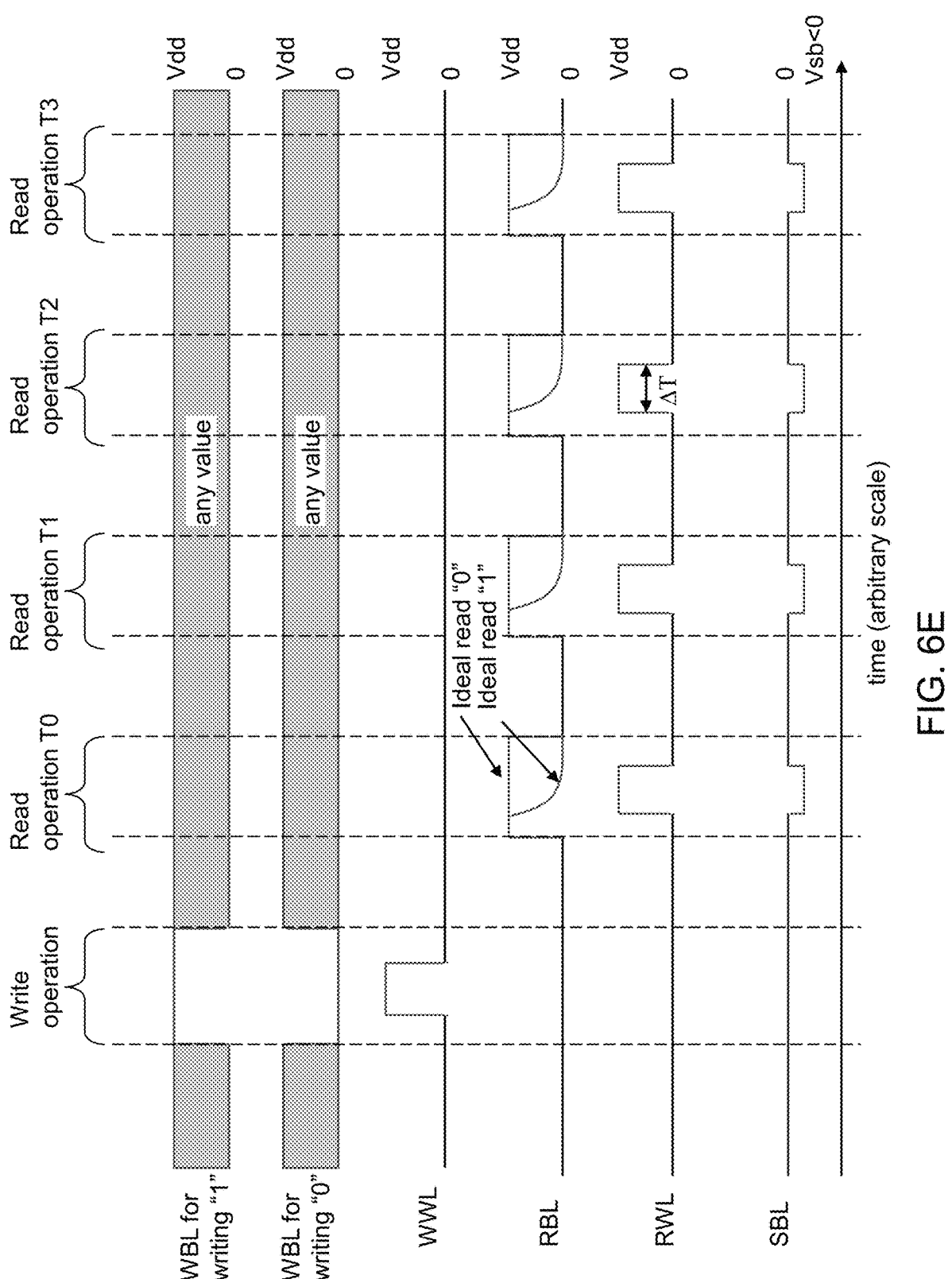
Figure 6F:
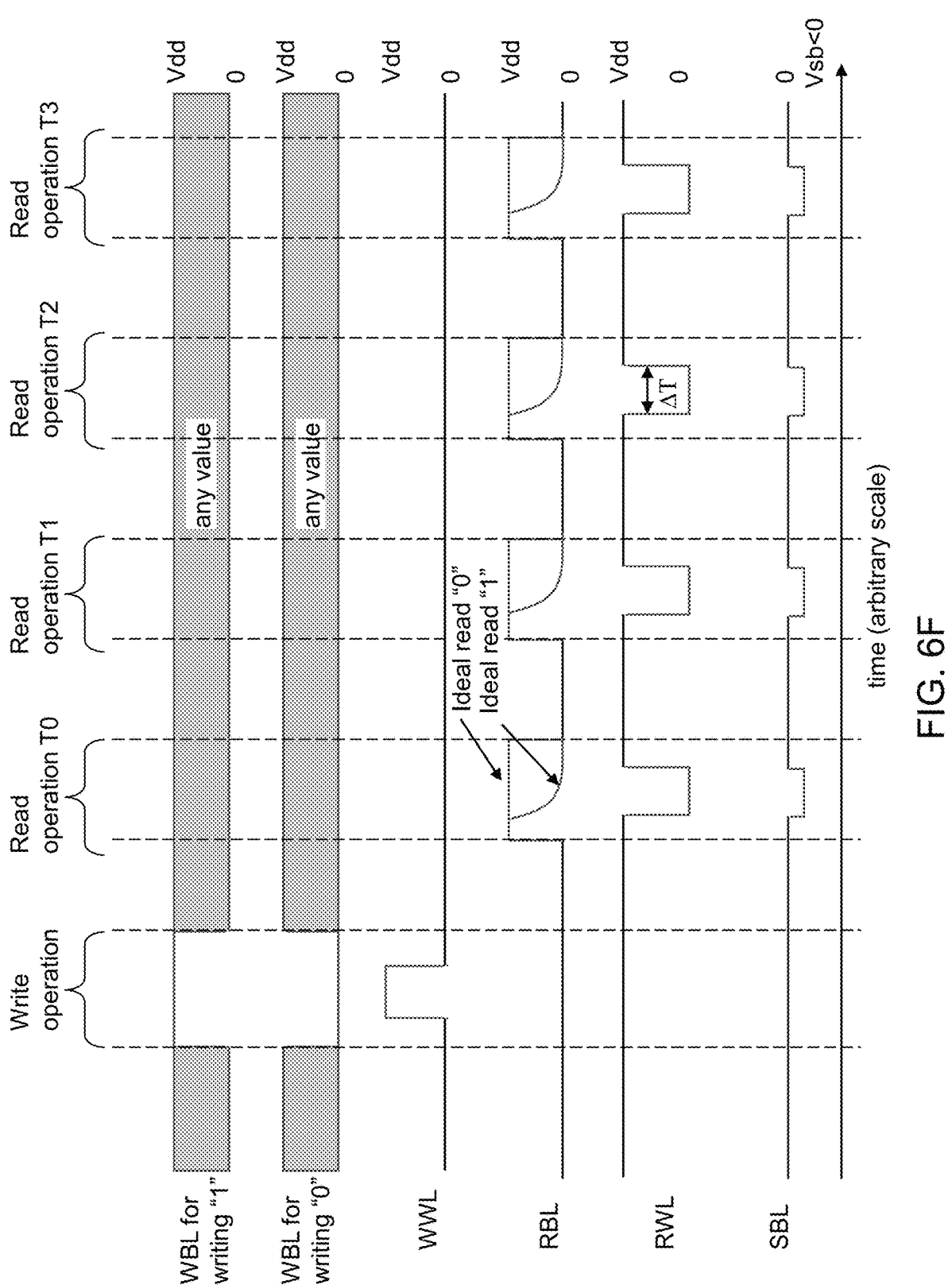
Figure 6G:
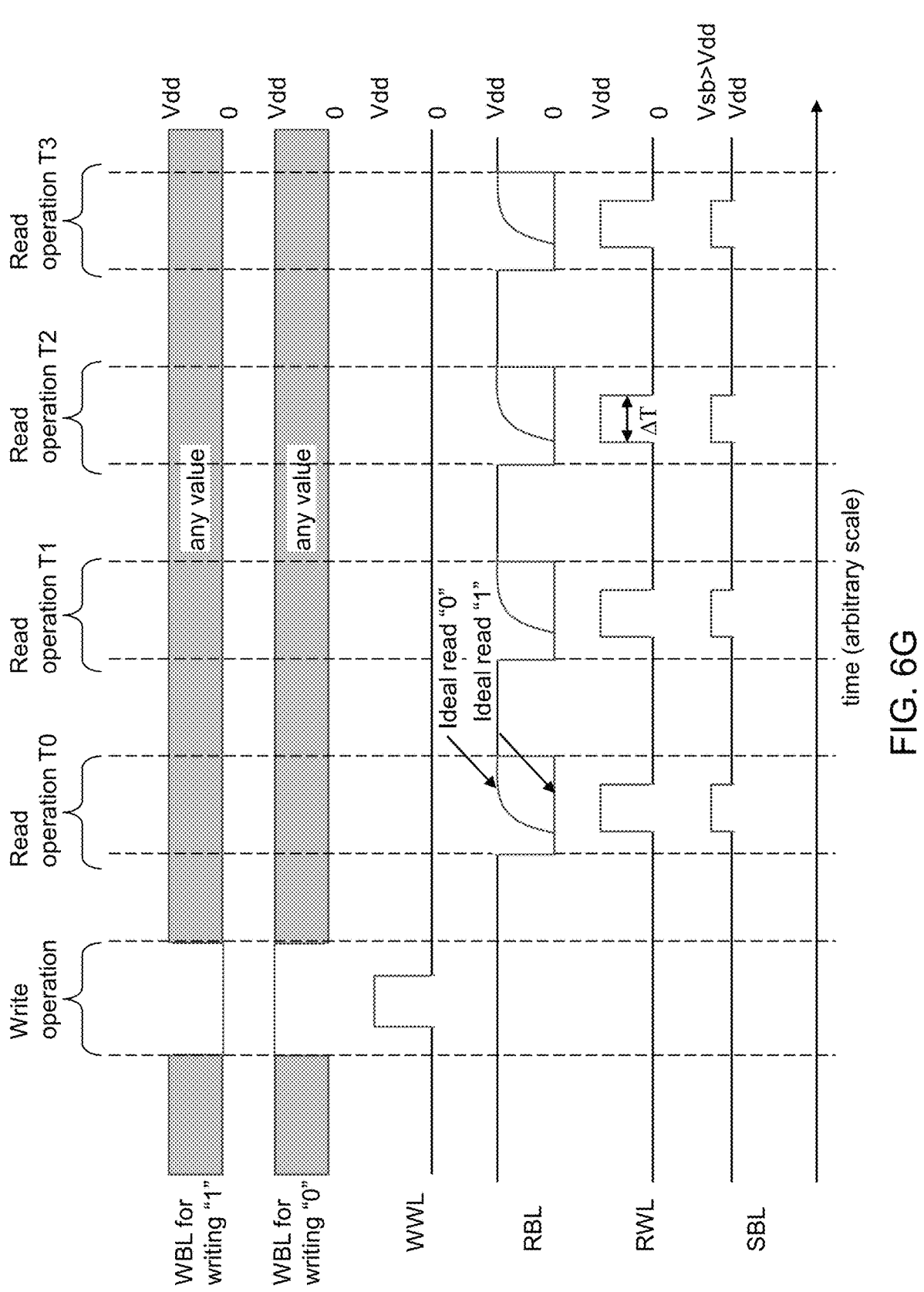
Figure 6H:
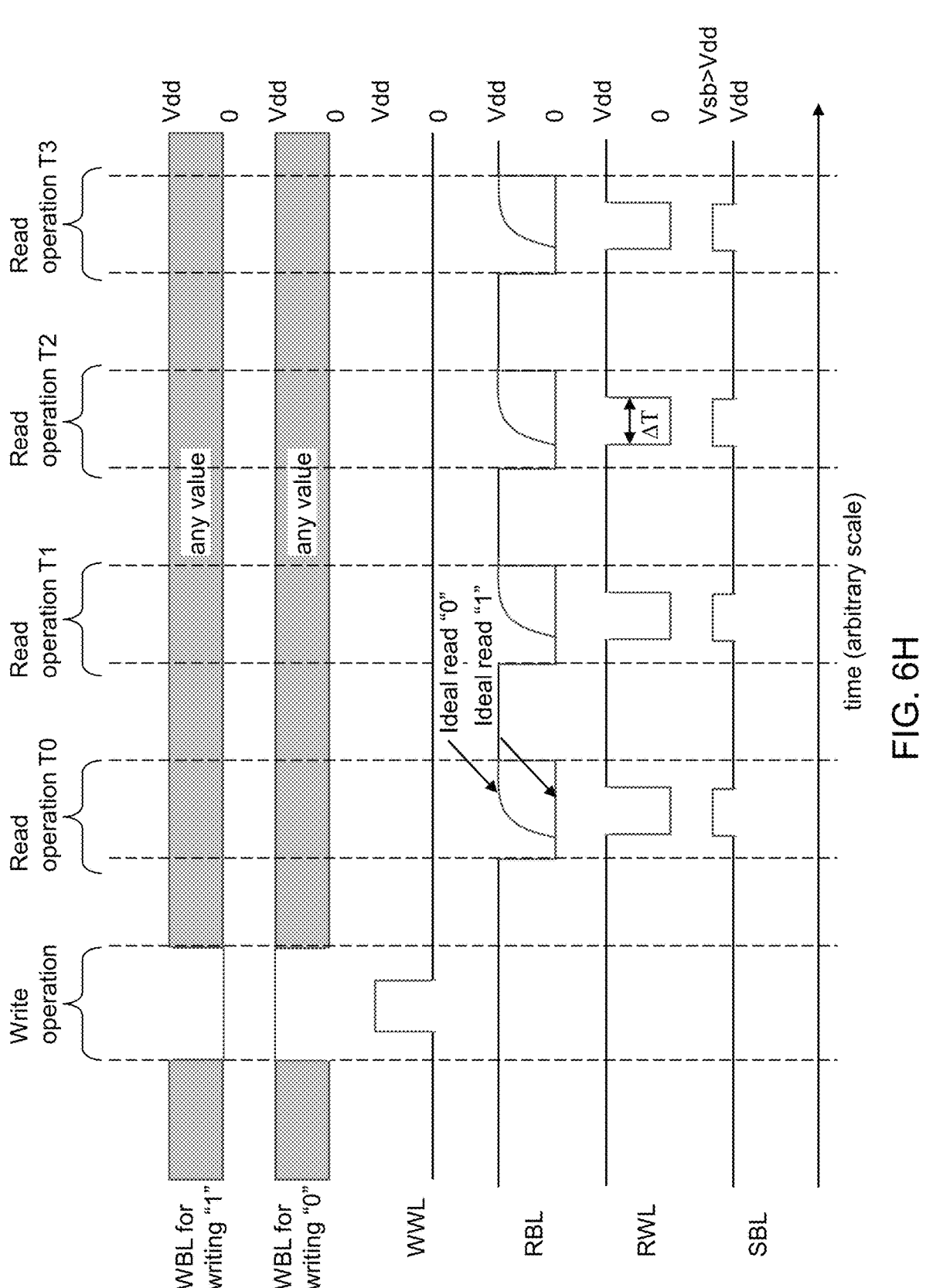

| Configuration Type | Corresponding circuit diagram | Corresponding waveform diagram | Write Word Line "on" voltage | Write Word Line "off" voltage | Write bit line "1" voltage | Write bit line "0" voltage |
|---|---|---|---|---|---|---|
| Type 1 | FIG. 5A | FIG. 6A | 0 V – 10% of Vdd | Vdd + 10% of Vdd | Vdd | 0 V |
| Type 2 | FIG. 5B | FIG. 6B | 0 V – 10% of Vdd | Vdd + 10% of Vdd | Vdd | 0 V |
| Type 3 | FIG. 5C | FIG. 6C | 0 V – 10% of Vdd | Vdd + 10% of Vdd | Vdd | 0 V |
| Type 4 | FIG. 5D | FIG. 6D | 0 V – 10% of Vdd | Vdd + 10% of Vdd | Vdd | 0 V |
| Type 5 | FIG. 5E | FIG. 6E | Vdd + 10% of Vdd | 0 V – 10% of Vdd | Vdd | 0 V |
| Type 6 | FIG. 5F | FIG. 6F | Vdd + 10% of Vdd | 0 V – 10% of Vdd | Vdd | 0 V |
| Type 7 | FIG. 5G | FIG. 6G | Vdd + 10% of Vdd | 0 V – 10% of Vdd | Vdd | 0 V |
| Type 8 | FIG. 5H | FIG. 6H | Vdd + 10% of Vdd | 0 V – 10% of Vdd | Vdd | 0 V |

A read operation may be performed by pre-charging the read bit line RBL at a pre-charge bias voltage, by applying a second source bias voltage (which is herein referred to as a current-boost source bias voltage Vsb) that is different from the first source bias voltage (i.e., the normal source bias voltage) to the source bias line SBL, and by turning on the first read transistor RT1. The voltage responses at the read bit line RBL under an ideal read "1" condition (i.e., an ideal condition in which a stored data bit of "1" is read) and under an ideal read "0" condition are illustrated in each of FIGS. 6A-6H.

For the purpose of sensing the data stored at the signal node SN, the magnitude of a difference between the pre-charge bias voltage and the second source bias voltage (such as a current-boost source bias voltage Vsb) is greater than a magnitude of a difference between the pre-charge bias voltage and the first source bias voltage (such as a normal source bias voltage). In one embodiment, a first one of the pre-charge bias voltage and the first source bias voltage (such as a normal source bias voltage) is a circuit power supply voltage Vdd, and a second one of the pre-charge bias voltage and the first source bias voltage (such as a normal source bias voltage) is an electrical ground voltage. In embodiments in which an n-type field effect transistor is used for the second read transistor RT2, the pre-charge bias voltage may be the circuit power supply voltage Vdd, and the first source bias voltage may be the electrical ground voltage. In embodiments in which a p-type field effect transistor is used for the second read transistor RT2, the pre-charge bias voltage may be the electrical ground voltage, and the first source bias voltage may be the circuit power supply voltage Vdd.

In one embodiment, the second source bias voltage (such as a current-boost source bias voltage Vsb) is applied to the first source bias line SBL by applying a current-boost source bias pulse; the first read transistor RT1 is turned on by applying a gate voltage pulse to a gate electrode 754 of the first read transistor RT1; and the current-boost source bias pulse has a same time duration as the gate voltage pulse. In one embodiment, the gain cell memory device MD comprises a sense amplifier that is electrically connected to the read bit line RBL and a data latch that is electrically coupled to an output of the sense amplifier; and the first read transistor RT1 is turned on by applying a gate voltage pulse to a gate electrode 754 of the first read transistor RT1. The output of the sense amplifier may be captured at a time point at which the gate voltage pulse is turned off using the data latch.

Table 4 below provides the relationship among the various configurations illustrated in FIGS. 5A-5H, the various configurations illustrated in FIGS. 6A-6H, and the various operational voltages for the read word line RWL, the read bit line RBL, and the source bias line SBL during a read operation.

TABLE 4 operational voltages for the read word line RWL, the read bit line RBL,
and the source bias line SBL during a read operation for various configurations
of the 3T1C gain cell memory device of various embodiments.

| Configuration Type | Read Word Line "on" voltage | Read Word Line "off" voltage | Normal source bias voltage | current-boost source bias voltage Vsb | Read bit line pre-charge voltage | Read bit line voltage change upon sensing "1" | Read bit line voltage change upon sensing "0" |
|---|---|---|---|---|---|---|---|
| Type 1 | Vdd | 0 V | 0 V | lower than 0 V | Vdd | Vdd → 0 V | Vdd → Vdd |
| Type 2 | 0 V | Vdd | 0 V | lower than 0 V | Vdd | Vdd → 0 V | Vdd → Vdd |

TABLE 4-continued operational voltages for the read word line RWL, the read bit line RBL,
and the source bias line SBL during a read operation for various configurations
of the 3T1C gain cell memory device of various embodiments.

| Configuration Type | Read Word Line "on" voltage | Read Word Line "off" voltage | Normal source bias voltage | current-boost source bias voltage Vsb | Read bit line pre-charge voltage | Read bit line voltage change upon sensing "1" | Read bit line voltage change upon sensing "0" |
|---|---|---|---|---|---|---|---|
| Type 3 | Vdd | 0 V | Vdd | higher than Vdd | 0 V | 0 V → 0 V | 0 V → Vdd |
| Type 4 | 0 V | Vdd | Vdd | higher than Vdd | 0 V | 0 V → 0 V | 0 V → Vdd |
| Type 5 | Vdd | 0 V | 0 V | lower than 0 V | Vdd | Vdd → 0 V | Vdd → Vdd |
| Type 6 | 0 V | Vdd | 0 V | lower than 0 V | Vdd | Vdd → 0 V | Vdd → Vdd |
| Type 7 | Vdd | 0 V | Vdd | higher than Vdd | 0 V | 0 V → 0 V | 0 V → Vdd |
| Type 8 | 0 V | Vdd | Vdd | higher than Vdd | 0 V | 0 V → 0 V | 0 V → Vdd |

FIGS. 6A-6L are waveform diagrams for operation of the various configurations of the three-transistor one-capacitor (3T1C) gain cell memory device MD according to various embodiments of the present disclosure.

For each gain cell memory device MD including a write transistor WT and a read transistor RT, a read bit line RBL may be connected to a drain region 738 of the read transistor RT, and a source bias line SBL may be connected to a source region 732 of the read transistor RT. Each gain cell memory device MD comprises a signal node SN at which the first electrode 32 of a capacitor 30 may be electrically connected to a first source/drain region 730 of the write transistor WT and to a gate electrode 754 of the read transistor RT.

A write operation may be performed to encode a data bit in the signal node SN by applying a write read-bit-line bias voltage to a second source/drain region 730 of the write transistor WT and by turning on the write transistor WT while the source bias line SBL may be electrically biased at a first source bias voltage, which is herein referred to as a normal source bias voltage.

Table 5 below provides the relationship among the various embodiment configurations illustrated in FIGS. 5I-5L, the various embodiment configurations illustrated in FIGS. 6I-6L, and the various operational voltages for the write word line WWL and the write bit line WBL during a write operation. Write bit line "1" voltage refers to a bias voltage at the write bit line WBL for writing "1" at the signal node, and write bit line "0" voltage refers to a bias voltage at the write bit line WBL for writing "0" at the signal node.

TABLE 5 operational voltages for the write word line WWL and the write bit line WBL for
various configurations of the gain cell memory device of various embodiments.

Figure 6I:
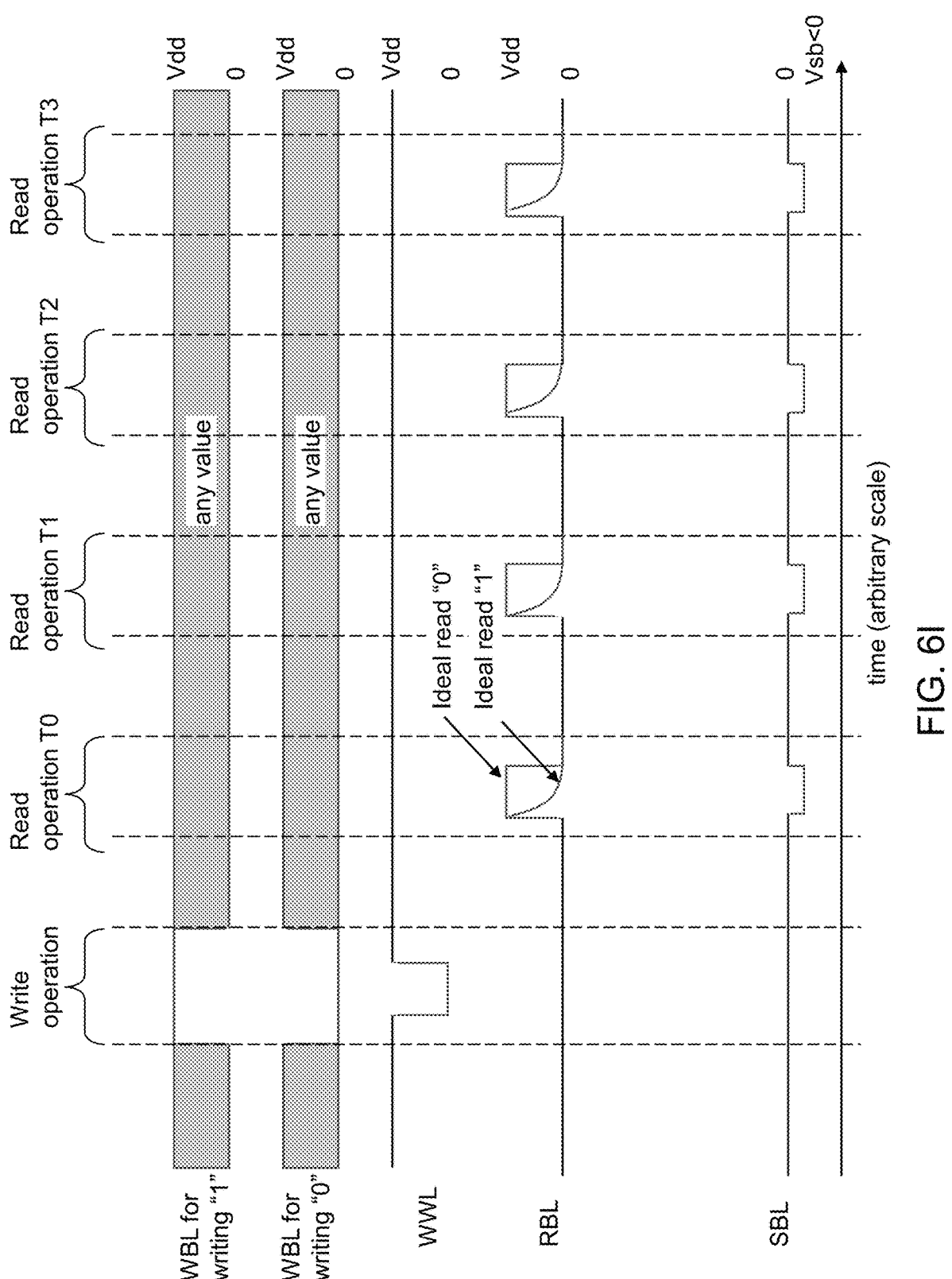
FIGS. 6I-6L are waveform diagrams for operation of the various configurations of the two-transistor one-capacitor (2T1C) gain cell memory device according to various embodiments of the present disclosure.
Figure 6J:
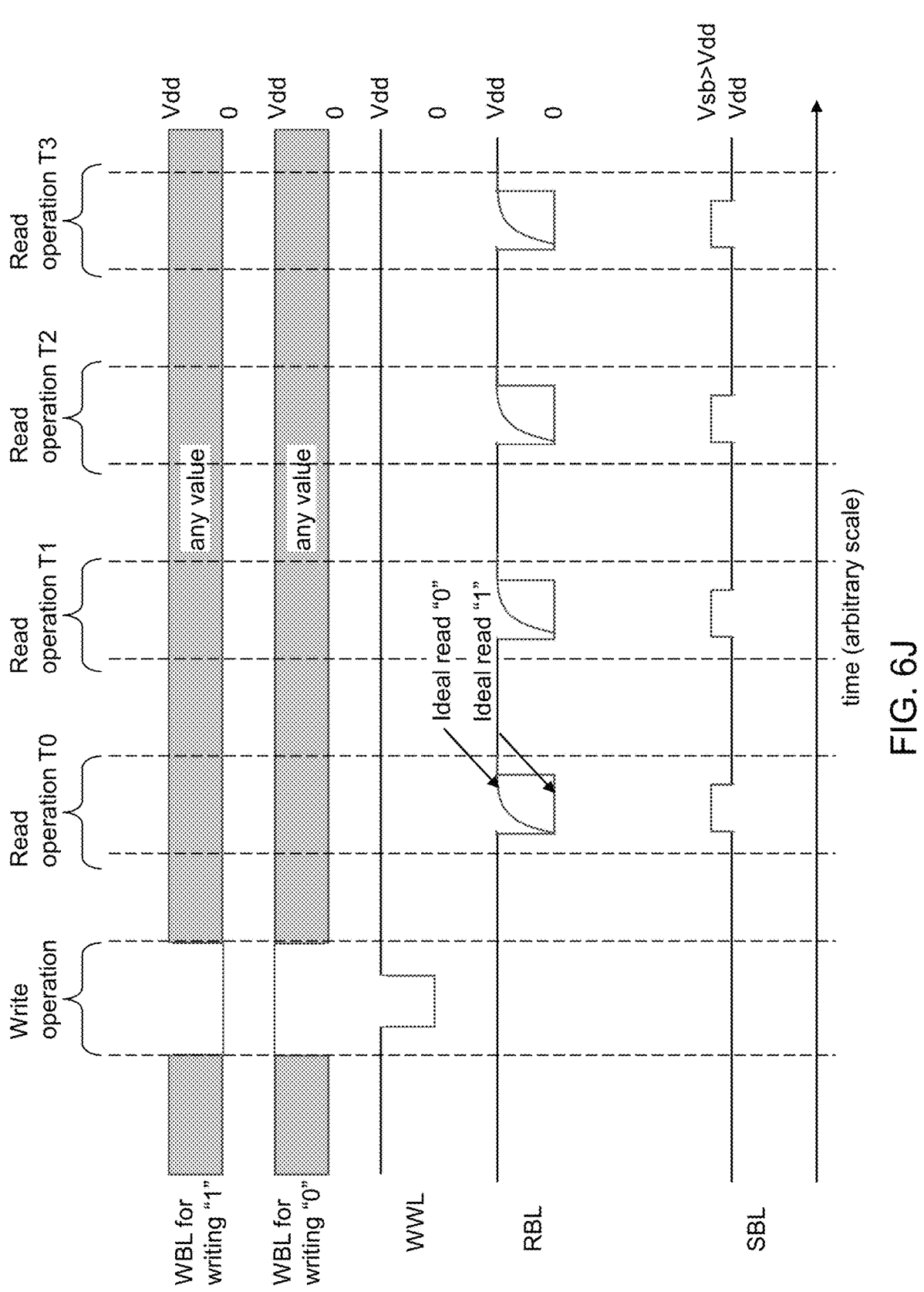
Figure 6K:
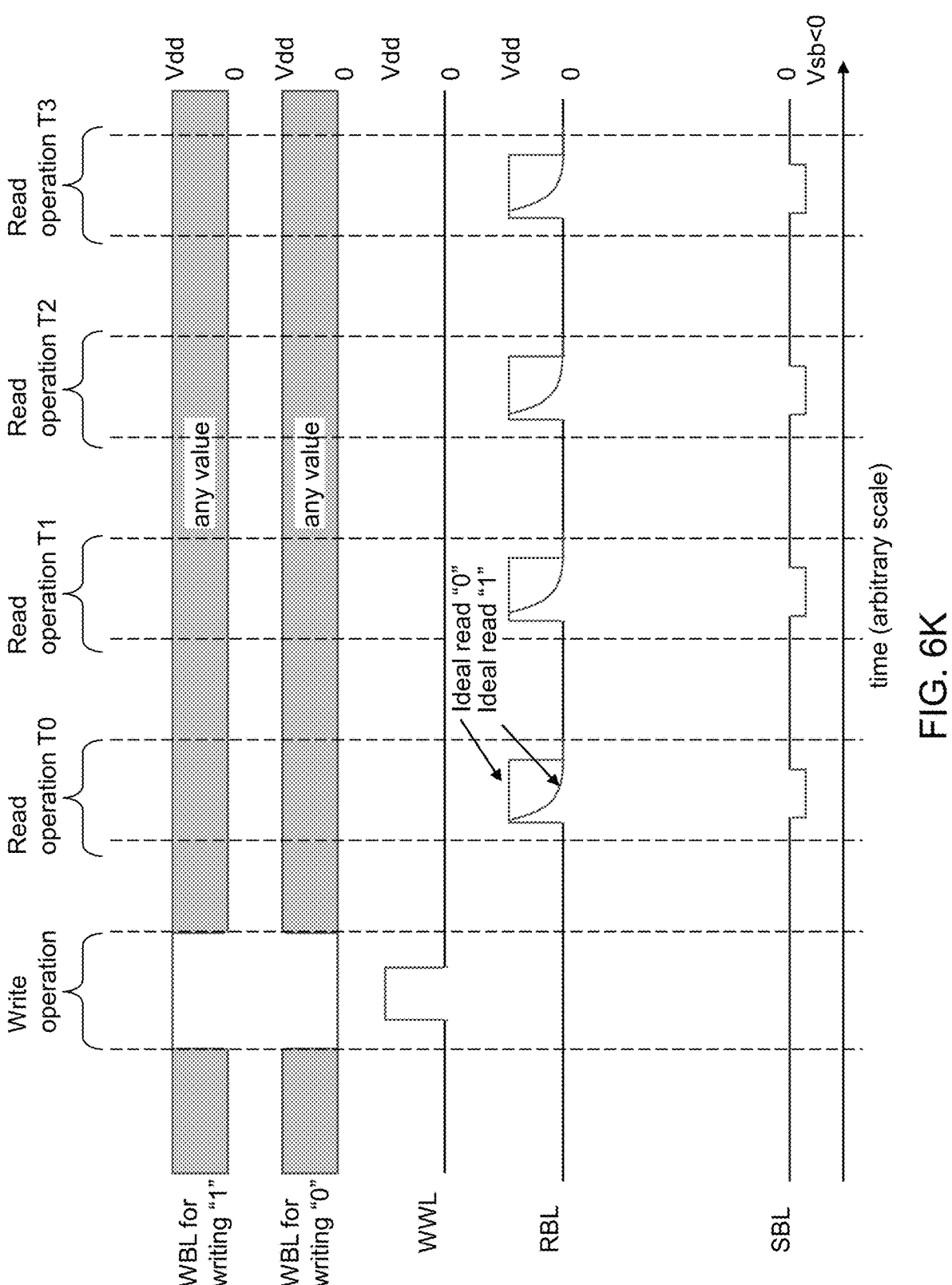
Figure 6L:
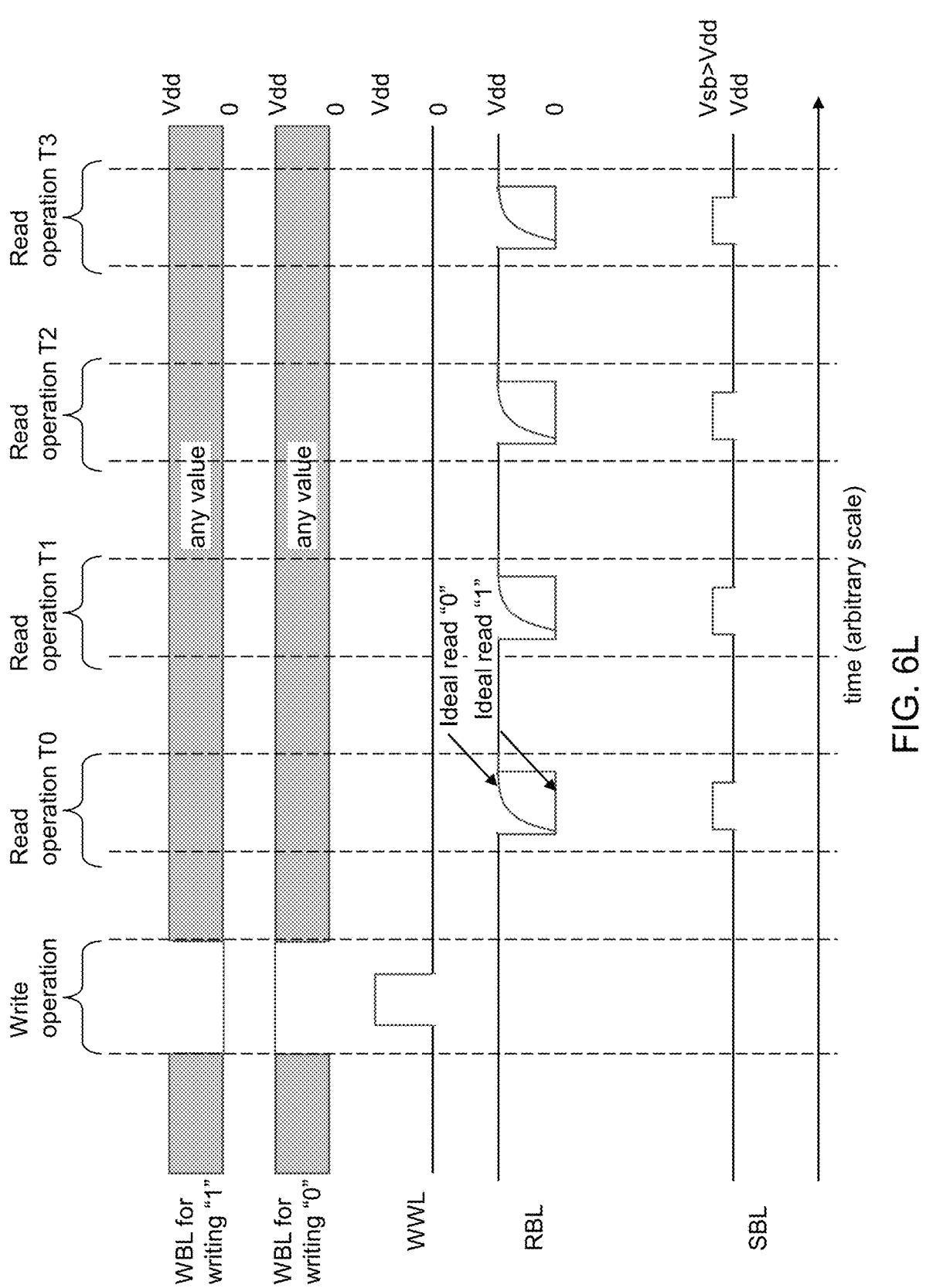

| Configuration Type | Corresponding circuit diagram | Corresponding waveform diagram | Write Word Line "on" voltage | Write Word Line "off" voltage | Write bit line "1" voltage | Write bit line "0" voltage |
|---|---|---|---|---|---|---|
| Type 1 | FIG. 5I | FIG. 6I | 0 V − 10% of Vdd | Vdd + 10% of Vdd | Vdd | 0 V |
| Type 2 | FIG. 5J | FIG. 6J | 0 V − 10% of Vdd | Vdd + 10% of Vdd | Vdd | 0 V |
| Type 3 | FIG. 5K | FIG. 6K | Vdd + 10% of Vdd | 0 V − 10% of Vdd | Vdd | 0 V |
| Type 4 | FIG. 5L | FIG. 6L | Vdd + 10% of Vdd | 0 V − 10% of Vdd | Vdd | 0 V |

A read operation may be performed by pre-charging the read bit line RBL at a pre-charge bias voltage, by applying a second source bias voltage (which is herein referred to as a current-boost source bias voltage Vsb) that is different from the first source bias voltage (i.e., the normal source bias voltage) to the source bias line SBL, and by discontinuing the pre-charge bias voltage and letting the read bit line RBL electrically float. The voltage responses at the read bit line RBL under an ideal read "1" condition (i.e., an ideal condition in which a stored data bit of "1" is read) and under an ideal read "0" condition are illustrated in each of FIGS. 6I-6L.

Moreover, in the two-transistor one-capacitor (2T1C) gain cell memory device configurations, the read operation can be alternatively triggered by toggling the SBL voltage. For instance, in the configuration corresponding to FIG. 5I, both the RBL and SBL may be pre-charged to Vdd. During the read operation, the SBL is switched from Vdd to 0V. This action causes the RBL to discharge to 0V for a read "1" state, or remain at Vdd for a read '0' state. By finely tuning the SBL level (0V±ΔV) during the read operation, the discharge time of the RBL can be optimized, thereby maximizing the voltage difference between the RBL states of "0" and "1" and improving the read operation efficiency and accuracy. The same type of modifications to the read operation can be made to each of the two-transistor one-capacitor (2T1C) gain cell memory device configurations shown in FIGS. 5J, 5K, and 5L.

For the purpose of sensing the data stored at the signal node SN, the magnitude of a difference between the pre-charge bias voltage and the second source bias voltage (such as a current-boost source bias voltage Vsb) is greater than a magnitude of a difference between the pre-charge bias voltage and the first source bias voltage (such as a normal source bias voltage). In one embodiment, a first one of the pre-charge bias voltage and the first source bias voltage (such as a normal source bias voltage) is a circuit power supply voltage Vdd, and a second one of the pre-charge bias voltage and the first source bias voltage (such as a normal source bias voltage) is an electrical ground voltage. In embodiments in which an n-type field effect transistor is used for the read transistor RT, the pre-charge bias voltage may be the circuit power supply voltage Vdd, and the first source bias voltage may be the electrical ground voltage. In embodiments in which a p-type field effect transistor is used for the read transistor RT, the pre-charge bias voltage may be the electrical ground voltage, and the first source bias voltage may be the circuit power supply voltage Vdd.

In one embodiment, the second source bias voltage (such as a current-boost source bias voltage Vsb) is applied to the first source bias line SBL by applying a current-boost source bias pulse; and the current-boost source bias pulse has a same time duration as the duration of a step during which the read bit line RBL is electrically floating. In one embodiment, the gain cell memory device MD comprises a sense amplifier that is electrically connected to the read bit line RBL and a data latch that is electrically coupled to an output of the sense amplifier. The output of the sense amplifier may be captured at a time point at which the read operation terminates using the data latch. The termination of the read operation coincides with a time at which the electrically floating state of the read bit line RBL terminates.

Table 6 below provides the relationship among the various configurations illustrated in FIGS. 5I-5L, the various configurations illustrated in FIGS. 6I-6L, and the various operational voltages for the read word line RWL, the read bit line RBL, and the source bias line SBL during a read operation.

TABLE 6 operational voltages for the read word line RWL, the read bit line RBL, and the source bias line SBL during a read operation for various configurations of the 2T1C gain cell memory device of various embodiments.

| Configuration Type | Normal source bias voltage | current-boost source bias voltage Vsb | Read bit line precharge voltage | Read bit line voltage change upon sensing "1" | Read bit line voltage change upon sensing "0" |
|---|---|---|---|---|---|
| Type 1 | 0 V | lower than 0 V | Vdd | Vdd → 0 V | Vdd → Vdd |
| Type 2 | Vdd | higher than Vdd | 0 V | 0 V → 0 V | 0 V → Vdd |
| Type 3 | 0 V | lower than 0 V | Vdd | Vdd → 0 V | Vdd → Vd |
| Type 4 | Vdd | higher than Vdd | 0 V | 0 V → 0 V | 0V → Vdd |

Referring collectively to FIGS. 1A-4B and 5A-5H, a gain cell memory device MD of various embodiments may comprise: a write transistor WT located on a substrate 9; a series connection of a first read transistor RT1 and a second read transistor RT2 located on the substrate 9; a capacitor 30 having a first electrode 32, a node dielectric 35, and a second electrode 38, wherein the first electrode 32 is electrically connected to a first source/drain region 730 of the write transistor WT and to a gate electrode 754 of the second read transistor RT2; and a peripheral circuit PC configured to electrically bias a source region 732 of the second read transistor RT2 at a normal source bias voltage while the first read transistor RT1 is turned off and at a current-boost source bias voltage Vsb that increases an on-current of the second read transistor RT2 while the first read transistor RT1 is turned on during a read operation.

The gain cell memory device MD may comprise a read bit line RBL that is electrically connected to a drain region 738 of the first read transistor RT1. The peripheral circuit PC is configured to apply a pre-charge bias voltage to the read bit line RBL prior to turning on the second read transistor RT2 during the read operation prior to turning on the first read transistor RT1. In one embodiment, a first one of the pre-charge bias voltage and the normal source bias voltage is a circuit power supply voltage Vdd; and a second one of the pre-charge bias voltage and the normal source bias voltage is an electrical ground voltage. In one embodiment, the current-boost source bias voltage Vsb equals a sum of (1+α) times the normal source bias voltage plus −α times the pre-charge bias voltage, wherein α has a value in a range from 0.01 to 0.30, such as from 0.03 to 0.15. The circuit power supply voltage Vdd may be in a range from 1.0 V to 20 V, such as from 2 V to 10 V, although lower and higher voltages may also be used.

In one embodiment, peripheral circuit PC is configured to apply a read gate pulse to a gate electrode 754 of the first read transistor RT1 for a first time duration Δt during the read operation.

Referring collectively to FIGS. 1A-6L and according to various embodiments of the present disclosure, a gain cell memory device is provided, which comprises: a write transistor WT located on a substrate 9; a read transistor (RT2 or RT) located on the substrate 9; a capacitor 30 having a first electrode 32, a node dielectric 35, and a second electrode 38, wherein the first electrode 32 is electrically connected to a first source/drain region 730 of the write transistor WT and to a gate electrode 754 of the read transistor (RT2 or RT); and a peripheral circuit PC configured to electrically bias a source region 732 of the read transistor (RT2 or RT) at a normal source bias voltage while the gain cell memory device is not under a read operation, and at a current-boost source bias voltage that increases an on-current of the second read transistor (RT2 or RT) while the gain cell memory device is under the read operation.

Figure 7:
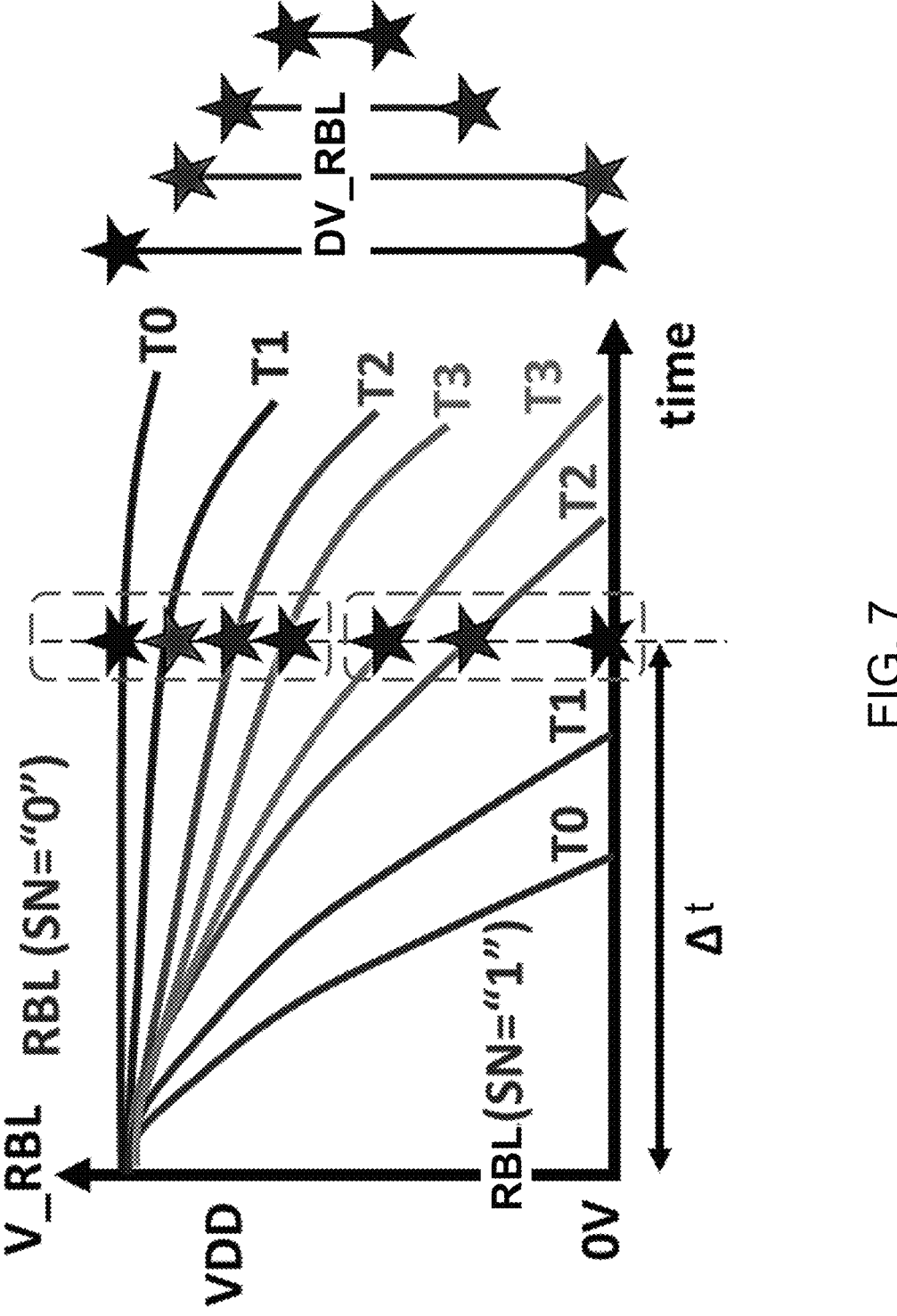
FIG. 7 is a waveform diagram for a bit line voltage as a function of the time of the measurement operation and as a function of a stored value of the data bit according to an embodiment of the present disclosure.

Referring to FIG. 7, a waveform diagram for a bit line voltage as a function of the time of the measurement operation and as a function of a stored value of the data bit according to an embodiment of the present disclosure. Four measurements may be made using a sequence of four read operations as illustrated in FIGS. 6A-6L. FIG. 7 represents time-dependent voltages during the read operation at the read bit line RBL for the configurations illustrated in FIGS. 6A, 6B, 6E, 6F, 6I, and 6K which are configurations in which the second read transistor RT2 is an NFET. The pre-charge voltage (which is the circuit power supply voltage Vdd) transitions to 0 V with different time constants depending on the electrical current that flows between the common source/drain region of the two read transistors (RT1, RT2) and the source region of the second read transistor RT2. The greater the amount of the electrical charge stored at the signal node SN, the higher the electrical current through the second read transistor RT2, and the faster the speed of decrease of the voltage at the read bit line RBL.

Generally, the amount charge that is stored in the signal node SN upon programming of "1" decreases over time such that sensing of the state of "1" becomes more difficult in time. Likewise, state of the absence of charge in the signal node SN upon programming of "O" may be degraded over time due to accumulation of spurious electrical charges, for example, by leakage current in the signal node. Such drift in the amount of charge stored in the signal node SN is reflected in the changes in the voltage response at the read bit line RBL as a function of time. The four different time points for initiating a read operation are labeled as T0, T1, T2, and T3. The initial time point T0 corresponds to the first time point for initiating a read operation, and may be temporally offset from termination of a programming operation by less than 10 clock cycles, such as 1-4 clock cycles, of the semiconductor circuit including the gain cell memory device. The first time point T1 is temporally offset from the initial time point T0 by about 25% of a half-life time, which is the time that is needed to induce decay of the stored amount of charge from a fully charged level to 50% of the fully charged level. The second time point T2 is temporally offset from the initial time point T0 by about 50% of the half-life time. The third time point T3 is temporally offset from the initial time point T0 by about 75% of the half-life time.

For the configurations illustrated in FIGS. 6C, 6D, 6G, 6H, 6J, and 6L, the pre-charge voltage is 0 V, and the waveform for the time-dependent voltage at the read bit line RBL may have an inverted configuration. Specifically, the pre-charge voltage of 0 V voltage transitions to the circuit power supply voltage Vdd if the stored data bit at the signal node SN is "0," and stays at 0 V with a gradual drift upward if the stored data bit at the signal node SN is "1."

Figure 8:
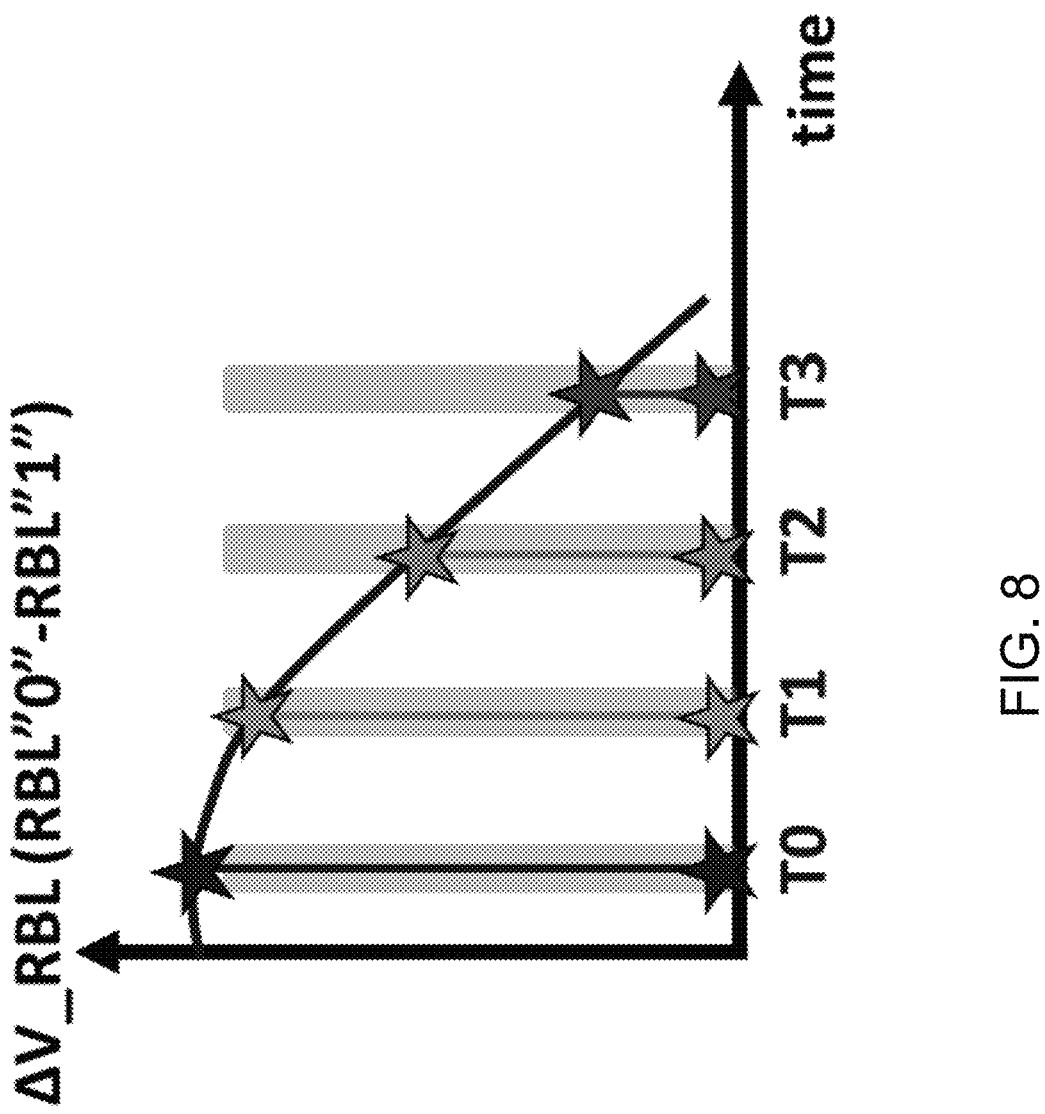
FIG. 8 is a graph illustrating the dependence of the read bit line voltage differential as a function of the time of the measurement operation.

The voltage at the read bit line RBL may be sensed after the time duration of the read operation, which is the first time duration $\Delta t$. Each voltage level at the read bit line RBL that is sensed by a sense amplifier after the first time duration $\Delta t$ for the four read operations for sensing the "1" state and for sensing the "0" state is represented by a star mark in FIG. 7. The voltage differential between the sensed voltage for the "0" state (i.e., SN=0) and the sensed voltage for the "1" state (i.e., SN="1") for a read operation is herein referred to as read bit line voltage differential DV_RBL. Four read bit line voltage differentials DV_RBL corresponding to the four different time points for initiating the read operation are shown in FIG. 7. The magnitude of the read bit line voltage differential DV_RBL decreases over time. The time dependency of the magnitude of the read bit line voltage differential DV_RBL is illustrated in FIG. 8. As the magnitude of the read bit line voltage differential DV_RBL decreases over time, differentiating the state of "1" and the state of "0" becomes more and more difficult in time.

Figure 9:
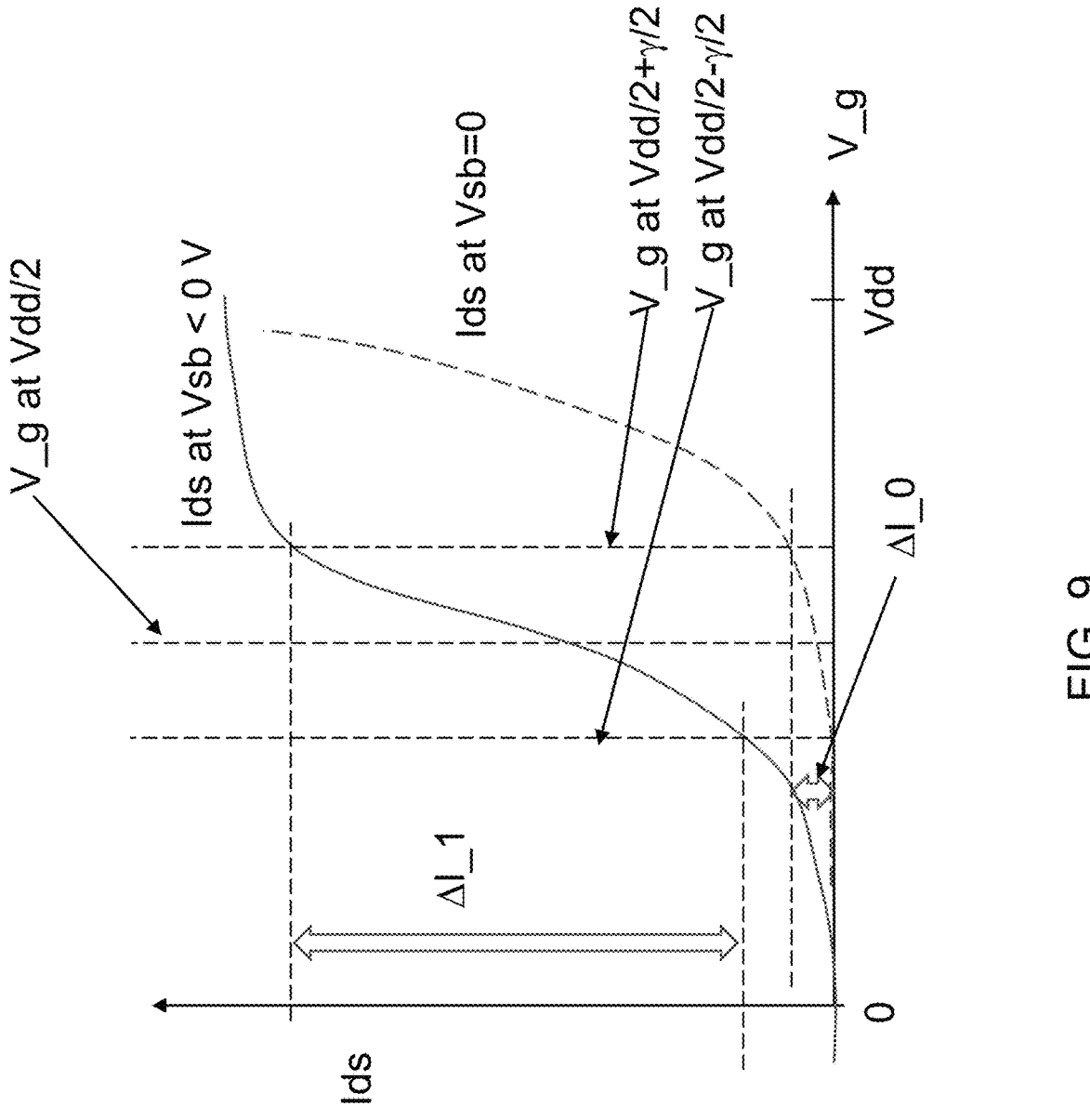
FIG. 9 is a graph illustrating the dependence of the drain-to-source current on the source bias voltage while the drain and the gate electrode are biased to turn on a second read transistor according to an embodiment of the present disclosure.

FIG. 9 is a graph illustrating the dependence of the drain-to-source current on the source bias voltage while the drain and the gate electrode 754 are biased to turn on a second read transistor RT2. FIG. 9 shows the transistor characteristics for the second read transistor RT2 when the second read transistor RT2 is an NFET. In embodiments in which a bias voltage of 0 V is applied to the source bias line SBL, the gate-source bias voltage that determines the electrical current between the drain region and the source region of the second read transistor RT2 is the same as the voltage V_g at the gate electrode of the second read transistor RT2, which is determined by the amount of electrical charge that is present at the signal node. The I-V curve under this condition is represented by a dotted curve labeled "Ids at Vsb=0."

According to an aspect of the present disclosure, application of the current-boost source bias voltage Vsb that is less than 0 V to the source bias line SBL has the effect of increasing the source-gate bias voltage from V_g to V_g+ |Vsb|. The I-V curve under this condition is represented by a solid curve labeled "Ids at Vsb<0." Thus, application of the application of the current-boost source bias voltage Vsb to the source bias line SBL has the effect of increasing the gate-source bias voltage by |Vsb|.

In one embodiment, the magnitude of the current-boost source bias voltage Vsb may be determined to maximize the difference in the drain-to-source current Ids at two threshold voltages. The first threshold voltage is the minimum voltage at the signal node SN for unambiguously sensing a "0" state, and the second threshold voltage is the maximum voltage at the signal node SN for unambiguously sensing a "1" state. The first threshold voltage may be expressed as $Vdd/2-\gamma/2$, and the second threshold voltage may be expressed as $Vdd/2+\gamma/2$. The difference between the first threshold voltage and the second threshold voltage is $\gamma$, which is herein referred to as a sense-margin gate voltage. The sense-margin gate voltage $\gamma$ may be in a range from 5% to 30%, such as from 10% to 20%, of the circuit power supply voltage Vdd.

In the illustrated example in FIG. 9, the difference in the drain-to-source current Ids at two threshold voltages under the condition of Vsb=0 V is represented by $\Delta I\_0$. The difference in the drain-to-source current Ids at two threshold voltages under the condition of Vsb<0 V is represented by $\Delta I\_1$. According to an aspect of the present disclosure, the value of the current-boost source bias voltage Vsb may be selected such that $\Delta I\_1$ (i.e., the difference in the drain-to-source current Ids at two threshold voltages under the condition of Vsb<0 V) is maximized.

Figure 10:
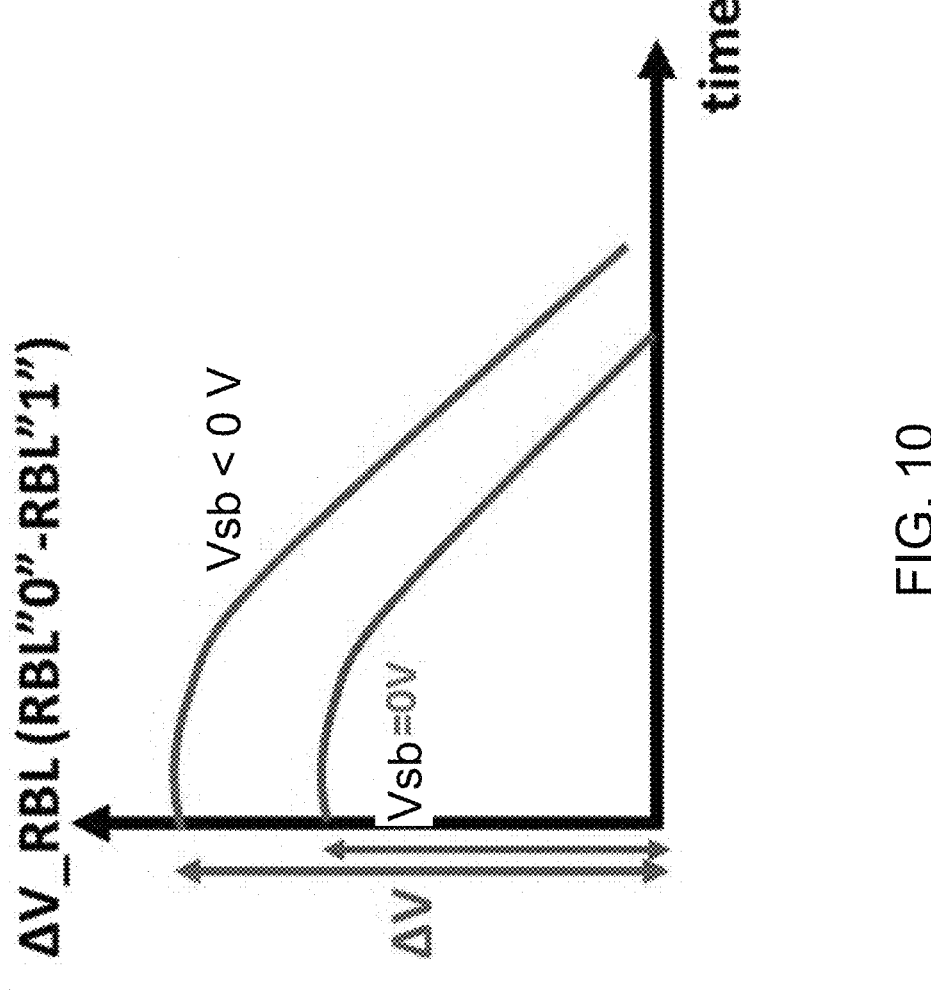
FIG. 10 is a graph comparing the read bit line voltage differential as a function of the time for two different source bias voltages.

Referring to FIG. 10, the effect of using the current-boost source bias voltage Vsb of various embodiments is illustrated. As discussed above, the current-boost source bias voltage Vsb may be applied during each read operation as a negative voltage for a second read transistor RT2 comprising an NFET, or as a voltage higher than the circuit power supply voltage Vdd for a second read transistor RT2 embodied as a PFET. By selecting the value of the current-boost source bias voltage Vsb using the methods described with reference to FIG. 9, the read bit line voltage differential DV_RBL discussed with reference to FIGS. 7 and 8 may be increased compared to read operations using 0 V or the circuit power supply voltage Vdd as a bias voltage for the source bias line SBL. Thus, the circuit of various embodiments provides a wider sensing window for the read operations.

Referring collectively to FIGS. 6A-6L and 9, the first time duration Dt and the current-boost source bias voltage Vsb may be selected such that a voltage at the read bit line RBL at a time point of termination of the first time duration Dt is between a target range. The target range is selected to be between a first voltage and a second voltage under a condition in which the gate electrode 754 of the second read transistor RT2 is at a mid-level voltage. The mid-level voltage equals the sum of 0.5 times the pre-charge bias voltage and 0.5 times the normal source bias voltage (such as Vdd/2). The first voltage equals a sum of 0.4 times the pre-charge bias voltage and 0.6 times the normal source bias voltage, and the second voltage equals a sum of 0.6 times the pre-charge bias voltage and 0.4 times the normal source bias voltage. In other words, when the gate voltage of the second read transistor is 0.5 times the circuit power supply voltage Vdd, the selected values for the first time duration D t and the current-boost source bias voltage Vsb causes the output voltage at the read bit line RBL to be in a range from 0.4 times the circuit power supply voltage Vdd to 0.6 times the circuit power supply voltage Vdd.

In one embodiment, the current-boost source bias voltage Vsb is applied in a current-boost source bias pulse having a same time duration as the read gate pulse. In one embodiment, the peripheral circuit PC comprises a sense amplifier that is electrically connected to the read bit line RBL; and the peripheral circuit PC comprises a data latch that is configured to store an output of the sense amplifier at a time point at which the read gate pulse is turned off.

Referring collectively to FIGS. 1A-5H, 6A-6H, and 7-10, a gain cell memory device MD is provided, which comprises: a write transistor WT located on a substrate 9; a series connection of a first read transistor RT1 and a second read transistor RT2 located on the substrate 9; a capacitor 30 having a first electrode 32, a node dielectric 35, and a second electrode 38 and formed within dielectric material layers (610, 610, 620, 630, 640, 650, 660) that overlie the write transistor WT and the series connection; metal interconnect structures formed within the dielectric material layers (610, 610, 620, 630, 640, 650, 660) and providing electrical connection to and from the first electrode 32, a first source/drain region 730 of the write transistor WT, and a gate electrode 754 of the second read transistor RT2; a read bit line RBL electrically connected to a drain region 738 of the first read transistor RT1; a source bias line SBL electrically connected to a source region 732 of the second read transistor RT2; and a peripheral circuit PC configured to electrically bias the source region 732 of the second read transistor RT2 at a normal source bias voltage while the first read transistor RT1 is turned off and at a current-boost source bias voltage Vsb that increases an on-current of the second read transistor RT2 while the first read transistor RT1 is turned on during a read operation.

In one embodiment, the peripheral circuit PC is configured to apply a pre-charge bias voltage to the read bit line RBL prior to turning on the second read transistor RT2 during the read operation prior to turning on the first read transistor RT1; a first one of the pre-charge bias voltage and the normal source bias voltage is a circuit power supply voltage Vdd; and a second one of the pre-charge bias voltage and the normal source bias voltage is an electrical ground voltage. In one embodiment, the current-boost source bias voltage Vsb equals a sum of $(1+\alpha)$ times the normal source bias voltage plus $-\alpha$ times the pre-charge bias voltage, wherein $\alpha$ has a value in a range from 0.01 to 0.30.

In one embodiment, the second read transistor RT2 comprises an n-type field effect transistor; the normal source bias voltage is 0 V; and the current-boost source bias voltage Vsb is a negative voltage. In one embodiment, the second read transistor RT2 comprises a p-type field effect transistor; the normal source bias voltage is a positive circuit power supply voltage Vdd; and the current-boost source bias voltage Vsb is a positive voltage that is higher than the positive circuit power supply voltage Vdd.

In one embodiment, the write transistor WT comprises a p-type field effect transistor; and a gate electrode 754 of the write transistor WT is electrically biased at a positive circuit power supply voltage Vdd except during a write operation during which the gate electrode 754 of the write transistor WT is electrically biased at 0 V. In one embodiment, the write transistor WT comprises an n-type field effect transistor; and a gate electrode 754 of the write transistor WT is electrically biased at 0 V except during a write operation during which the gate electrode 754 of the write transistor WT is electrically biased at a positive circuit power supply voltage Vdd.

In one embodiment, the substrate 9 comprises a semiconductor substrate; the write transistor WT, the second read transistor RT2, and the first read transistor RT1 comprises field effect transistors located on a top surface of the semiconductor substrate; the capacitor 30 comprises a metal-insulator-metal capacitor that is formed within dielectric material layers (610, 610, 620, 630, 640, 650, 660) overlying the field effect transistors; and the gain cell memory device MD comprises a set of metal interconnect structures providing electrical contact to and from the first electrode 32, the first source/drain region 730 of the write transistor WT, and the gate electrode 754 of the second read transistor RT2 and formed within the dielectric material layers (610, 610, 620, 630, 640, 650, 660).

Referring collectively to FIGS. 1A-6L and according to various embodiments of the present disclosure, a gain cell memory device is provided, which comprises: a write transistor WT located on a substrate 9; a read transistor (RT2 or RT) located on the substrate 9; a capacitor 30 having a first electrode 32, a node dielectric 35, and a second electrode 38, wherein the first electrode 32 is electrically connected to a first source/drain region 730 of the write transistor WT and to a gate electrode 754 of the read transistor (RT2 or RT); and a peripheral circuit PC configured to electrically bias a source region 732 of the read transistor (RT2 or RT) at a normal source bias voltage while the gain cell memory device is not under a read operation, and at a current-boost source bias voltage that increases an on-current of the second read transistor (RT2 or RT) while the gain cell memory device is under the read operation.

In one embodiment, the gain cell memory device comprises a read bit line RBL that is configured to electrically bias a drain region 738 of the read transistor (RT2 or RT) during an initial step of the read operation. In one embodiment, the peripheral circuit PC is configured to apply a pre-charge bias voltage to the read bit line RBL prior to turning on the additional read transistor RT1. In one embodiment, a first one of the pre-charge bias voltage and the normal source bias voltage is a circuit power supply voltage; and a second one of the pre-charge bias voltage and the normal source bias voltage is an electrical ground voltage. In one embodiment, the current-boost source bias voltage equals a sum of $(1+\alpha)$ times the normal source bias voltage plus $-\alpha$ times the pre-charge bias voltage, wherein $\alpha$ has a value in a range from 0.01 to 0.30.

In one embodiment, the gain cell memory device comprises an additional read transistor RT1 that is connected to the drain region 738 of the read transistor (RT2 or RT) in a series connection. A drain region 738 of the additional read transistor RT1 is electrically shorted to the read bit line RBL. In one embodiment, the peripheral circuit PC is configured to apply a read gate pulse to a gate electrode 754 of the additional read transistor RT1 for a first time duration during the read operation. In one embodiment, the first time duration and the current-boost source bias voltage are selected such that a voltage at the read bit line RBL at a time point of termination of the first time duration is between a first voltage and a second voltage under a condition in which the gate electrode 754 of the read transistor (RT2 or RT) is at a voltage that equals 0.5 times the pre-charge bias voltage and 0.5 times the normal source bias voltage; the first voltage equals a sum of 0.4 times the pre-charge bias voltage and 0.6 times the normal source bias voltage; and the second voltage equals a sum of 0.6 times the pre-charge bias voltage and 0.4 times the normal source bias voltage. In one embodiment, the current-boost source bias voltage is applied in a current-boost source bias pulse having a same time duration as the read gate pulse.

In one embodiment, the read bit line RBL is electrically shorted to the drain region 738 of the read transistor (RT2 or RT). In one embodiment, the peripheral circuit PC is configured: to maintain the read bit line RBL at a high impedance state while the gain cell memory device is not under a read operation; to apply a pre-charge bias voltage to the read bit line RBL during a pre-charge step of the read operation; and to measure a voltage at the read bit line RBL after a first time duration after the pre-charge step.

According to another aspect of the present disclosure, a gain cell memory device is provided, which comprises: a write transistor WT located on a substrate 9; a read transistor (RT2 or RT) located on the substrate 9; a capacitor 30 having a first electrode 32 which comprises a signal node that is electrically connected to a first source/drain region 730 of the write transistor WT and to a gate electrode 754 of the read transistor (RT2 or RT), a node dielectric 35, and a second electrode 38, wherein the capacitor 30 is embedded within dielectric material layers that overlie the write transistor WT and the read transistor (RT2 or RT); metal interconnect structures (612, 618, 622, 628, 22, 28, 632, 638, 642, 648, 658, 662, 668) located within the dielectric material layers (601, 610, 620, 630, 640, 650, 660) and providing electrical connection to the first electrode 32, a second source/drain region 730 of the write transistor WT, and a source region 732 of the read transistor (RT2 or RT); a read bit line RBL configured to electrically bias a drain region 738 of the read transistor (RT2 or RT); a source bias line SBL electrically connected to the source region 732 of the read transistor (RT2 or RT); and a peripheral circuit PC configured to electrically bias a source region 732 of the read transistor (RT2 or RT) at a normal source bias voltage while the gain cell memory device is not under a read operation, and at a current-boost source bias voltage that increases an on-current of the second read transistor (RT2 or RT) while the gain cell memory device is under the read operation.

In one embodiment, the peripheral circuit PC is configured to apply a pre-charge bias voltage to the read bit line RBL during an initial step of the read operation; a first one of the pre-charge bias voltage and the normal source bias voltage is a circuit power supply voltage; and a second one of the pre-charge bias voltage and the normal source bias voltage is an electrical ground voltage. In one embodiment, the current-boost source bias voltage equals a sum of $(1+\alpha)$ times the normal source bias voltage plus $-\alpha$ times the pre-charge bias voltage, wherein $\alpha$ has a value in a range from 0.01 to 0.30. In one embodiment, the peripheral circuit PC comprises a sense amplifier that is electrically connected to the read bit line RBL; and the peripheral circuit PC comprises a data latch that is configured to store an output of the sense amplifier at a time point at which the read operation terminates.

FIG. 11 is a flowchart that illustrates a sequence of processing steps for operating the gain cell memory device MD of various embodiments.

Referring to step 1110 and FIGS. 1A-5L, a gain cell memory device MD is provided. The gain cell memory device MD comprises a write transistor WT located on a substrate 9, a read transistor (RT or RT2) located on the substrate 9, a capacitor 30 having a first electrode 32 which comprises a signal node that is electrically connected to a first source/drain region 730 of the write transistor ET and to a gate electrode 754 of the read transistor (RT or RT2), a node dielectric 35, and a second electrode 38, a read bit line RBL that is configured to electrically bias a drain region 738 of the read transistor (RT or RT2), either by being electrically shorted to the drain region 738 or through an additional read transistor RT1, and a source bias line SBL that is connected to a source region 732 of the second read transistor RT2.

Referring to step 1120 and FIGS. 6A-6L, a write operation may be performed, which encodes a data bit in the signal node SN by applying a write read-bit-line bias voltage to a second source/drain region 730 of the write transistor WT and by turning on the write transistor WT while the source bias line SBL is electrically biased at a first source bias voltage (such as a normal source bias voltage).

Referring to step 1130 and FIGS. 6A-6L, 7, 8, 9, and 10, a read operation may be performed by pre-charging the read bit line RBL at a pre-charge bias voltage, by applying a second source bias voltage (such as a current-boost source bias voltage Vsb) that is different from the first source bias voltage (such as a normal source bias voltage) to the source bias line SBL, and by sensing a voltage at a drain region 738 of the read transistor (RT or RT2).

FIG. 12 is a flowchart that illustrates a sequence of processing steps for operating the gain cell memory device MD of various embodiments.

Referring to step 1210 and FIGS. 1A-5H, a gain cell memory device MD is provided. The gain cell memory device MD comprises a write transistor WT located on a substrate 9, a series connection of a first read transistor RT1 and a second read transistor RT2 located on the substrate 9, a capacitor 30 having a first electrode 32, a node dielectric 35, and a second electrode 38, a read bit line RBL that is connected to a drain region 738 of the first read transistor RT1, and a source bias line SBL that is connected to a source region 732 of the second read transistor RT2, wherein the gain cell memory device MD comprises a signal node SN at which the first electrode 32 is electrically connected to a first source/drain region 730 of the write transistor WT and to a gate electrode 754 of the second read transistor RT2.

Referring to step 1220 and FIGS. 6A-6H, a write operation may be performed, which encodes a data bit in the signal node SN by applying a write read-bit-line bias voltage to a second source/drain region 730 of the write transistor WT and by turning on the write transistor WT while the source bias line SBL is electrically biased at a first source bias voltage (such as a normal source bias voltage).

Referring to step 1230 and FIGS. 6A-6H, 7, 8, 9, and 10, a read operation may be performed by pre-charging the read bit line RBL at a pre-charge bias voltage, by applying a second source bias voltage (such as a current-boost source bias voltage Vsb) that is different from the first source bias voltage (such as a normal source bias voltage) to the source bias line SBL, and by turning on the first read transistor RT1.

The various embodiments of the present disclosure may provide a gain cell memory device providing a wider sense margin, i.e., a wider range of valid voltages that may be present in a signal node SN, and a method of operating such as gain cell memory device. The wider sense margin extends the time duration for a gain cell memory device to store a data bit, and thus, reduces the frequency at which the data bit of the gain cell memory device needs to be refreshed. By elongating the time duration for which the gain cell memory device hold valid data, the gain cell memory device may reduce the data refresh frequency, and thus, may reduce the power consumption for the gain cell memory device.

The foregoing outlines features of several embodiments so that those skilled in the art may better understand the aspects of the present disclosure. Each embodiment described using the term "comprises" also inherently discloses that the term "comprises" may be replaced with "consists essentially of" or with the term "consists of" in some embodiments, unless expressly disclosed otherwise herein. Whenever two or more elements are listed as alternatives in a same paragraph of in different paragraphs, a Markush group including a listing of the two or more elements may be also impliedly disclosed in some embodiments. Whenever the auxiliary verb "can" is used in this disclosure to describe formation of an element or performance of a processing step, an embodiment in which such an element or such a processing step is not performed is also expressly contemplated, provided that the resulting apparatus or device may provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gain cell memory device comprising:
a write transistor located on a substrate;
a read transistor located on the substrate;
a capacitor having a first electrode, a node dielectric, and a second electrode, wherein the first electrode comprises a signal node which is electrically connected to a first source/drain region of the write transistor and to a gate electrode of the read transistor, wherein the write transistor and the read transistor are front-end-of-line field-effect transistors formed directly on semiconductor material portions of the substrate, and the capacitor is a metal-insulator-metal capacitor embedded within dielectric material layers that overlie the write transistor and the read transistor and vertically spaced from the write transistor and the read transistor;
a read bit line configured to electrically bias a drain region of the read transistor;
a source bias line that is connected to a source region of the read transistor; and
a peripheral circuit configured to electrically bias the source bias line at a normal source bias voltage while the gain cell memory device is not under a read operation, and at a current-boost source bias pulse while the gain cell memory device is under the read operation, wherein:
the current-boost source bias pulse has a pulse voltage that equals a sum of $(1+\alpha)$ times the normal source bias voltage plus $-\alpha$ times a pre-charge bias voltage applied to a read bit line, wherein a has $\alpha$ value in a range from 0.01 to 0.30;
a rising edge of the current-boost source bias pulse is synchronous with a rising edge of a read word line pulse applied to a gate of the read transistor or an additional read transistor connected in series with the read transistor; and
a falling edge of the current-boost source bias pulse is synchronous with a falling edge of the read word line pulse.

2. The gain cell memory device of claim 1, further the read bit line is configured to electrically bias a drain region of the read transistor during an initial step of the read operation.

3. The gain cell memory device of claim 2, further comprising an additional read transistor that is connected to the drain region of the read transistor in a series connection, wherein a drain region of the additional read transistor is electrically shorted to the read bit line.

4. The gain cell memory device of claim 3, wherein the peripheral circuit is configured to apply a read gate pulse to a gate electrode of the additional read transistor for a first time duration during the read operation.

5. The gain cell memory device of claim 4, wherein:
the first time duration and the pulsed current-boost source bias voltage are selected such that a voltage at the read bit line at a time point of termination of the first time duration is between a first voltage and a second voltage under a condition in which the gate electrode of the read transistor is at a voltage that equals a sum of 0.5 times the pre-charge bias voltage and 0.5 times the normal source bias voltage;
the first voltage equals a sum of 0.4 times the pre-charge bias voltage and 0.6 times the normal source bias voltage; and
the second voltage equals a sum of 0.6 times the pre-charge bias voltage and 0.4 times the normal source bias voltage.

6. The gain cell memory device of claim 2, wherein the read bit line is electrically shorted to the drain region of the read transistor.

7. The gain cell memory device of claim 6, wherein the peripheral circuit is configured to:

maintain the read bit line at a high impedance state while the gain cell memory device is not under a read operation;

apply a pre-charge bias voltage to the read bit line during a pre-charge step of the read operation; and measure a voltage at the read bit line after a first time duration after the pre-charge step.

8. The gain cell memory device of claim 1, wherein:

the pulsed current-boost source bias voltage is applied as a pulse having a duration equal to a duration of a read gate pulse applied to an additional read transistor connected in series with the read transistor; and the pulse is generated by the peripheral circuit in response to a read command.

9. The gain cell memory device of claim 1, wherein:

the gain cell memory device is a three-transistor one-capacitor (3T1C) gain cell memory device comprising a write transistor, a first read transistor, and a second read transistor;

the capacitor is located within dielectric material layers that overlie the write transistor, the first read transistor, and the second read transistor;

the pulsed current-boost source bias voltage is applied as a pulse having a same time duration as a read gate pulse applied to the first read transistor; and the pulsed current-boost source bias voltage increases an on-current of the second read transistor during a read operation relative to an operation in which a normal source-bias voltage is applied to the source bias line.

10. The gain cell memory device of claim 1, wherein α has a value in a range from 0.03 to 0.15 in the relation for the current-boost source-bias pulse voltage.

11. The gain cell memory device of claim 1, wherein applying the current-boost source-bias voltage increases a read bit-line voltage differential relative to a read operation using the normal source-bias voltage.

12. A gain cell memory device comprising:

a write transistor located on a substrate;

a read transistor located on the substrate;

a capacitor having a first electrode which comprises a signal node that is electrically connected to a first source/drain region of the write transistor and to a gate electrode of the read transistor, a node dielectric, and a second electrode, wherein the write transistor and the read transistor are front-end-of-line field-effect transistors formed directly on semiconductor material portions of the substrate, and the capacitor is a metal-insulator-metal capacitor embedded within dielectric material layers that overlie the write transistor and the read transistor and vertically spaced from the write transistor and the read transistor;

metal interconnect structures located within the dielectric material layers and providing electrical connection to the first electrode, a second source/drain region of the write transistor, and a source region of the read transistor;

a read bit line configured to electrically bias a drain region of the read transistor;

a source bias line electrically connected to the source region of the read transistor; and a peripheral circuit configured to electrically bias the source bias line at a normal source bias voltage while the gain cell memory device is not under a read operation, and at a current-boost source bias pulse that increases an on-current of the read transistor while the gain cell memory device is under the read operation, wherein:

the current-boost source bias pulse has a pulse voltage that equals a sum of (1+α) times the normal source bias voltage plus −α times a pre-charge bias voltage applied to a read bit line, wherein a has α value in a range from 0.01 to 0.30;

a rising edge of the current-boost source bias pulse is synchronous with a rising edge of a read word line pulse applied to a gate of the read transistor or an additional read transistor connected in series with the read transistor; and a falling edge of the current-boost source bias pulse is synchronous with a falling edge of the read word line pulse.

13. The gain cell memory device of claim 12, wherein:

the peripheral circuit comprises a sense amplifier that is electrically connected to the read bit line; and the peripheral circuit comprises a data latch that is configured to store an output of the sense amplifier at a time point at which the read operation terminates.

14. A method of operating a device, the method comprising:

providing a gain cell memory device which comprises a write transistor located on a substrate, a read transistor located on the substrate, a capacitor having a first electrode which comprises a signal node that is electrically connected to a first source/drain region of the write transistor and to a gate electrode of the read transistor, a node dielectric, and a second electrode, a read bit line that is configured to electrically bias a drain region of the read transistor, and a source bias line that is connected to a source region of the read transistor, wherein the write transistor and the read transistor are front-end-of-line field-effect transistors formed directly on semiconductor material portions of the substrate, and the capacitor is a metal-insulator-metal capacitor embedded within dielectric material layers that overlie the write transistor and the read transistor and vertically spaced from the write transistor and the read transistor;

performing a write operation that encodes a data bit in the signal node by applying a write read-bit-line bias voltage to a second source/drain region of the write transistor and by turning on the write transistor while the source bias line is electrically biased at a first source bias voltage; and performing a read operation by pre-charging the read bit line at a pre-charge bias voltage, by applying to the source bias line a current-boost source bias pulse, and by sensing a voltage at a drain region of the read transistor, wherein:

the current-boost source bias pulse has a pulse voltage that equals a sum of (1+α) times the normal source bias voltage plus −α times a pre-charge bias voltage applied to a read bit line, wherein α has a value in a range from 0.01 to 0.30;

a rising edge of the current-boost source bias pulse is synchronous with a rising edge of a read word line pulse applied to a gate of the read transistor or an additional read transistor connected in series with the read transistor; and a falling edge of the current-boost source bias pulse is synchronous with a falling edge of the read word line pulse.

15. The method of claim 14, wherein a magnitude of a difference between the pre-charge bias voltage and the second source bias voltage is greater than a magnitude of a difference between the pre-charge bias voltage and the first source bias voltage.

16. The method of claim 14, wherein:

a first one of the pre-charge bias voltage and the first source bias voltage is a circuit power supply voltage; and a second one of the pre-charge bias voltage and the first source bias voltage is an electrical ground voltage.

17. The method of claim 14, wherein:

the gain cell memory device comprises an additional read transistor configured to switch an electrical connection between the read bit line and the drain region of the read transistor;

the second source bias voltage is applied to the first source bias line by applying a current-boost source bias pulse;

the additional read transistor is turned on by applying a gate voltage pulse to a gate electrode of the additional read transistor; and the current-boost source bias pulse has a same time duration as the gate voltage pulse.

18. The method of claim 14, wherein:

the gain cell memory device comprises a sense amplifier that is electrically connected to the read bit line and a data latch that is electrically coupled to an output of the sense amplifier; and the method further comprises capturing the output of the sense amplifier at a time point at which the read operation terminates using the data latch.

19. The method of claim 14, wherein $\alpha$ has a value in a range from 0.03 to 0.15.

20. The method of claim 14, wherein applying the current-boost source-bias voltage increases a read bit-line voltage differential relative to a read operation using the normal source-bias voltage.

* * * * *